(12) United States Patent
Fuse et al.

(10) Patent No.: US 6,177,811 B1
(45) Date of Patent: Jan. 23, 2001

(54) SEMICONDUCTOR INTEGRATED CIRCUIT DEVICE

(75) Inventors: Tsuneaki Fuse, Tokyo; Yukihito Oowaki; Yoko Shuto, both of Yokohama, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/348,623

(22) Filed: Jul. 6, 1999

Related U.S. Application Data

(63) Continuation of application No. 08/658,610, filed on Jun. 5, 1996, now abandoned.

(30) Foreign Application Priority Data

| Jun. 6, 1995 | (JP) | 7-139186 |
| Sep. 8, 1995 | (JP) | 7-231622 |
| Dec. 6, 1995 | (JP) | 7-317809 |

(51) Int. Cl.[7] .............................................. H03K 19/0944
(52) U.S. Cl. .............................. 326/119; 326/17; 326/83; 326/121; 327/534
(58) Field of Search .................... 326/27, 83, 86, 326/17, 31, 34, 119, 121, 68, 81; 327/534

(56) References Cited

U.S. PATENT DOCUMENTS

| 4,847,522 | * | 7/1989 | Fuller et al. | 326/86 |
| 5,157,279 | * | 10/1992 | Lee | 326/86 |
| 5,406,140 | * | 4/1995 | Wert et al. | 326/81 |
| 5,414,314 | * | 5/1995 | Thurber, Jr. | 326/68 |
| 5,689,144 | * | 11/1997 | Williams | 327/534 |
| 5,748,016 | * | 5/1998 | Kurosawa | 326/34 |

FOREIGN PATENT DOCUMENTS 6-85262   3/1994 (JP).

OTHER PUBLICATIONS

IEEE Internal Electron Device Meeting, pp. 809–812, 1994, Fariborz Assderaghi, et al., "A Dynamic Thereshold Voltage MOSFET (DTMOS) For Ultra–Low Voltage Operation".

* cited by examiner

*Primary Examiner*—Jon Santamauro
(74) *Attorney, Agent, or Firm*—Oblon, Spivak, McClelland, Maier & Neustadt, P.C.

(57) ABSTRACT

A semiconductor integrated circuit device includes a semiconductor substrate, a MOS transistor formed on the semiconductor substrate and having a first gate, wherein a first signal supplied to the first gate and a second signal supplied to a substrate region corresponding to the semiconductor substrate are combined with each other so that one logical signal is transmitted.

5 Claims, 48 Drawing Sheets

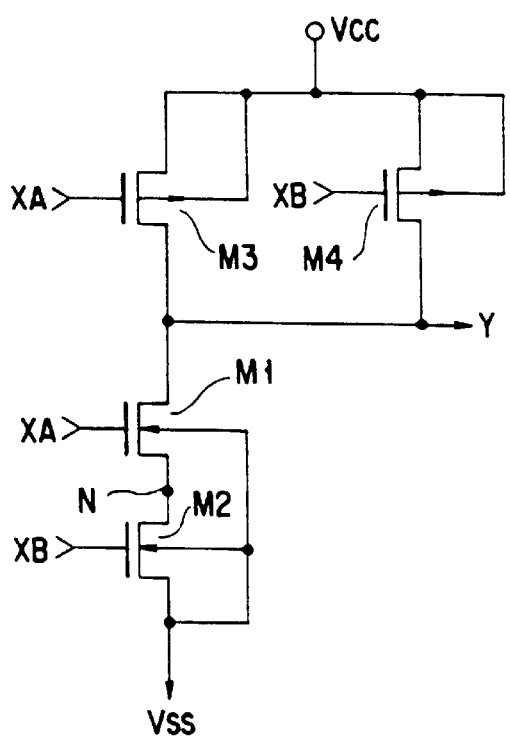
F I G. 1A
(PRIOR ART)
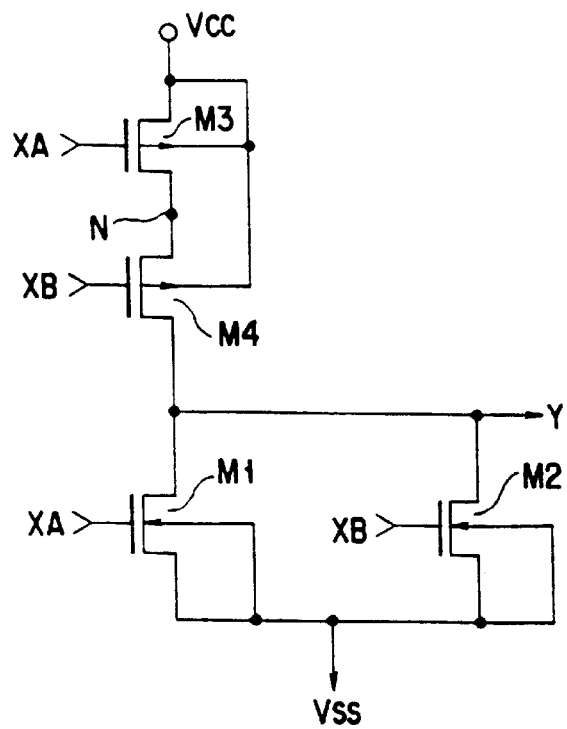
F I G. 2A
(PRIOR ART)
| XA | XB | Y |
|----|----|---|
| 0 | 0 | 1 |
| 0 | 1 | 1 |
| 1 | 0 | 1 |
| 1 | 1 | 0 |
F I G. 1B
(PRIOR ART)
| XA | XB | Y |
|----|----|---|
| 0 | 0 | 1 |
| 0 | 1 | 0 |
| 1 | 0 | 0 |
| 1 | 1 | 0 |
F I G. 2B
(PRIOR ART)

| XA | XB | Y |
|----|----|---|
| 0 | 0 | 0 |
| 0 | 1 | 1 |
| 1 | 0 | 1 |
| 1 | 1 | 0 |

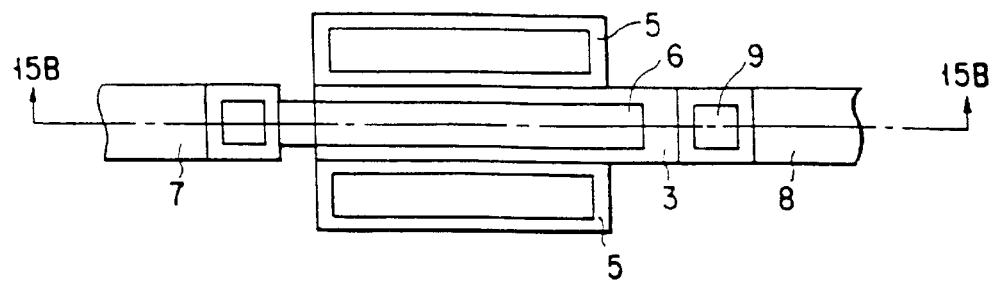
F I G. 15A
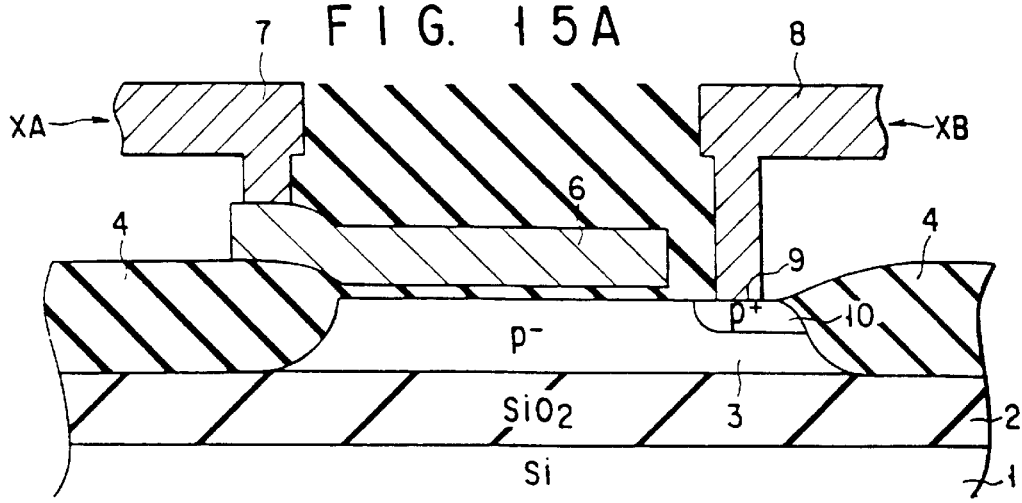
F I G. 15B
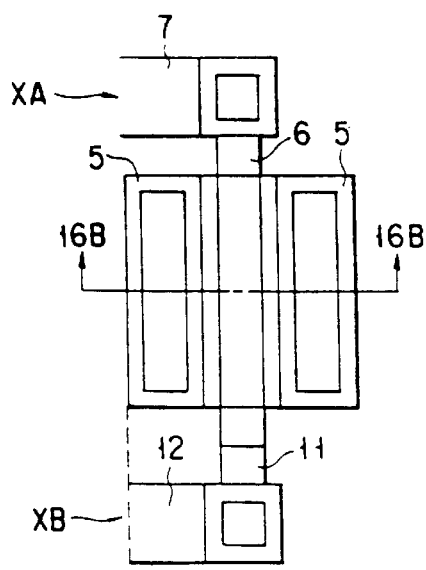
F I G. 16A
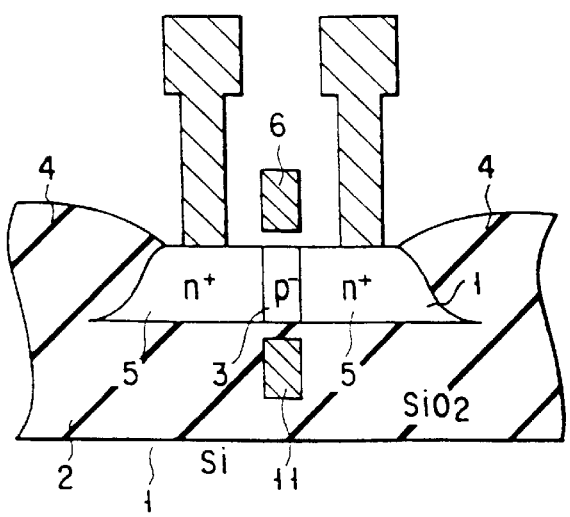
F I G. 16B

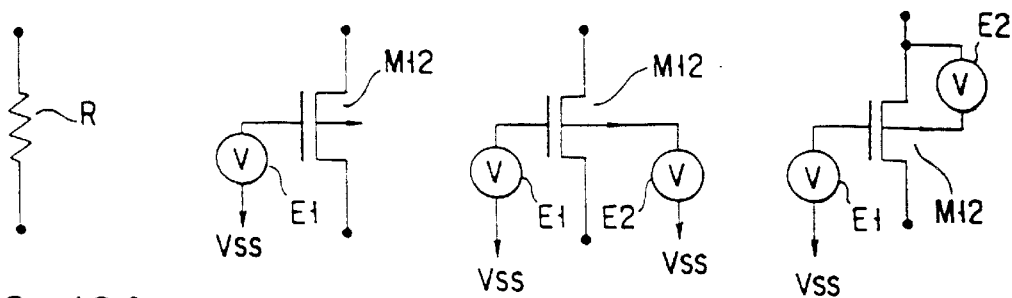
FIG. 19A   FIG. 19B   FIG. 19C   FIG. 19D
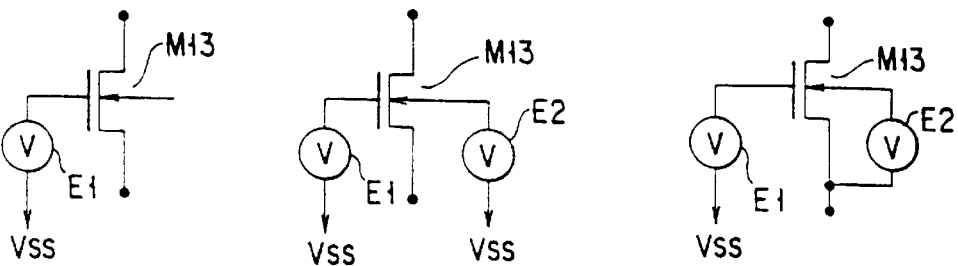
FIG. 19E   FIG. 19F   FIG. 19G
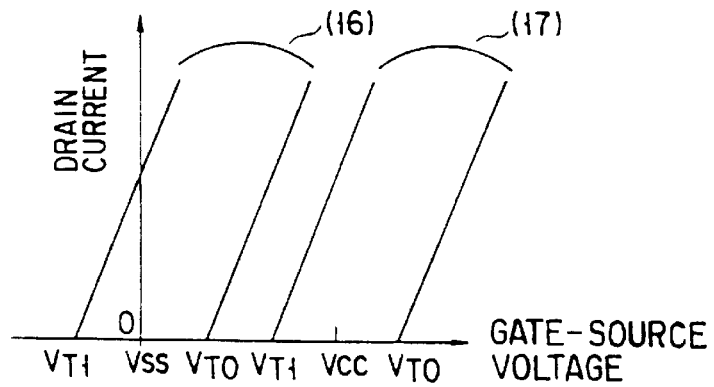
FIG. 20
| XA | XB | NOR Y | NAND Y |
|---|---|---|---|
| 0 | 0 | 1 | 1 |
| 0 | 1 | 0 | 1 |
| 1 | 0 | 0 | 1 |
| 1 | 1 | 0 | 0 |
FIG. 21

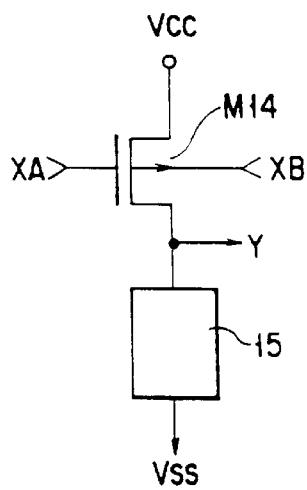
F I G. 22
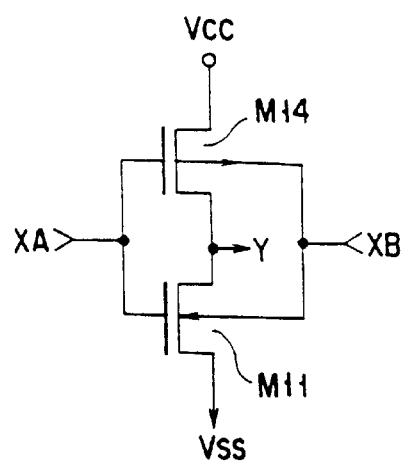
F I G. 23
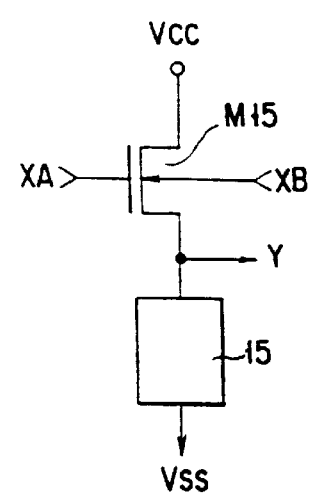
F I G. 24
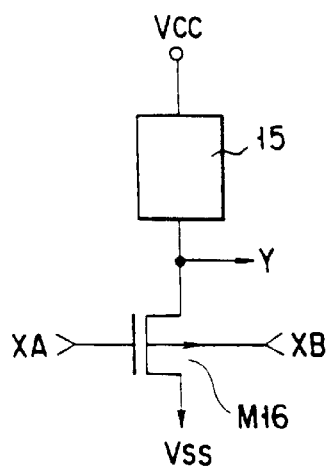
F I G. 25
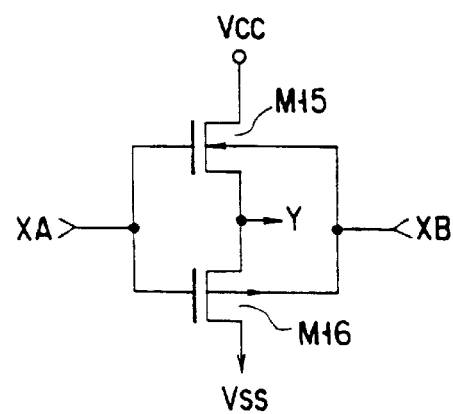
F I G. 26
F I G. 27
| A | B | OR Y | AND Y |
|---|---|------|-------|
| 0 | 0 | 0 | 0 |
| 0 | 1 | 1 | 0 |
| 1 | 0 | 1 | 0 |
| 1 | 1 | 1 | 1 |

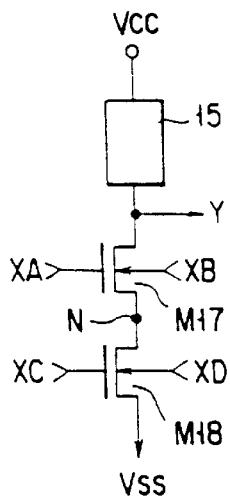
FIG. 28A
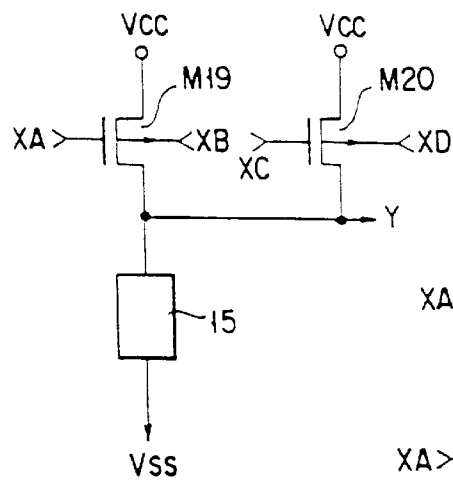
FIG. 28B
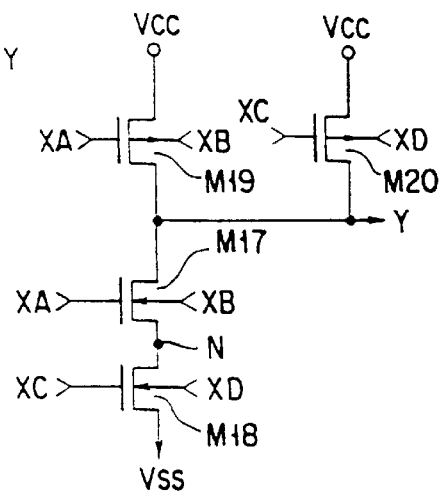
FIG. 28C
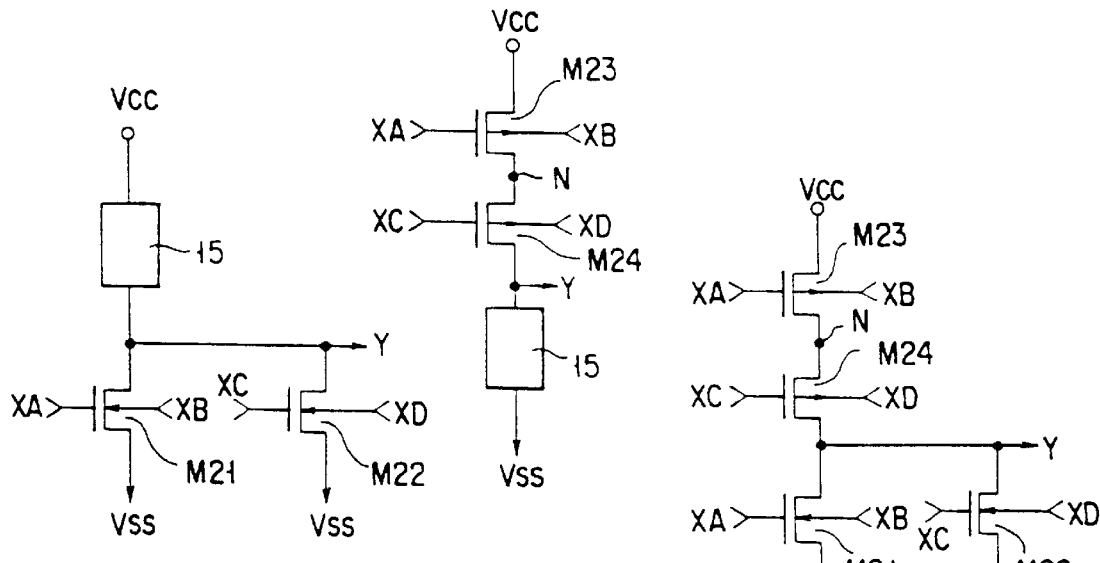
FIG. 29A
FIG. 29B
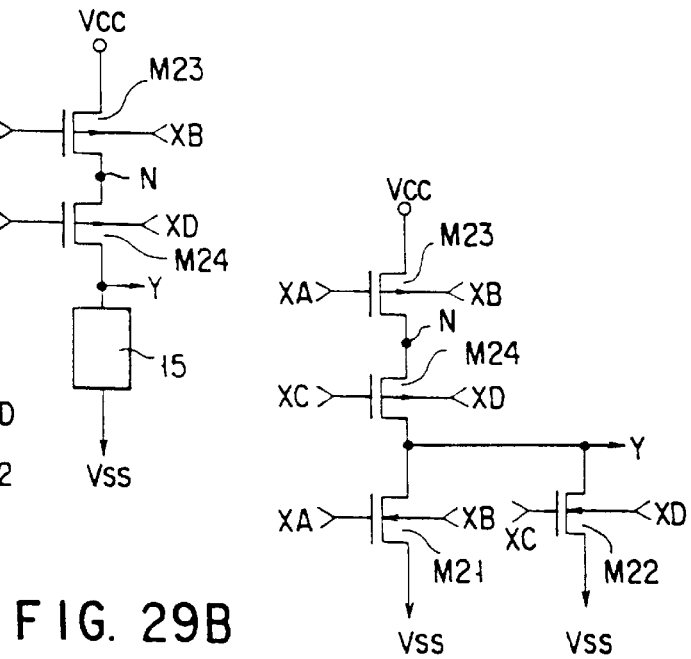
FIG. 29C

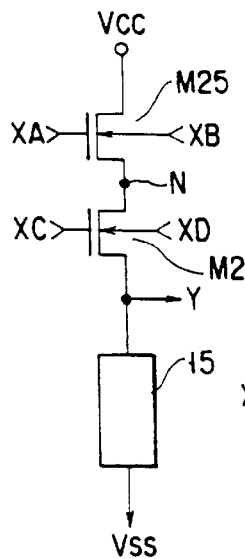
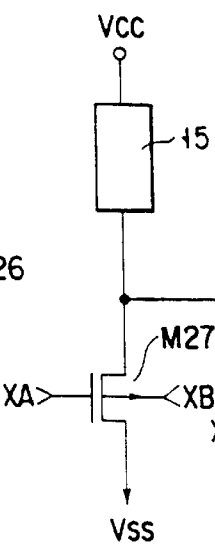
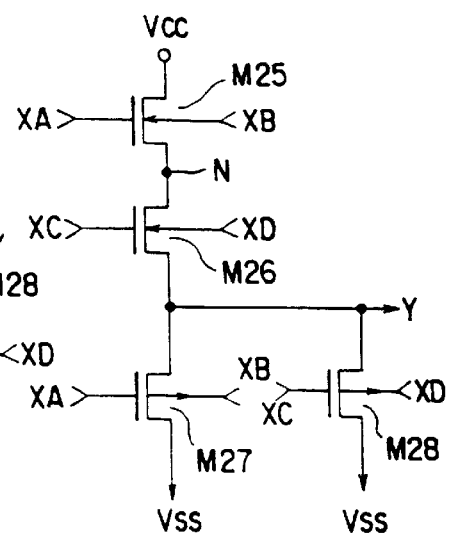
F I G. 30A    F I G. 30B    F I G. 30C
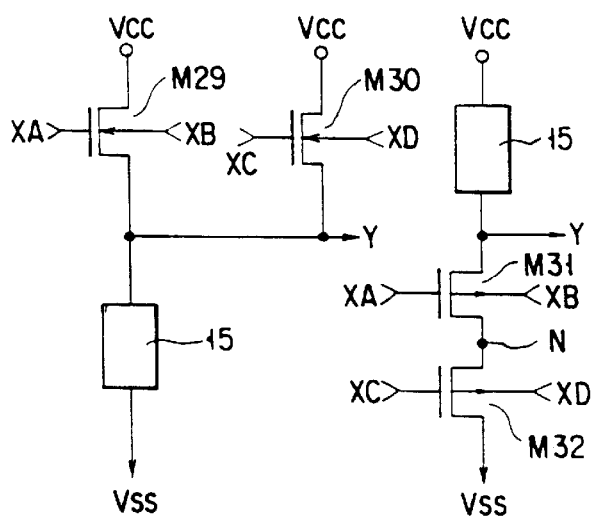
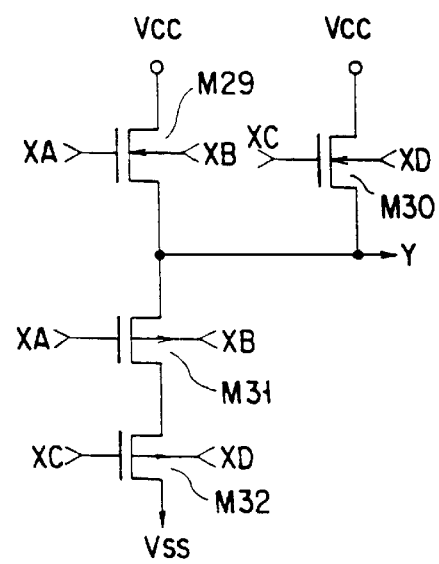
F I G. 31A    F I G. 31B    F I G. 31C

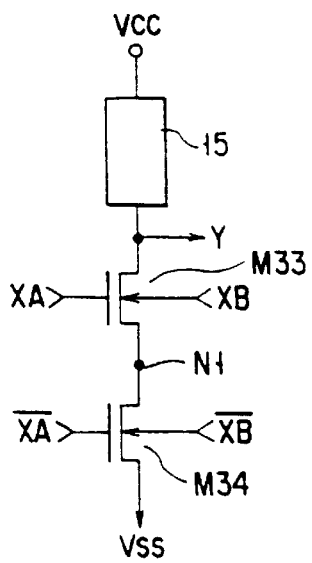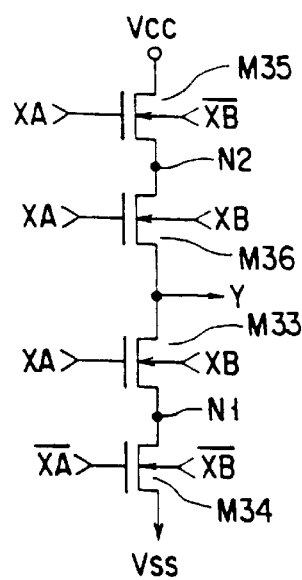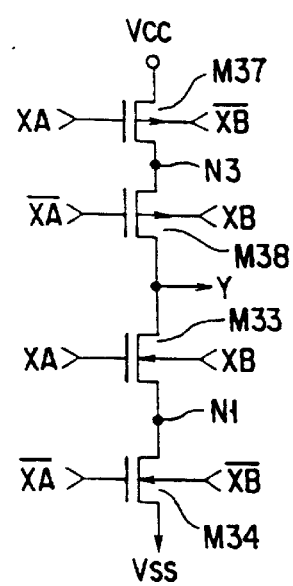
F I G. 32A   F I G. 32B   F I G. 32C
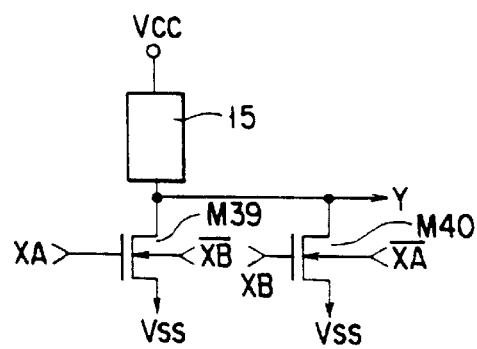
F I G. 32D
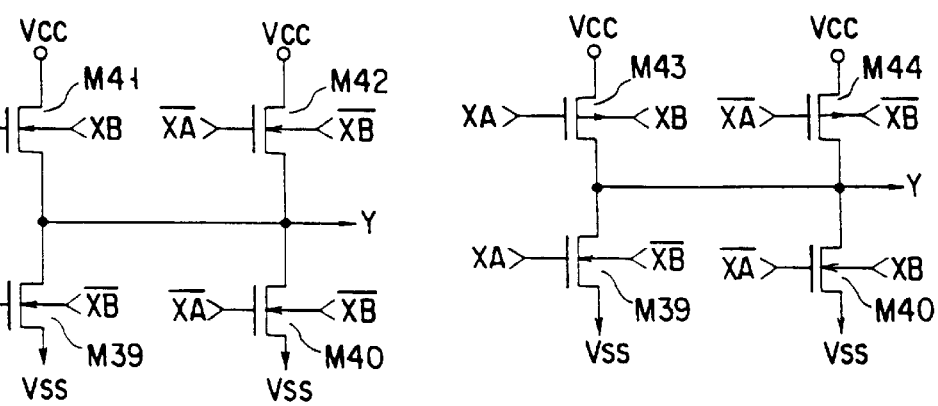
F I G. 32E   F I G. 32F

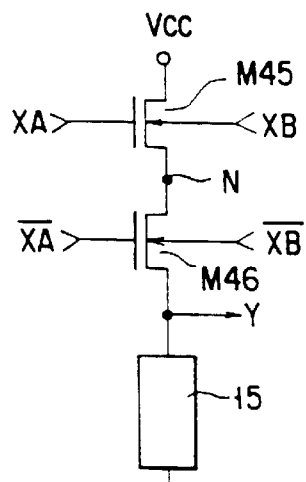
F I G. 33
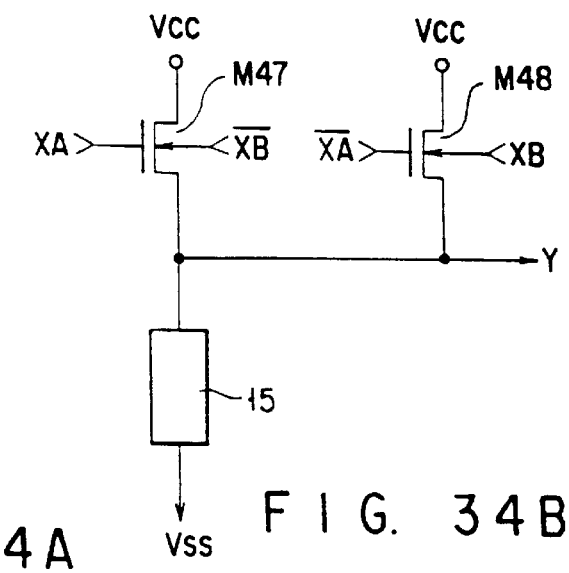
F I G. 34A
F I G. 34B
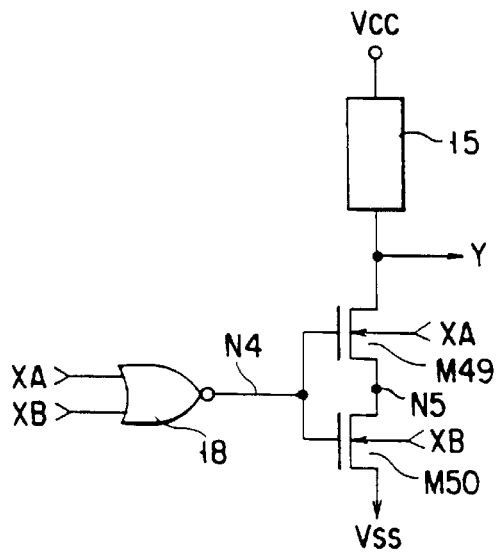
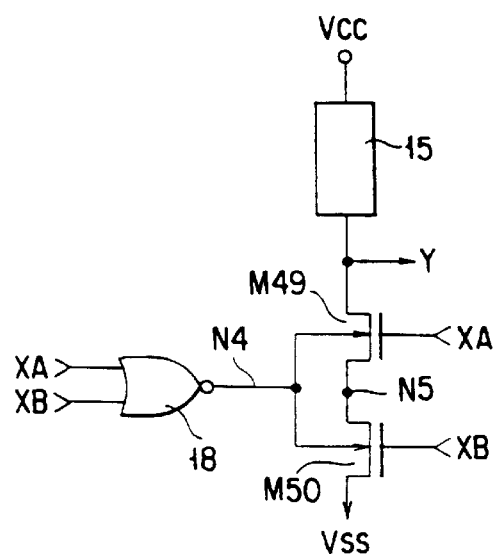
F I G. 34C
F I G. 34D

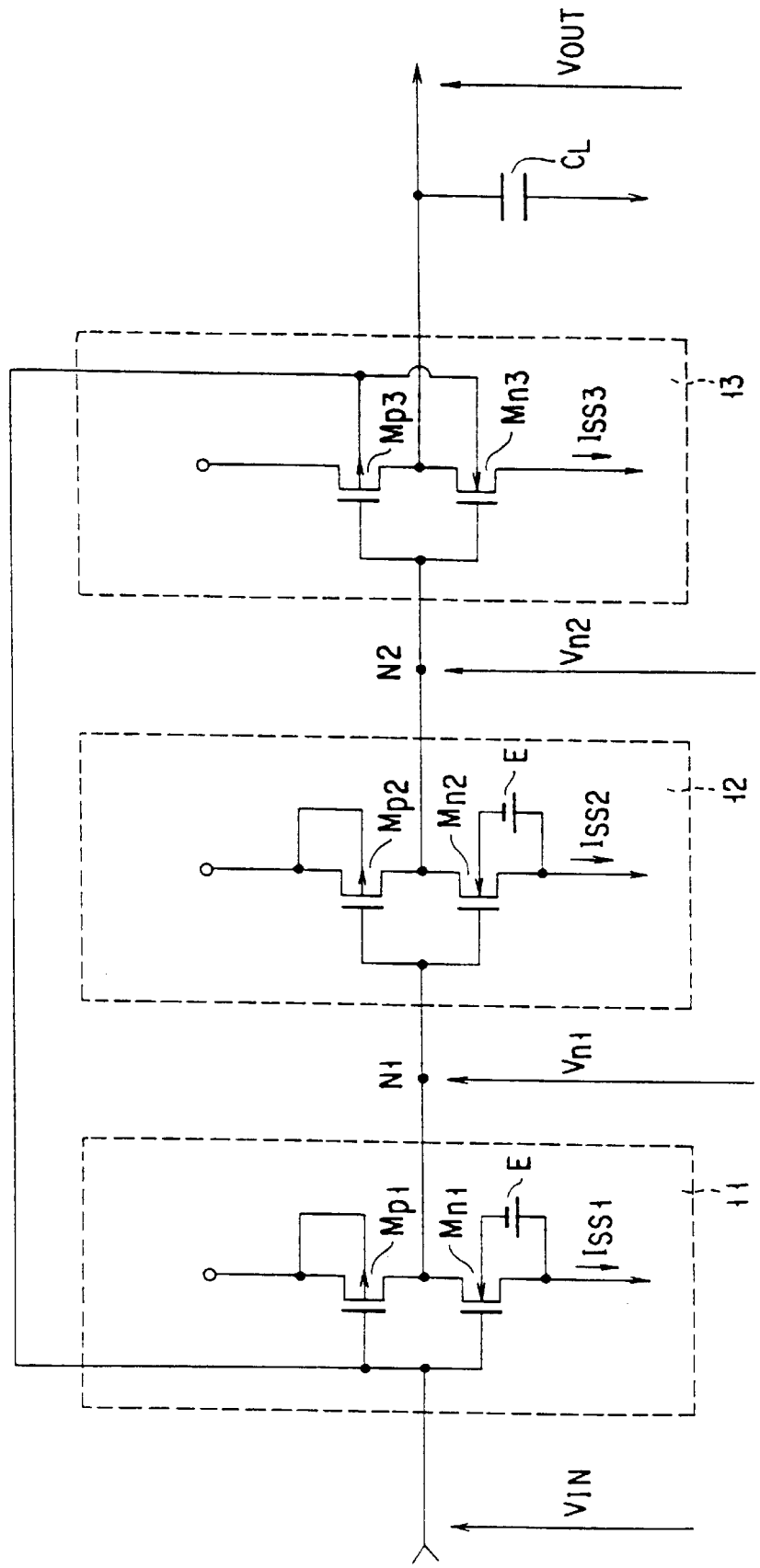
F I G. 35

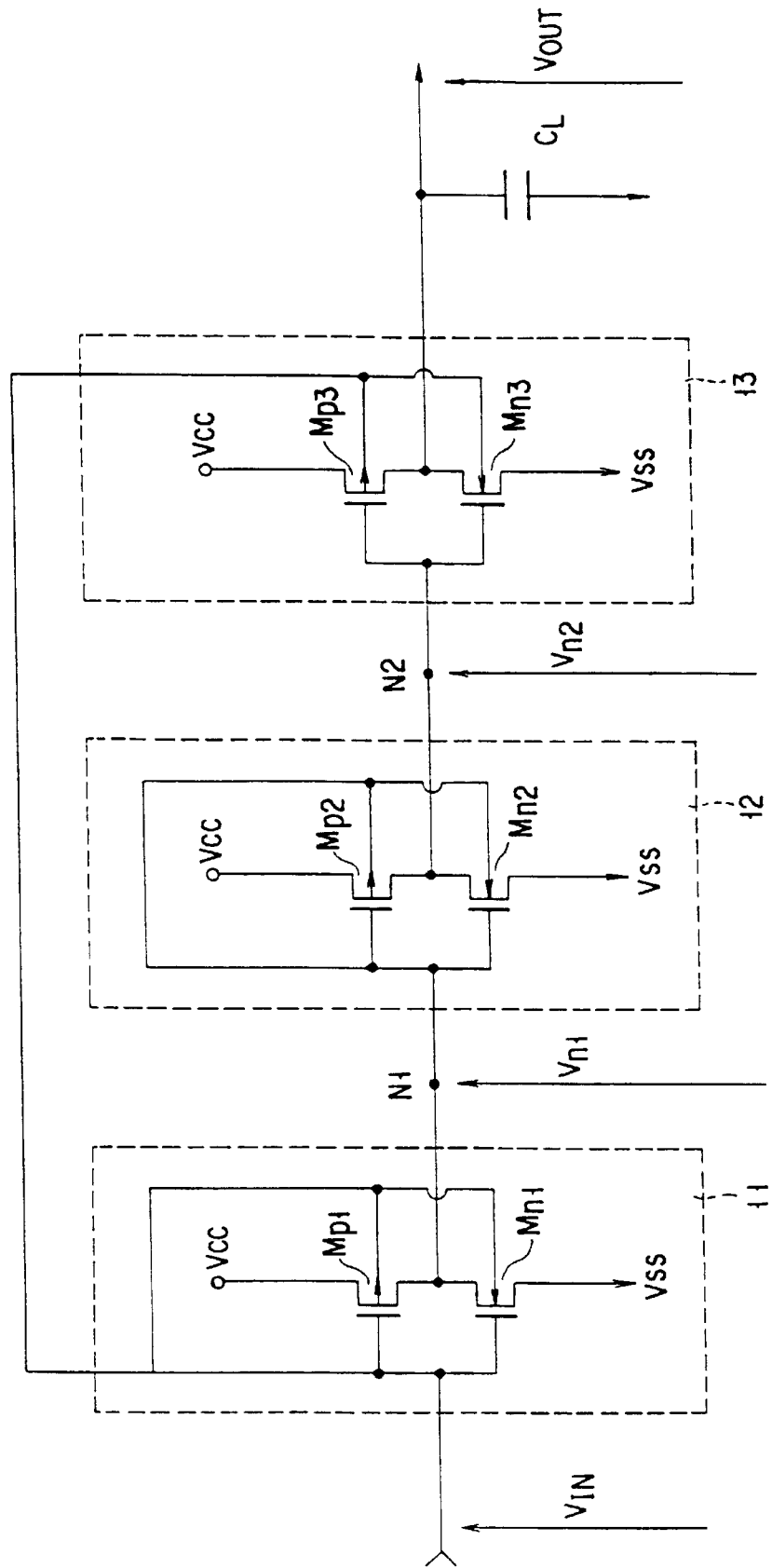
F I G. 37

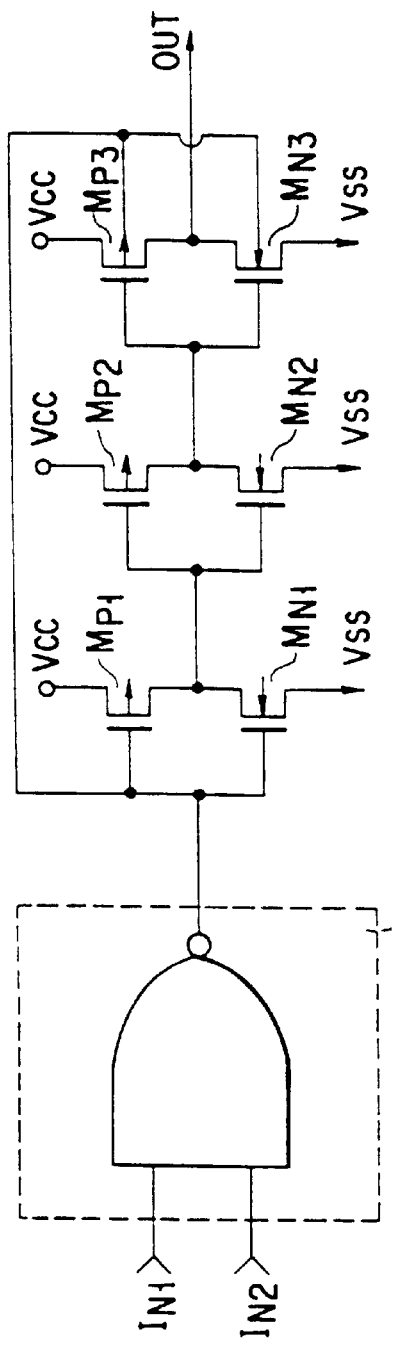
F I G. 40A
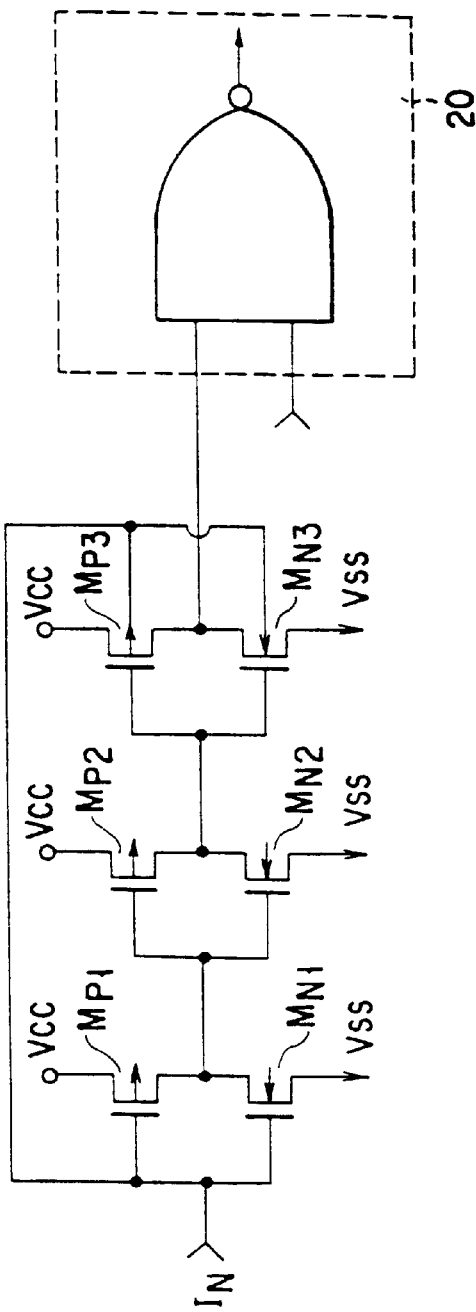
F I G. 40B

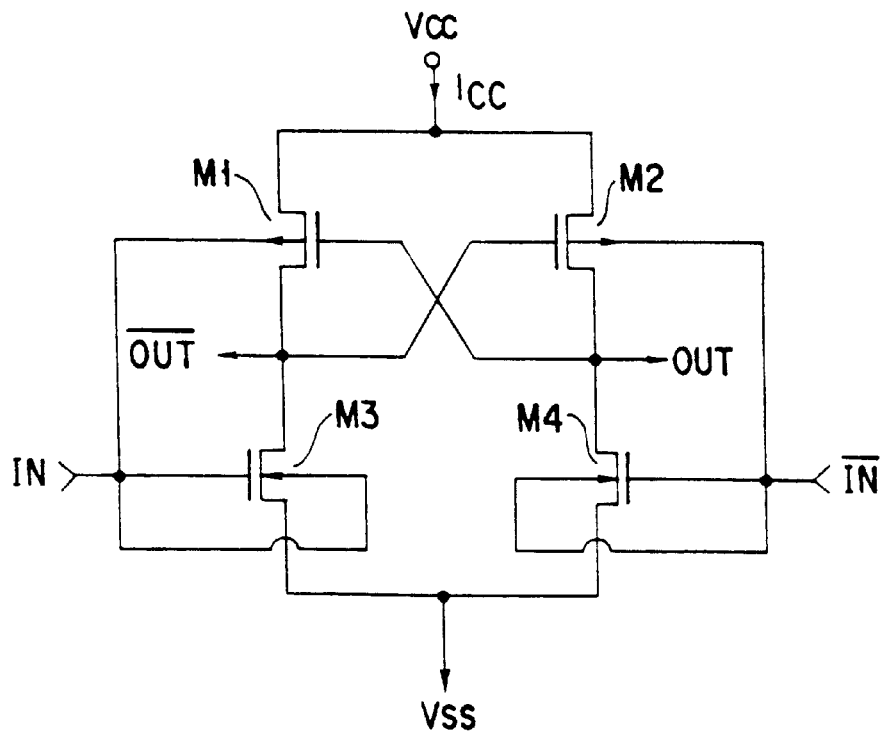
F I G. 41
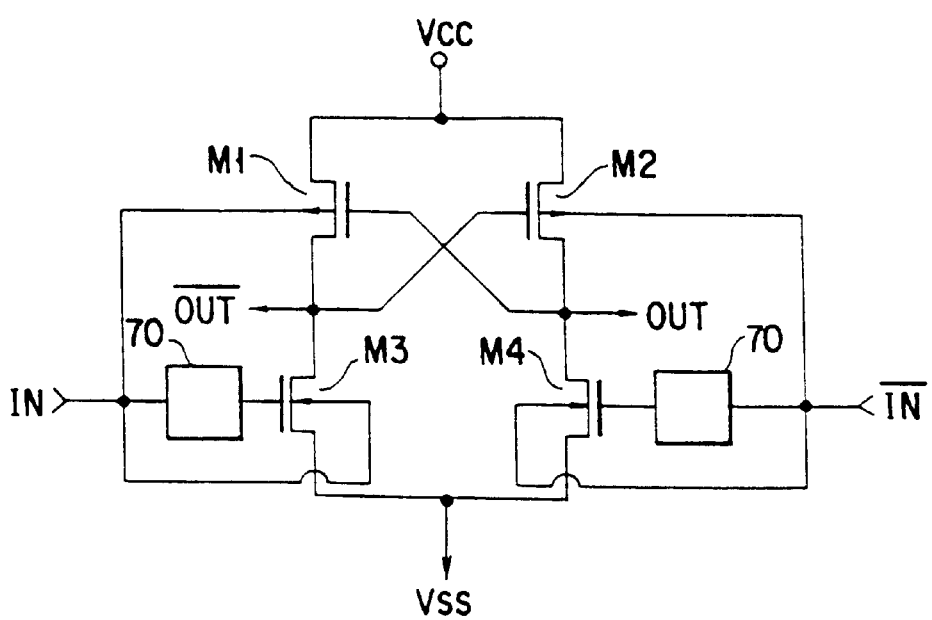
F I G. 43

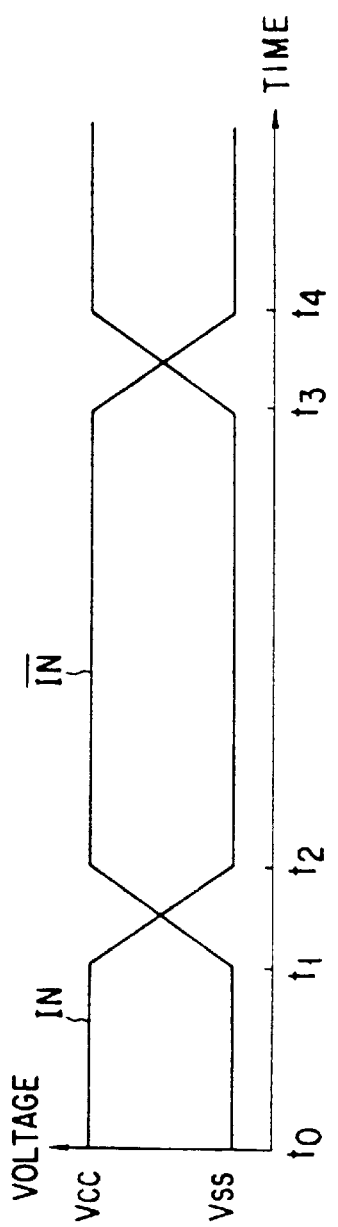
F I G. 42A
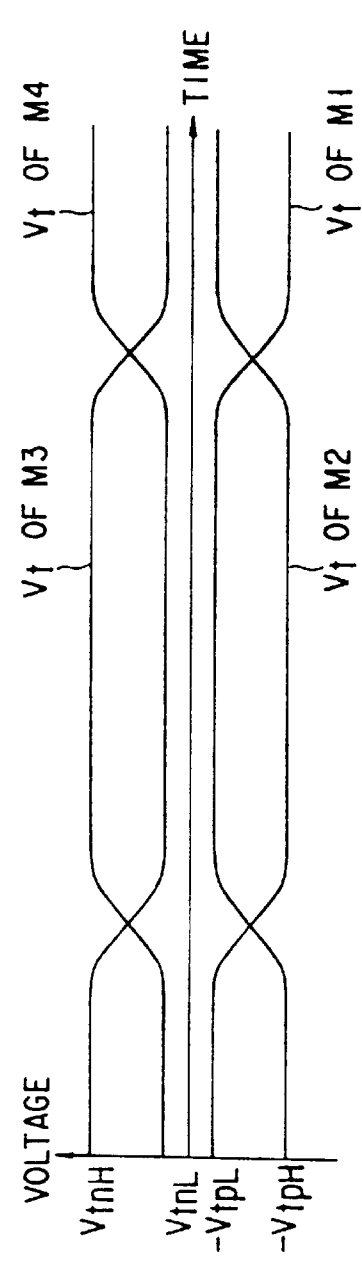
F I G. 42B
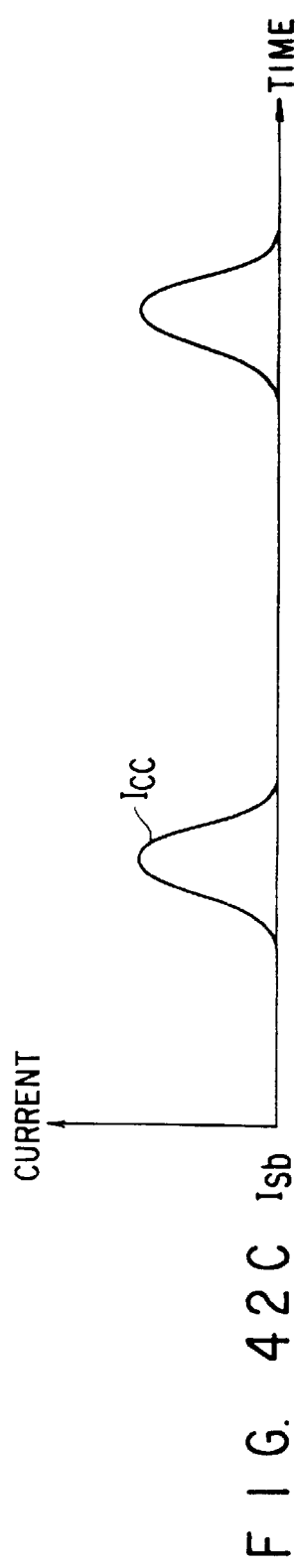
F I G. 42C

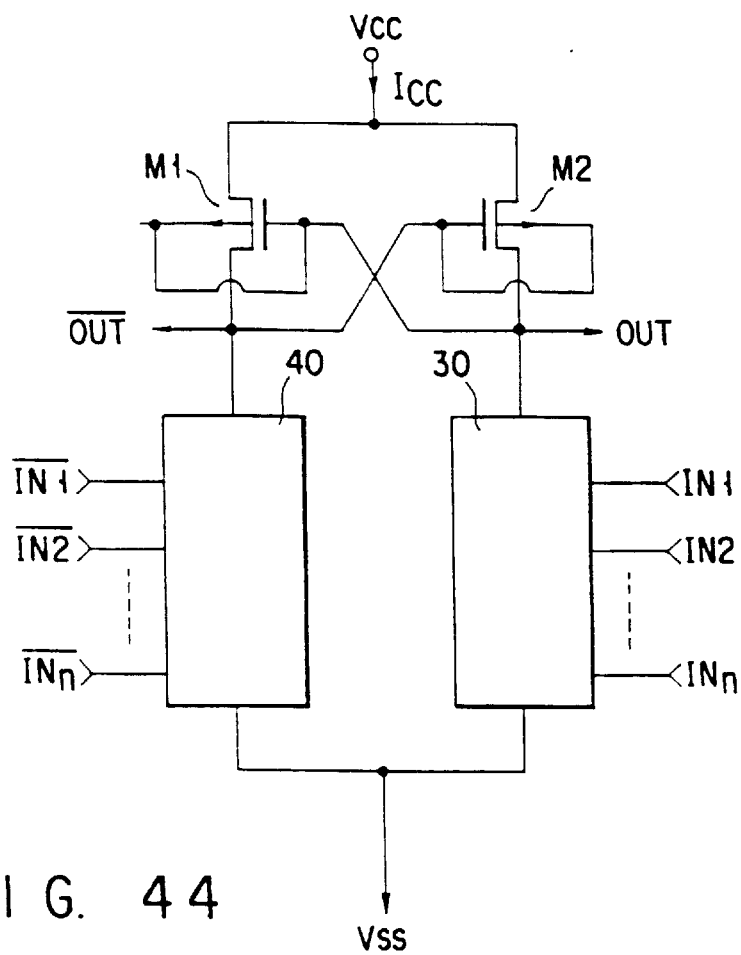
F I G. 44
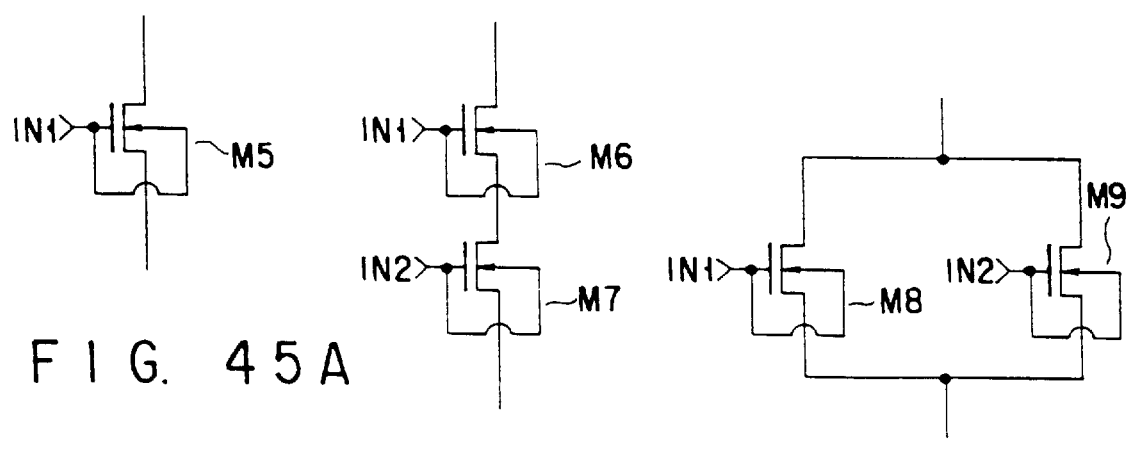
F I G. 45A　　F I G. 45B　　F I G. 45C

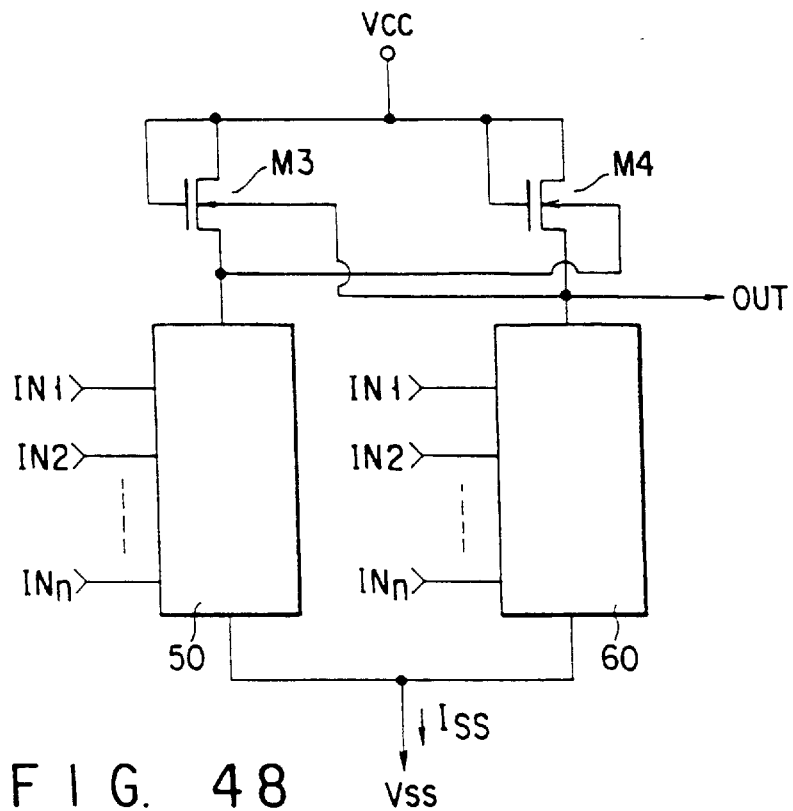
F I G. 48
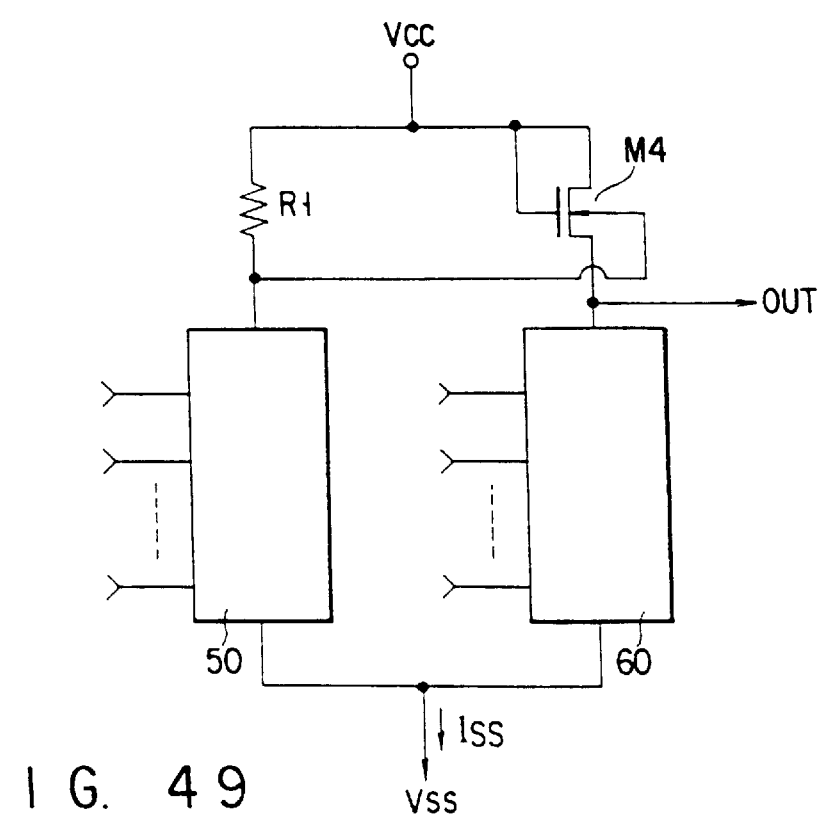
F I G. 49

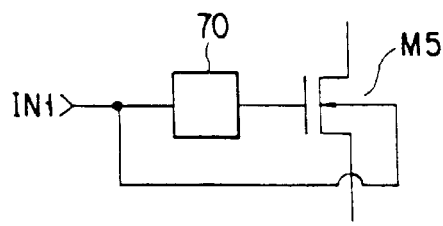
F I G. 50A
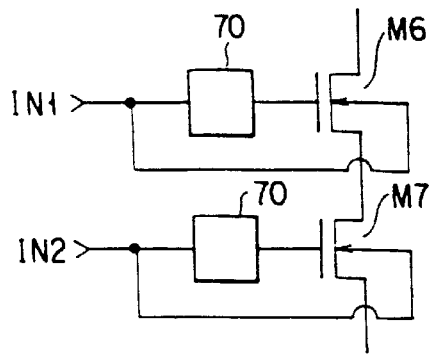
F I G. 50B
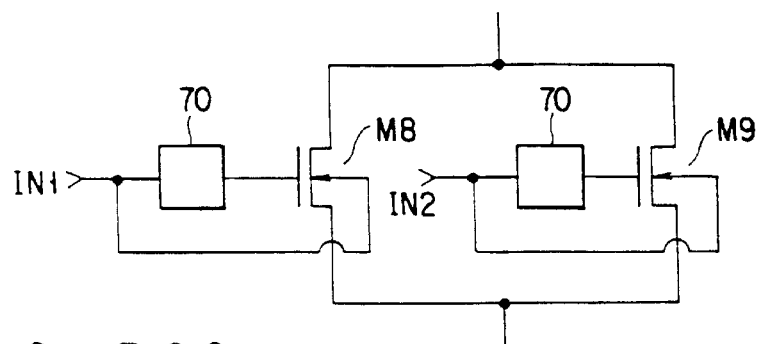
F I G. 50C
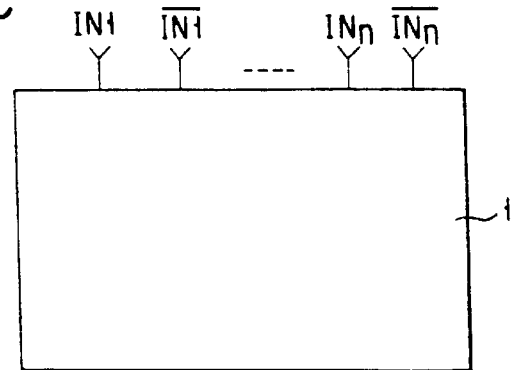
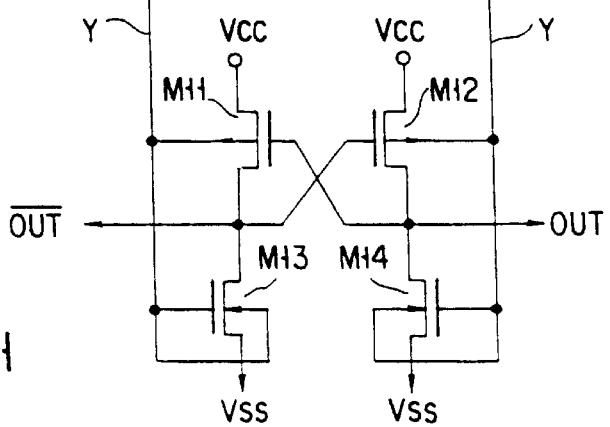
F I G. 51

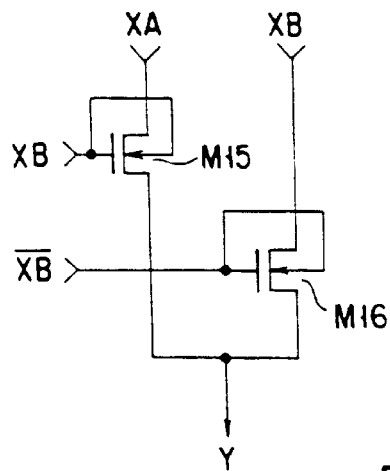
F I G. 52
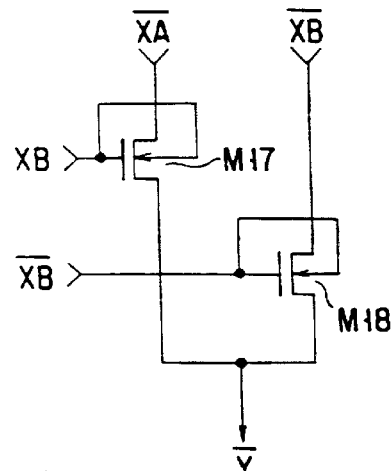
F I G. 53
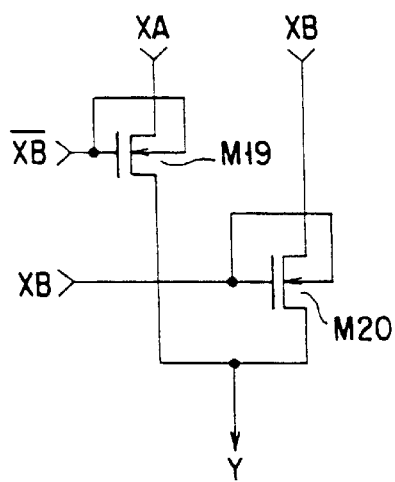
F I G. 54
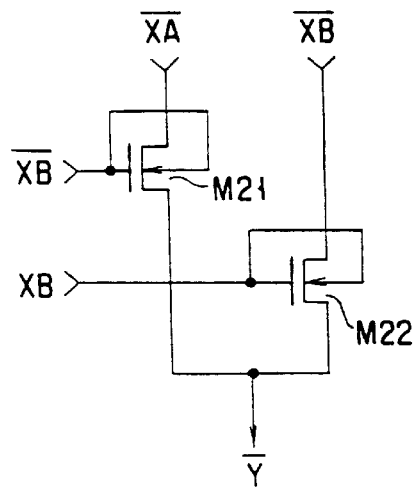
F I G. 55
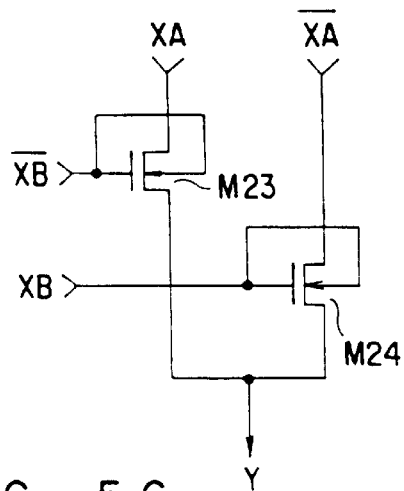
F I G. 56
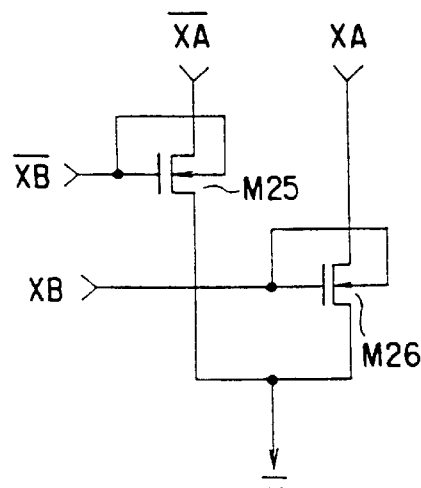
F I G. 57

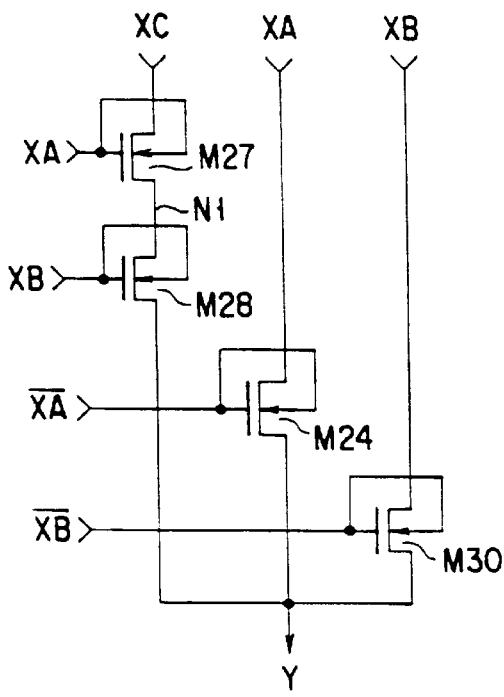
F I G. 58
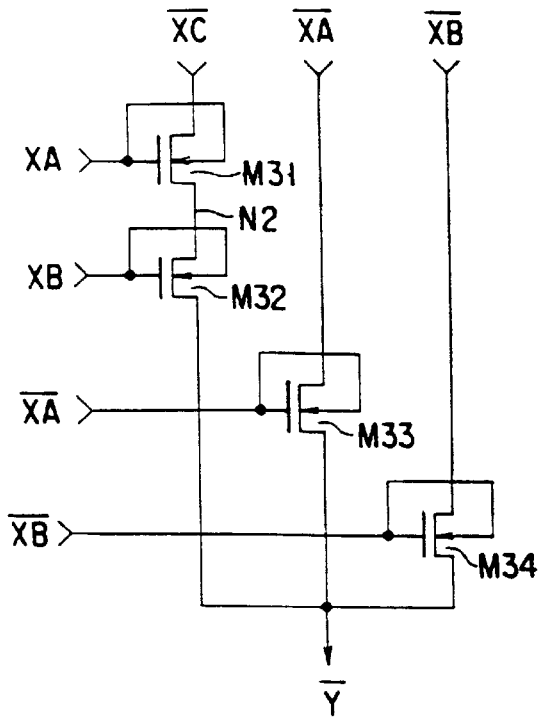
F I G. 59
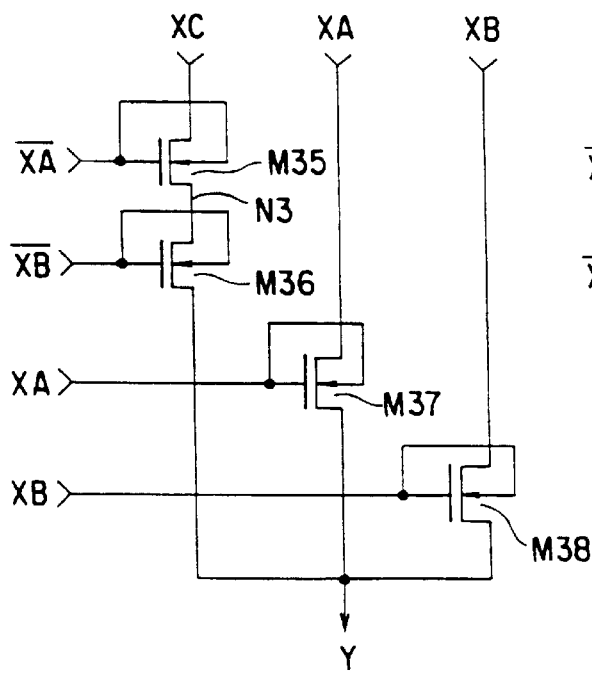
F I G. 60
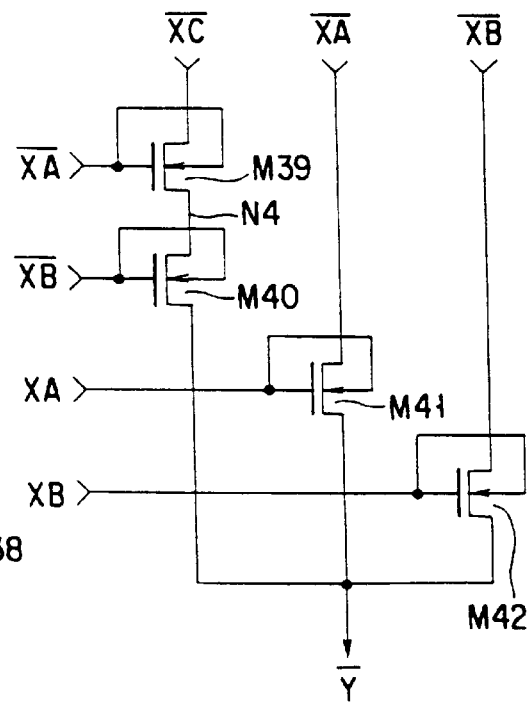
F I G. 61

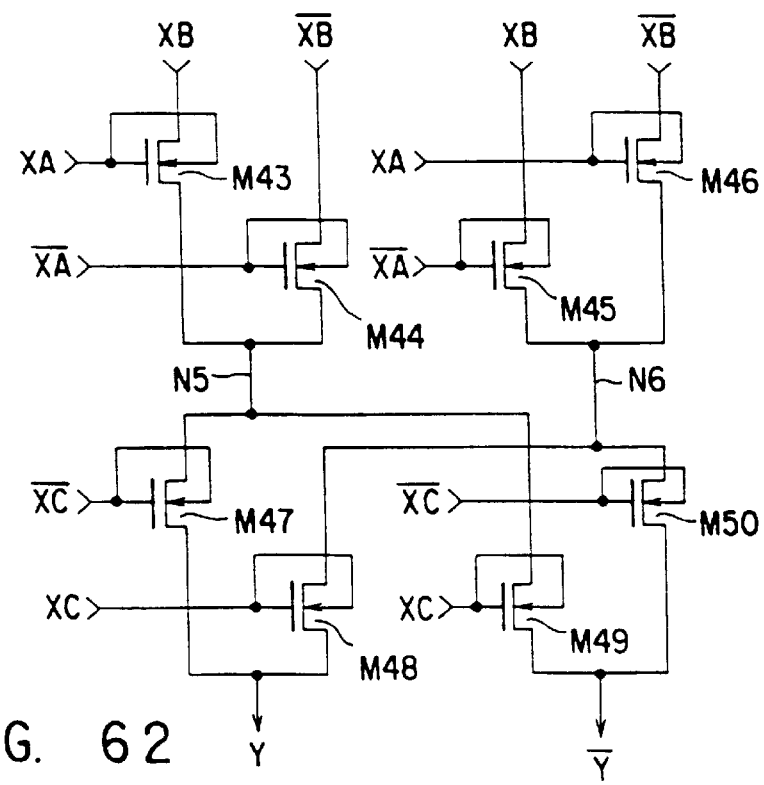
F I G. 62
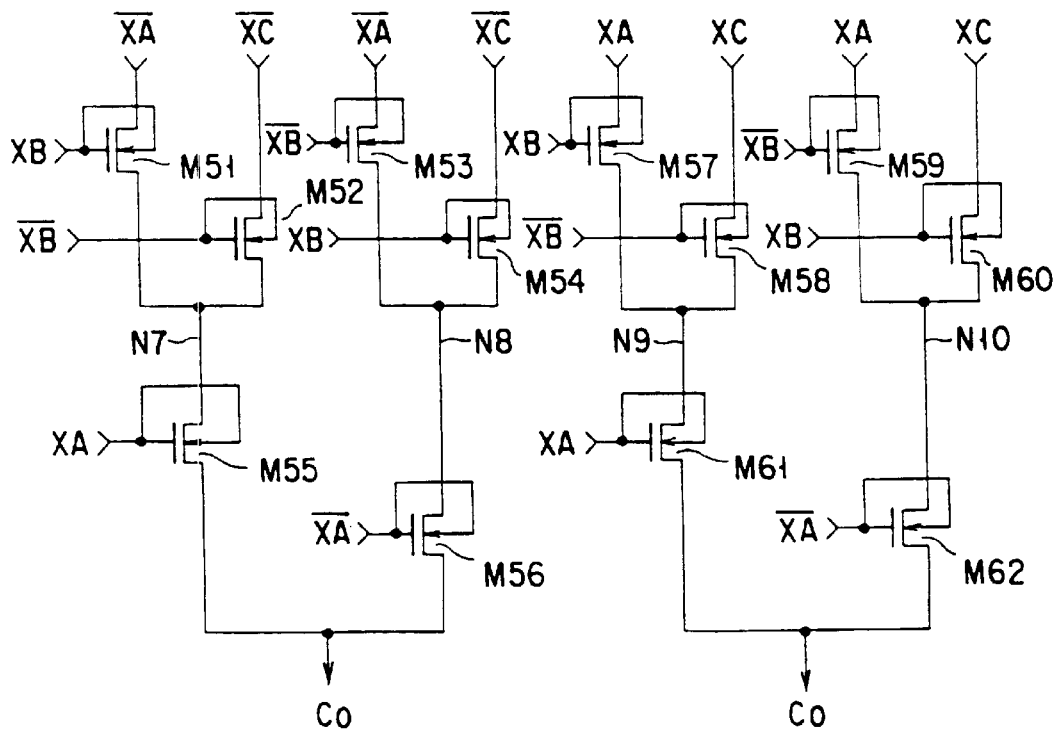
F I G. 63A  F I G. 63B

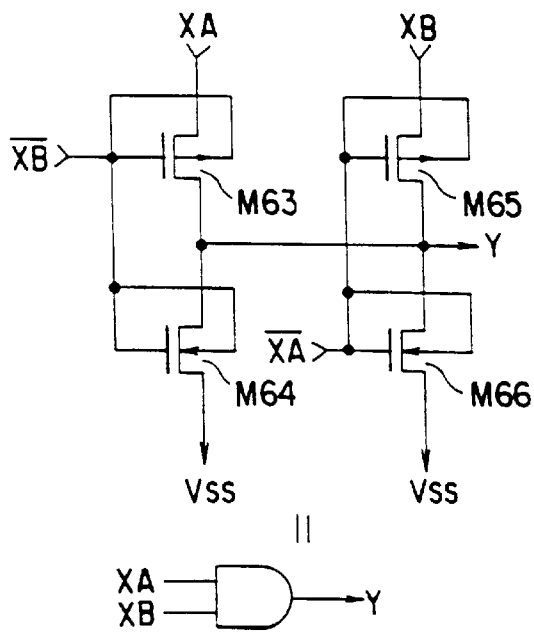
F I G. 64
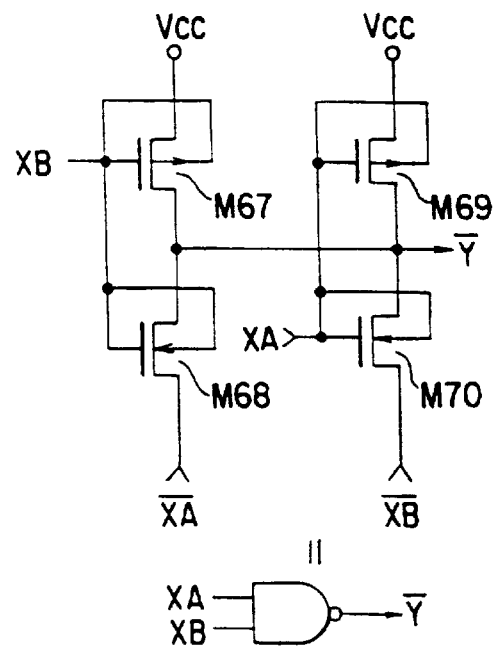
F I G. 65
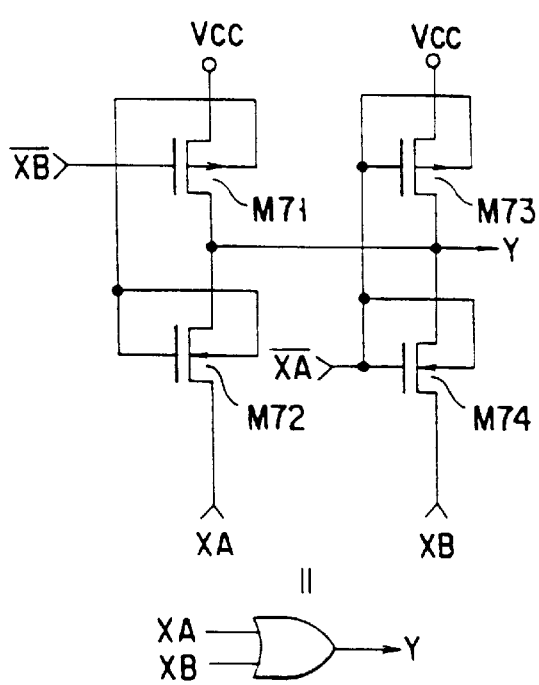
F I G. 66
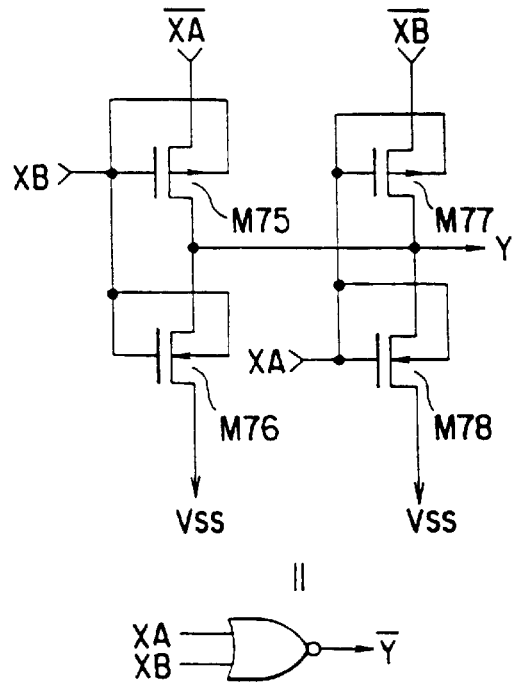
F I G. 67

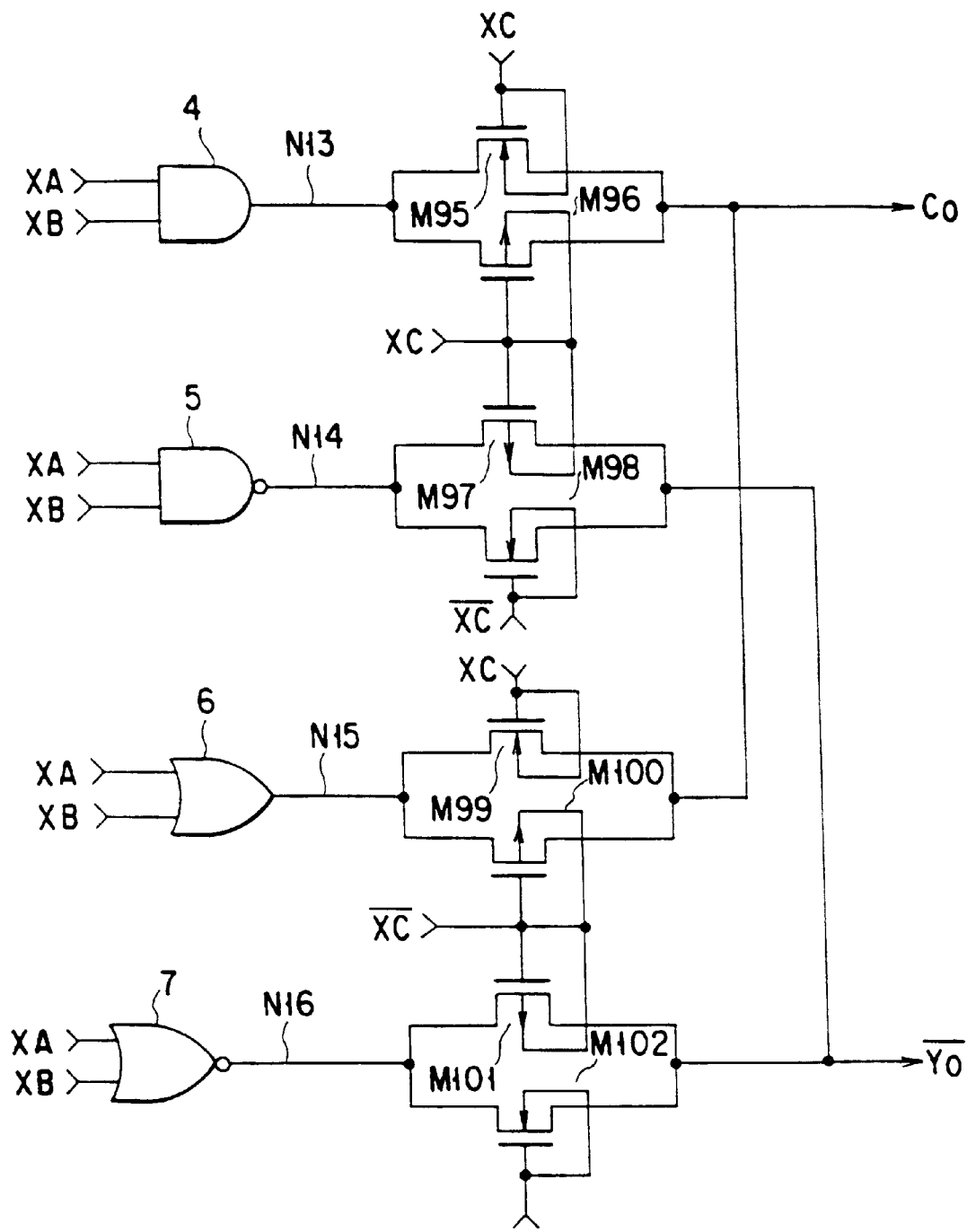
F I G. 7 1

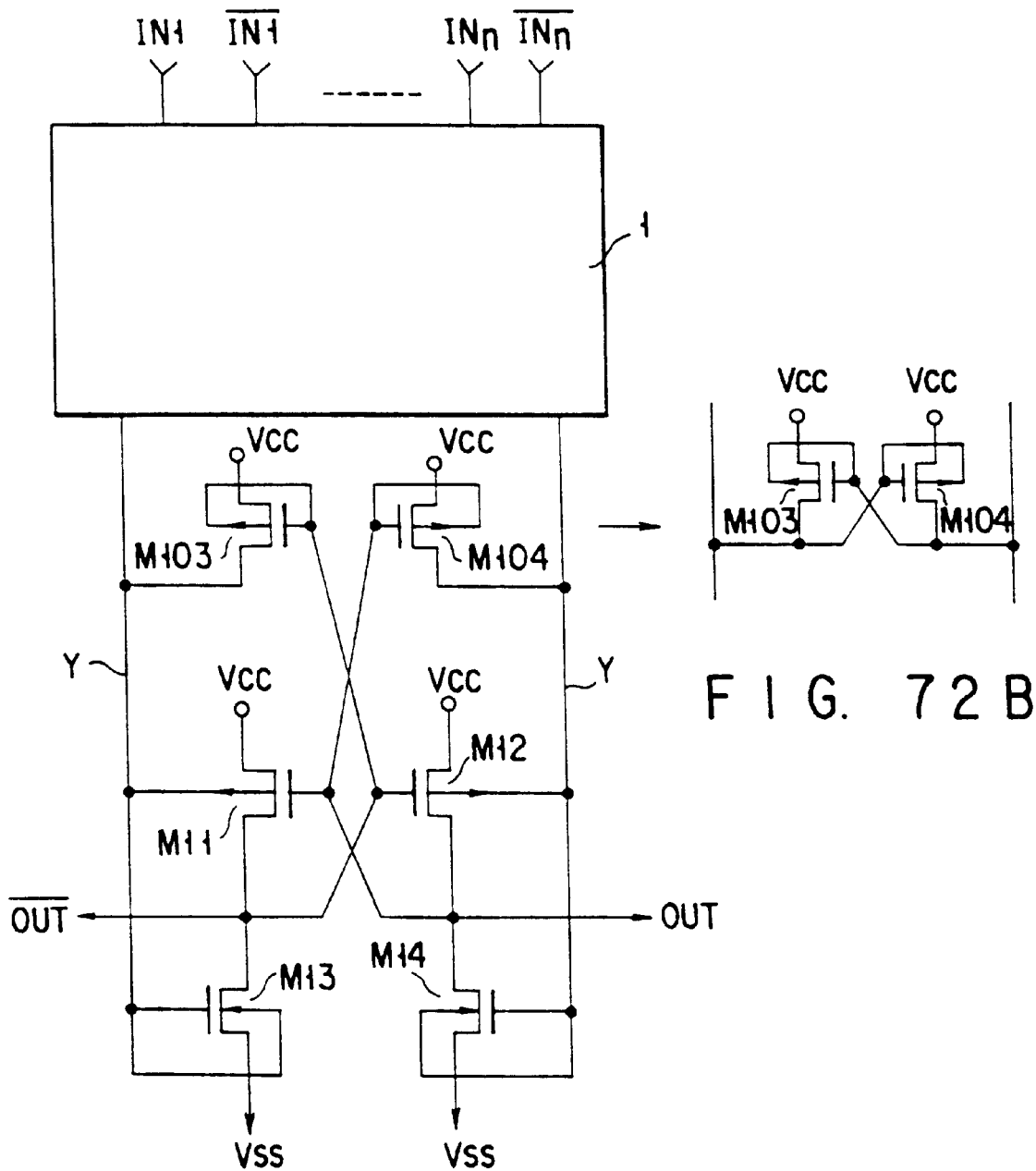
F I G. 72 B
F I G. 72 A

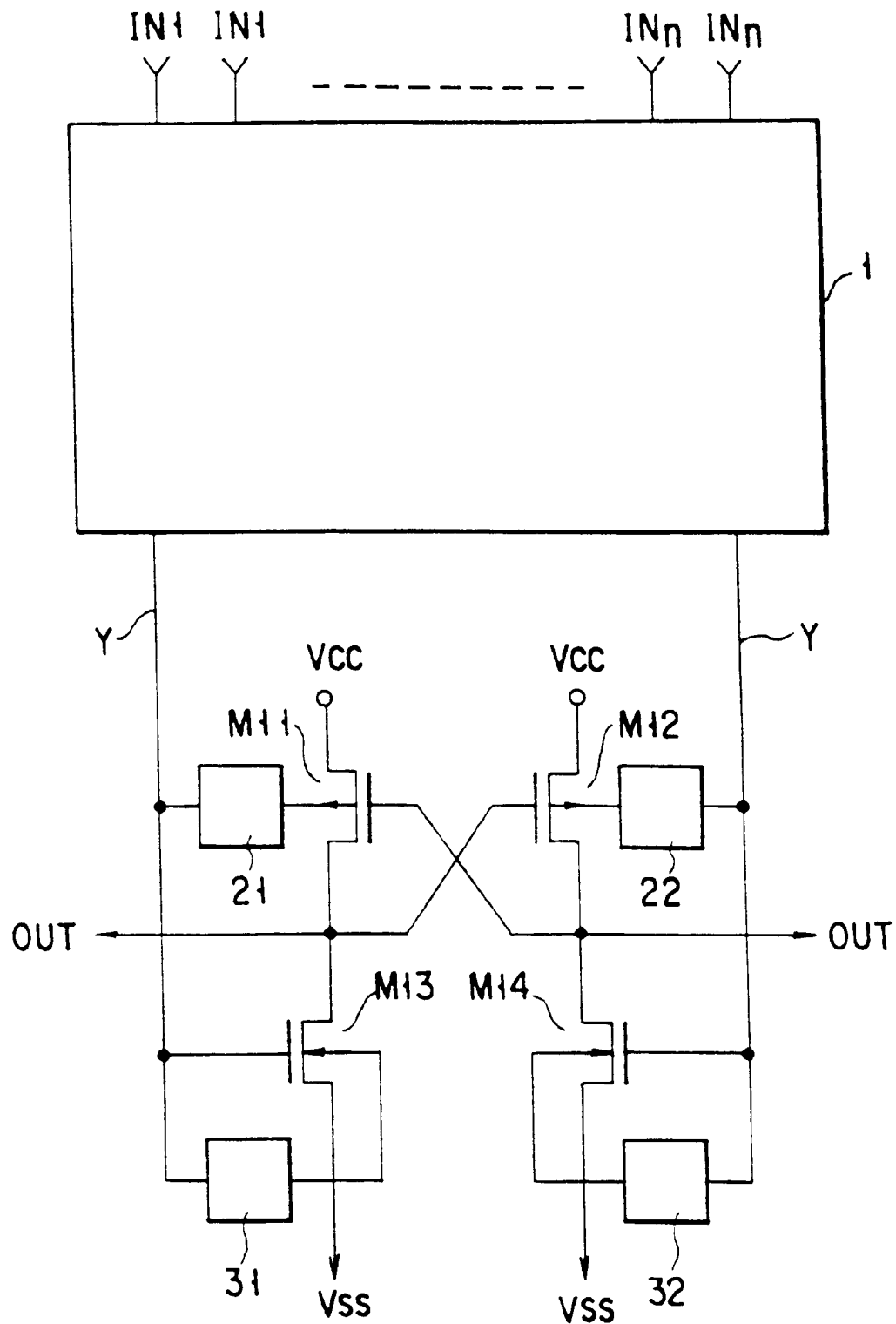
F I G. 73

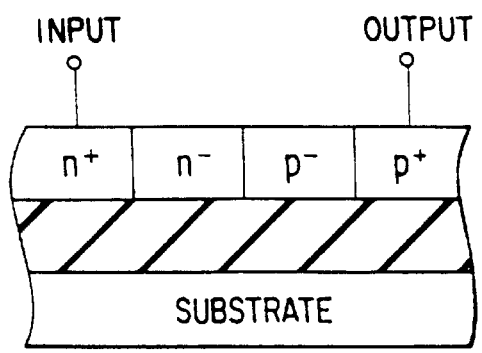
F I G. 79 A
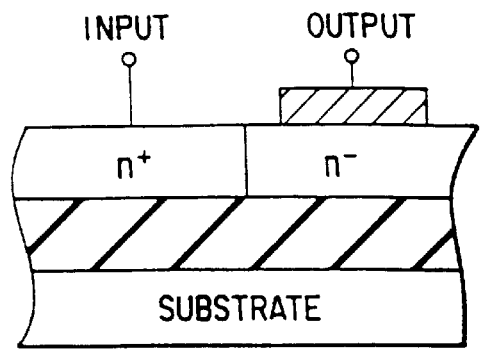
F I G. 79 B
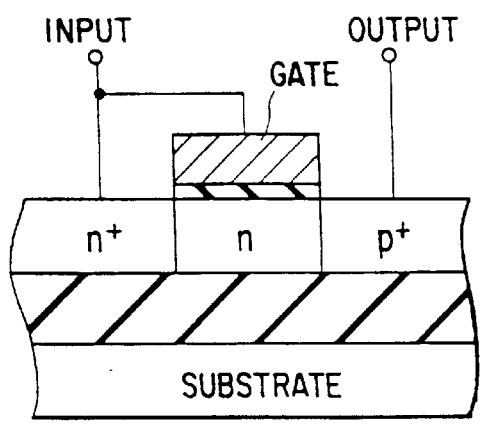
F I G. 79 C
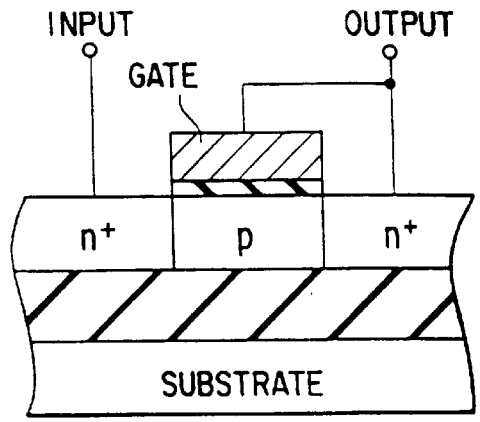
F I G. 79 D
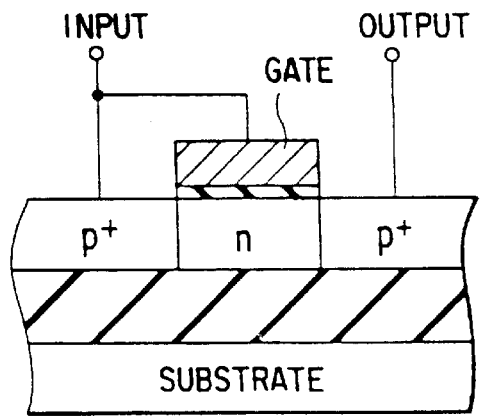
F I G. 79 E
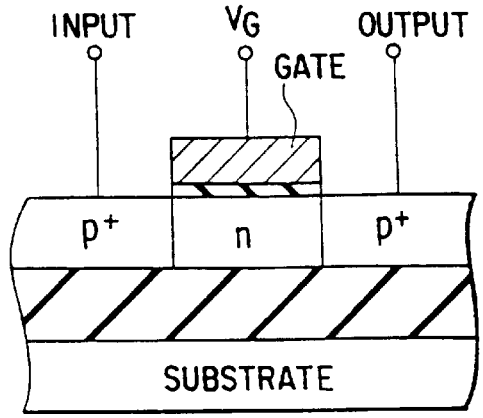
F I G. 79 F

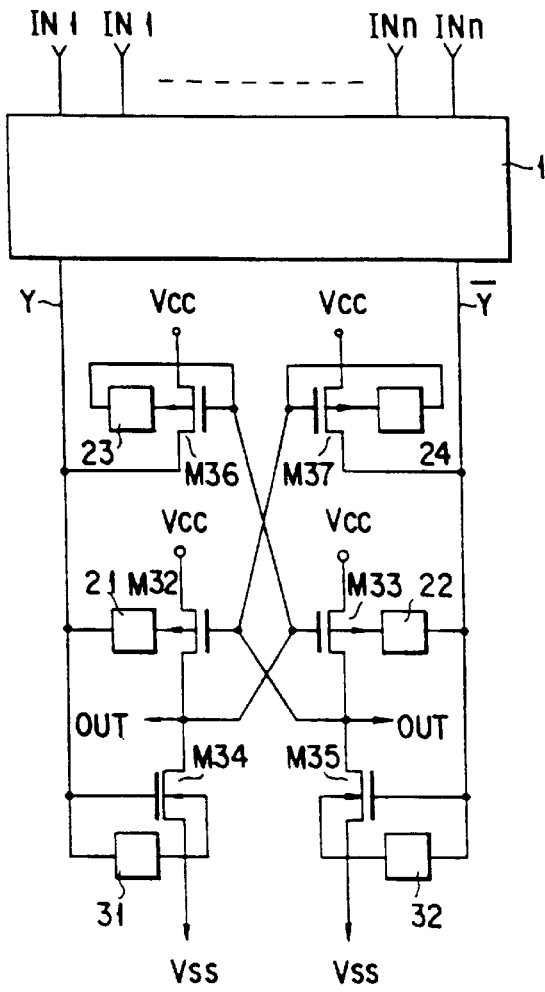
F I G. 86
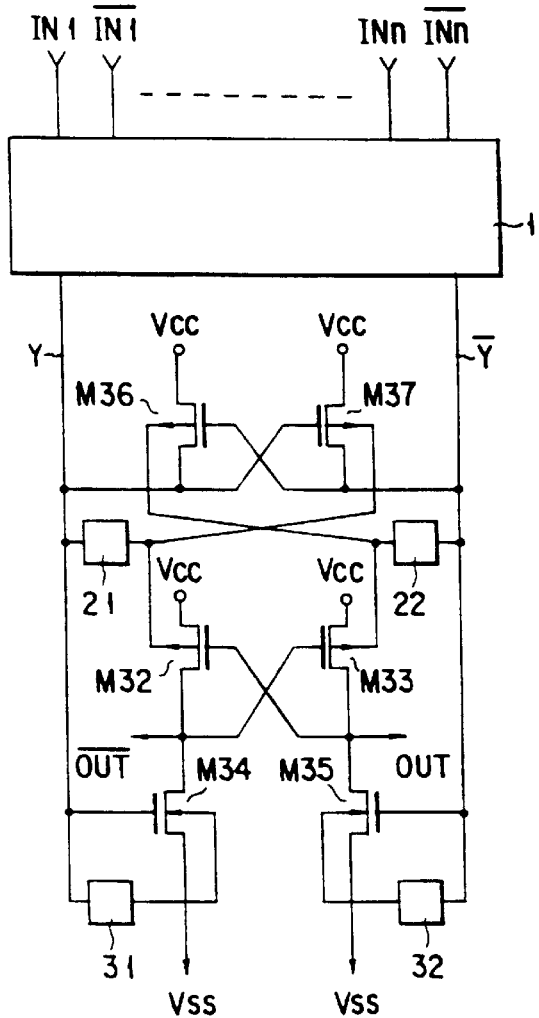
F I G. 87

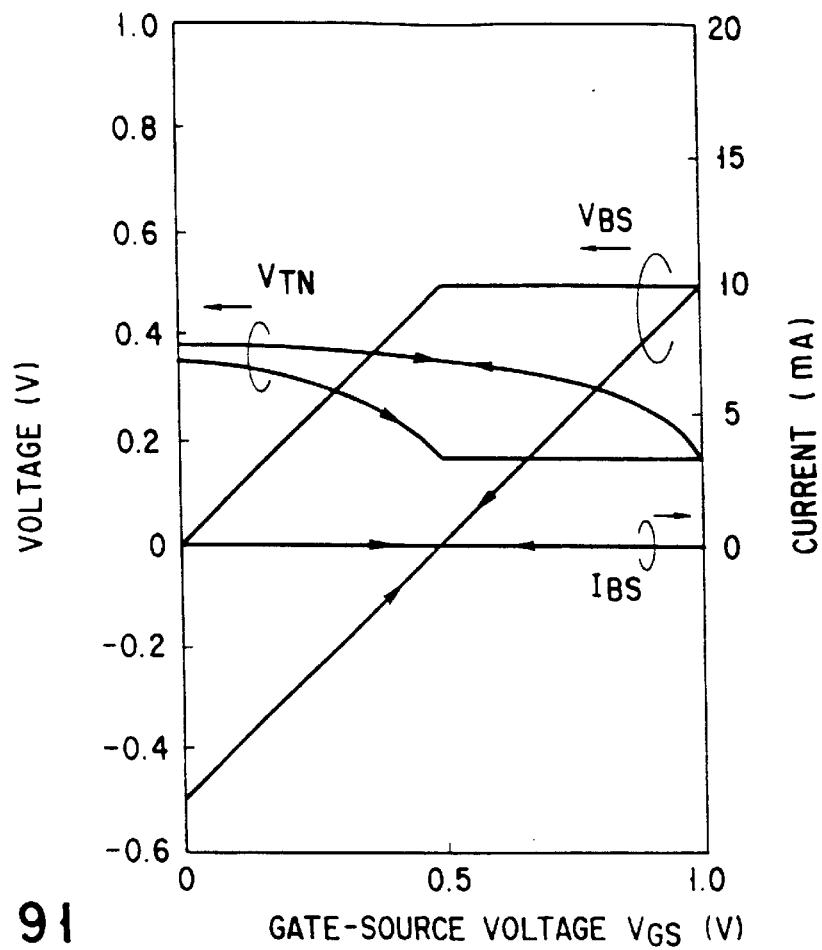
F I G. 91
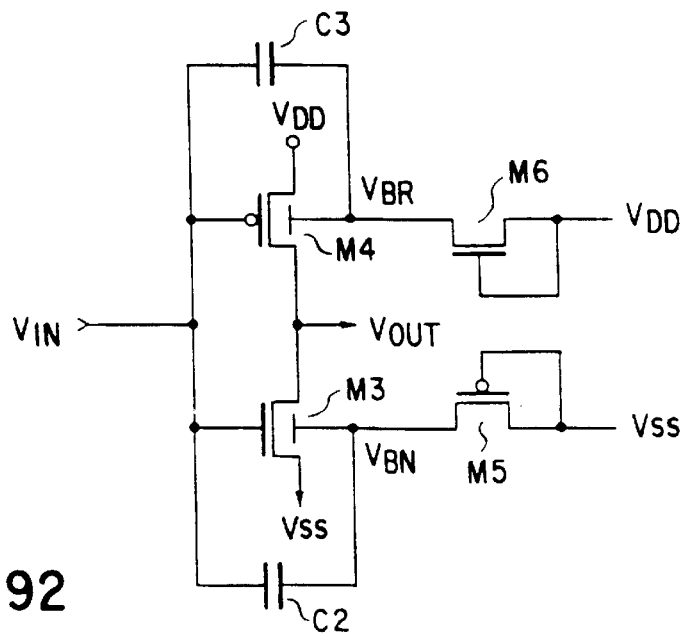
F I G. 92

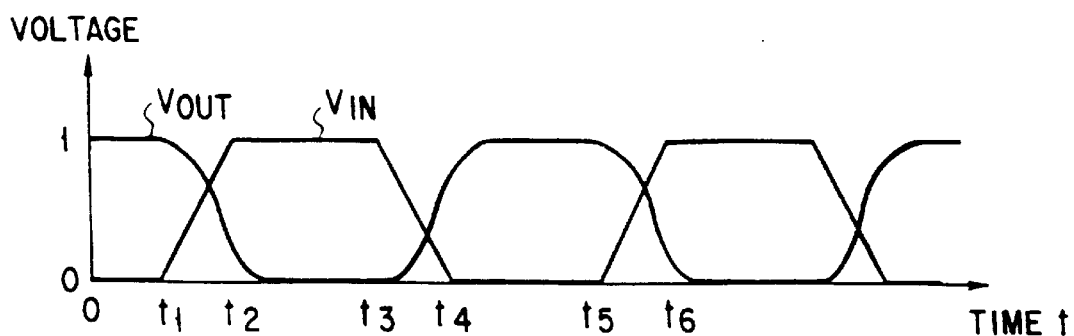
F I G. 93A
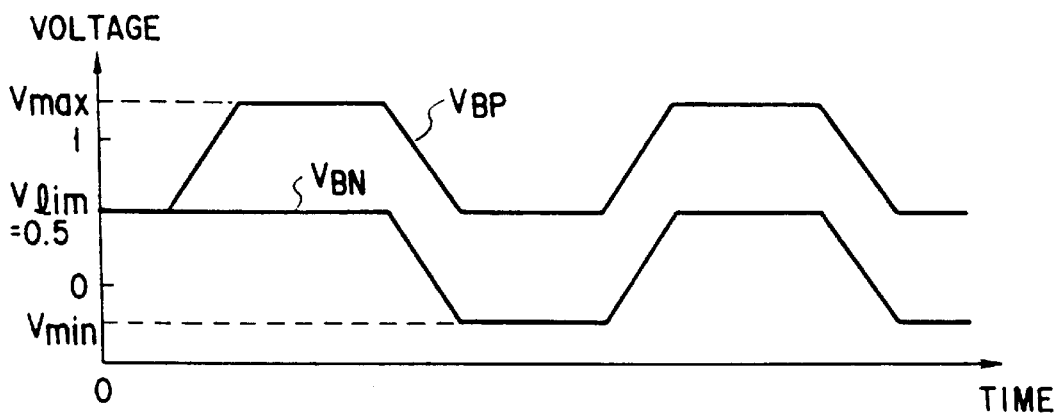
F I G. 93B
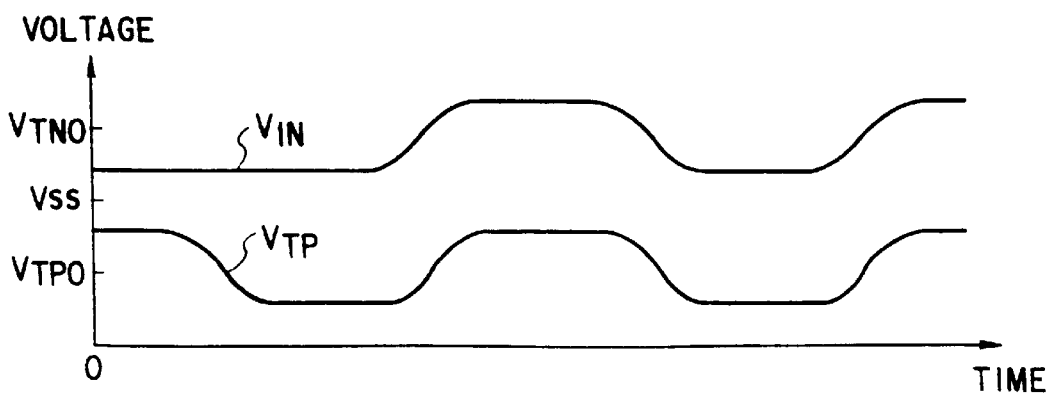
F I G. 93C

SEMICONDUCTOR INTEGRATED CIRCUIT DEVICE

This application is a continuation of Ser. No. 08/658,610 filed Jun. 5, 1996 now ABN.

BACKGROUND OF THE INVENTION

1. Field of the Invention

The present invention relates to a semiconductor integrated circuit device having a logical gate including MOS transistors.

2. Description of the Related Art

In recent years, the degrees of integration of semiconductor integrated circuits have been considerably raised, thus resulting in gigabit-class semiconductor memories being provided with several hundred millions of semiconductor devices integrated on one chip thereof and 64 bit microprocessors being provided with millions to ten millions of semiconductor devices integrated on one chip thereof. Each of the foregoing semiconductor memory and the microprocessor of the foregoing type is composed of, as well as a memory cell for storing information, a logical gate for performing logic operations.

FIG. 1A shows a dual-input NAND gate which is a representative logical gate. The logical gate is composed of four elements consisting of two nMOS transistors M1 and M2 and two pMOS transistors M3 and M4. Specifically, the nMOS transistor M1 has a drain connected to output terminal Y, a gate connected to input signal XA, a source connected to node N and a substrate connected to a ground terminal Vss. The nMOS transistor M2 has a drain connected to the node N, a gate connected to input signal XB, a source and a substrate respectively connected to the ground terminal Vss. The pMOS transistor M3 has a drain connected to the output terminal Y, a gate connected to the input signal XA, a source and a substrate respectively connected to power supply terminal Vcc. The pMOS transistor M4 has a drain connected to the output terminal Y, a gate connected to the input signal XB, a source and a substrate respectively connected to the power supply terminal Vcc.

FIG. 1B is a truth table showing the logic of the foregoing logical gate. A definition is performed here that logic 0 is realized when each of input and output signals has ground potential Vss, and logic 1 is realized when the same has supply voltage Vcc. When both of the input signals XA and XB are logic 1, both of the nMOS transistors M1 and M2 are conductive. On the other hand, both of the pMOS transistors M3 and M4 are non-conductive. As a result, output Y is brought to logic 0. If at least either of the input signal XA or the input signal XB is logic 0, the nMOS transistor, to which logic 0 is supplied, is made to be non-conductive. On the other hand, the pMOS transistor, to which logic 0 is supplied, is made to be conductive. As a result, the output Y is made to be logic 1.

FIG. 2A shows a dual-input NOR gate. Similarly to the NAND gate, the foregoing logical gate is composed of four elements consisting of two nMOS transistors M1 and M2 and two pMOS transistors M3 and M4. Specifically, the nMOS transistor M1 has a drain connected to output terminal Y, a gate connected to input signal XA, a source and a substrate respectively connected to ground terminal Vss. The nMOS transistor M2 has a drain connected to the output terminal Y, a gate connected to input signal XB, a source and a substrate respectively connected to the ground terminal Vss. The pMOS transistor M3 has a drain connected to node N, a gate connected to the input signal XA, a source and a substrate respectively connected to power supply terminal Vcc. The pMOS transistor M4 has a drain connected to the output terminal Y, a gate connected to the input signal XB, a source connected to the node N and the substrate connected to the power supply terminal Vcc.

FIG. 2B is a truth table showing the logic of the foregoing logical gate. When both of the input signals XA and XB are logic 0, both of the pMOS transistors M3 and M4 are conductive. On the other hand, both of the nMOS transistors M1 and M2 are non-conductive. As a result, the output Y is logic 1. When at least either of the input signals XA and XB is logic 1, the pMOS transistor, to which logic 1 is supplied, is made to be non-conductive. On the other hand, the nMOS transistor, to which logic 1 is supplied, is made to be conductive. As a result, the output Y is made to be logic 0.

FIG. 3A shows a dual-input AND gate. The foregoing logical gate is composed of 6 elements consisting of four MOS transistors M1, M2, M3 and M4 forming a NAND gate, and a nMOS transistor M5 and a pMOS transistor M6 forming an inverter. Since the NAND gate consisting of the MOS transistors M1 to M4 has the same structure as that shown in FIG. 1A, an explanation of the operation of the NAND gate is omitted. The nMOS transistor M5 has a drain connected to output terminal /Y, a gate connected to output terminal Y of the NAND gate, a source and a substrate respectively connected to ground terminal Vss. The pMOS transistor M6 has a drain connected to the output terminal /Y, a source and a substrate respectively connected to the power supply terminal Vcc.

FIG. 3B is a truth table showing the logic of the foregoing logical gate. Since an inverted signal of the NAND gate is transmitted from the foregoing logical gate, output terminal /Y is made to be logic 1 when both of the input signals XA and XB are logic 1. When at least either of the input signals XA or XB is logic 0, logic 0 is transmitted.

FIG. 4A shows a dual-input OR gate. The foregoing logical gate is composed of 6 elements consisting of four MOS transistors M1, M2, M3 and M4 forming a NOR gate and a nMOS transistor M5 and a pMOS transistor M6 forming an inverter. Since the NOR gate consisting of the MOS transistors M1 to M4 is the same as that shown in FIG. 2A, an explanation of the operation of the NOR gate is omitted. The drain of the nMOS transistor M5 is connected to output terminal /Y, the gate of the same is connected to output terminal Y of the NOR gate, and the source and the substrate are connected to ground terminal Vss. The drain of the pMOS transistor M6 is connected to the output terminal /Y, the gate of the same is connected to the output terminal Y of the NOR gate, and the source and the substrate respectively are connected to the power supply terminal Vcc.

FIG. 4B is a truth table showing the logic of the foregoing logical gate. Since an inverted signal of the NOR gate is transmitted from the foregoing logical gate, the output terminal /Y is made to be logic 0 when both of the input signals XA and XB are logic 0. When at least either of the input signal XA or the input signal XB is logic 1, logic 1 is transmitted.

FIG. 5A shows a dual-input exclusive OR (EXOR) gate. The foregoing logical gate is composed of 10 devices consisting of five nMOS transistors M1, M3, M5, M7 and M9 and five pMOS transistors M2, M4, M6, M8 and M10. The drain of the nMOS transistor M1 is connected to node N1, the gate of the same is connected to input signal XA, the source and the substrate respectively are connected to ground terminal Vss. The drain of the pMOS transistor M2 is connected to node N1, the gate of the same is connected to the input signal XA, the source and the substrate respectively are connected to power supply terminal Vcc. Thus, a CMOS inverter is formed which is composed of the input signal XA and the output terminal N1. Similarly, the nMOS transistor M3 and the pMOS transistor M4 form a CMOS inverter having the input terminal N1 and the output terminal N2. The nMOS transistor M5 and the pMOS transistor M6 form a CMOS inverter having the input signal XB and the output terminal N3.

The nMOS transistor M7 and the pMOS transistor M8 are CMOS transmission gates having drains commonly connected to the node N1 and sources commonly connected to the output terminal Y. Specifically, the gate of the nMOS transistor M7 is connected to the input signal XB and the substrate of the same is connected to the ground terminal Vss. The gate of the pMOS transistor M8 is connected to the node N3 and the substrate of the same is connected to the power supply terminal Vcc. The nMOS transistor M9 and the pMOS transistor M10 are CMOS transmission gates having drains commonly connected to the node N2 and sources commonly connected to the output terminal Y. The gate of the nMOS transistor M9 is connected to the node N3 and the substrate of the same is connected to the ground terminal Vss. The gate of the pMOS transistor M10 is connected to the input signal XB and the substrate of the same is connected to the power supply terminal Vcc.

FIG. 5B is a truth table showing the logic of the foregoing logical gate. When both of the input signals XA and XB are logic 0, the node N1 is logic 1, the node N2 is logic 0 and the node N3 is logic 1. As a result, the transmission gate composed of the MOS transistors M9 and M10 are made to be conductive and the output terminal Y is brought to logic 0 similarly to the node N2. When the input signal XA is logic 0 and the input signal XB is logic 1, the node N1 is logic 1, the node N2 is logic 0 and the node N3 is logic 0. As a result, the transmission gate composed of the MOS transistors M7 and M8 are made to be conductive and the output terminal Y is made to be logic 1 similarly to the node N1. When the input signal XA is logic 1 and XB is logic 0, the node N1 is logic 0, the node N2 is logic 1 and the node N3 is logic 1. As a result, the transmission gate composed of the MOS transistors M9 and M10 are made to be conductive, and the terminal output terminal Y is made to be logic 1 similarly to the node N2. When both of the input signals XA and XB are logic 1, the node N1 is logic 0, the node N2 is logic 1 and the node N3 is logic 0. As a result, the transmission gate composed of the MOS transistors M7 and M8 is made to be conductive, and the output terminal Y is made to be logic 0 similarly to the node N1.

As described above, hitherto, each of the dual-input NAND gate and the NOR gate is composed of four transistors, each of the dual-input AND gate and OR-gate is composed of 6 transistors, and the dual-input EXOR gate is composed of 10 transistors. Therefore, when a large-scale logic circuit consisting of basic gates of the foregoing type is formed, MOS transistors by a number, which is several times the number of the basic gates, are required. Thus, the scale of the logic circuit is enlarged and the area required for the transistor to be disposed is increased, thus resulting in the size of the chip being enlarged unintentionally. If the number of the transistors is increased, the overall capacitance in the chip, which is the total of the gate capacitance, which is the intrinsic capacitance of the MOS transistor, and other parasitic capacitances, is increased. Thus, power consumption for charging and discharging the foregoing capacitances is enlarged.

The degree of integration of an LSI can be raised by fining the device. In a 1G bit DRAM, fine MOS transistors each having a gate length of about 0.15 µm are employed. In a case where the degree of integration is further raised, MOS transistors each having a gate length of 0.1 µm or shorter are employed.

Fine MOS transistors of the foregoing type encounter deterioration in the transistor characteristics due to generation of hot carriers and ruptures of insulating films due to TDDB (Time Dependent Dielectric Breakdown). If the density of impurities in a bulk (a substrate region) or a channel portion is raised to prevent depression of threshold voltage due to shortening of the length of the channel, the breakdown voltage of the source or drain junction deteriorates.

To maintain the reliability of the foregoing fine elements, it is effective to lower the supply voltage. Specifically, the horizontal electric field between the source and the drain is weakened so that generations of hot carriers are prevented. When the vertical electric field between the gate and the bulk is weakened, TDDB is prevented. By lowering the supply voltage, a reverse bias acting on the junction between the source and the bulk and between the drain and the bulk can be lowered. Thus, the deterioration of the breakdown voltage is compensated.

FIG. 6 shows a conventional buffer circuit comprising a three stage CMOS inverter which can be operated with low voltage level. Each of inverters 11, 12 and 13 is formed such that pMOS transistors and nMOS transistors are, in series, inserted between a power supply terminal (Vcc) and a ground terminal (Vss). The power supply terminal Vcc is connected to the substrate of each of the pMOS transistors Mp1, Mp2 and Mp3, while the ground terminal Vss or negative voltage is applied to the substrate of each of the nMOS transistors Mn1, Mn2 and Mn3.

To minimize the delay time in a buffer circuit of the foregoing type, it is preferable that the ratio (fan-out f) of the output capacitance and the input capacitance of each inverter is three. The input capacitance of the inverter 11 is the sum of the gate capacitances of Mp1 and Mn1, while the output capacitance of the same is the sum of the gate capacitances of Mp2 and Mn2. The gate capacitance of the MOS transistor is in proportion to the gate width when the gate length and the thickness of an oxide film are constant. Therefore, assuming that the gate widths of Mp1 and the Mn1 respectively are Wp1 and Wn1, the gate widths of Mp2 and Mn2 are made to be 3×Wp1 and 3×Wn1, respectively. Similarly, the gate widths of Mp3 and Mn3 are made to be 9×Wp1 and 9×Wn1, respectively.

The operation of the buffer circuit shown in FIG. 6 will now be described with reference to operation waveforms shown in FIGS. 7A and 7B. Referring to FIGS. 7A and 7B, symbols Iss1, Iss2 and Iss3 represent currents which flow from the corresponding sources of the Mn1, Mn2 and Mn3 to Vss. Symbols Iss represents the sum of Iss1 and Iss3. In a period of time from t0 to t1, input voltage Vin is high, voltage Vn1 of the node N1 and output voltage Vout are low, and the voltage Vn2 of the node N2 is high. At this time, Mn1, Mp2 and Mn3 are made to be conductive, while Mp1, Mn2 and Mp3 are made to be non-conductive. If the absolute values of the threshold voltages of Mp1, Mn2 and Mp3 are sufficiently high, the sub-threshold current is sufficiently small and Vn1 and Vout are made to be Vss and Vn2 is made to be Vcc.

If the level of Vcc has been made to be lowered due to the employed fine MOS transistors, the operating margin of the circuit must be obtained by making the absolute value of the threshold voltage to be smaller than that in a case where the supply voltage is not lowered. If Vcc is 0.5V, the absolute value of the threshold voltage must be lowered to about 0.1V to about 0.2V. If the threshold voltage is low as described above, the sub-threshold current is enlarged to be tens to hundreds of nA. Therefore, Iss1, Iss2 and Iss3 cannot be ignored, thus resulting in that Vn1 and Vout being undesirably made to be higher than Vss. Moreover, Vn2 is made to be lower than Vcc.

When transition of Vin from Vcc to Vss is performed in the period of time from t1 to t2, Mp1 is made to be conductive if Vin has been made to be lower than Vcc−Vtp1 (Vtp1: an absolute value of the threshold voltage of Mp1). Thus, Vn1 is raised. If Vn1 is made to be higher than Vtn2 (Vtn2: threshold voltage of Mn2), Mn2 is made to be conductive and Vn2 is lowered. If Vn2 is made to be lower than Vcc−Vtp3 (Vtp3: absolute value of threshold voltage of Mp3), Mp3 is made to be conductive and Vout is raised. At this time, transitions of Mn1, Mp2 and Mn3 to the non-conductive state are performed.

In a period of time from t2 to t3, Vin is lowered, Vn1 and Vout are raised and Vn2 is lowered. Therefore, Mn1, Mp2 and Mn3 are conductive. If the absolute values of the threshold voltages of Mn1, Mp2 and Mn3 are sufficiently high in the foregoing case, the sub-threshold current is sufficiently small. Thus, the potential Vout of the output is charged to be Vcc. Since the absolute value of the threshold voltage must be lowered if the voltage is low as described above, Vn1 and Vout are undesirably made to be lower than Vcc and Vn2 is raised to a level higher than Vss. Also the standby current is enlarged.

FIG. 8 shows an example of a conventional complementary logical gate corresponding to lowered voltage and comprising MOS transistors. Symbols M3 and M4 represent nMOS transistors having gates to which complementary signals IN and /IN are supplied. Their sources are commonly connected to Vss so that complementary signals OUT and /OUT are transmitted from their drains. A p-type region, which is a substrate, is applied with Vss or negative voltage. Symbols M1 and M2 represent pMOS transistors having gates cross-coupled to OUT and /OUT, the pMOS transistors M1 and M2 having sources commonly connected to Vcc and drains connected to OUT and /OUT. An n-type region, which is a substrate, is connected to Vcc.

The operation of the foregoing logical gate will now be described with timing charts shown in FIGS. 9A and 9B. Input signals IN and /IN are complementary signals having an amplitude between the supply voltage Vcc and the ground voltage Vss. Assumptions are made here that transition of IN from Vcc to Vss and that of /IN from Vss to Vcc have been performed (in a period of time from t1 to t2). Since M3 is turned off and M4 is turned on at this time, OUT is lowered from Vcc to Vss. As a result, M1 is turned on, thus resulting in /OUT being raised from Vss to Vcc so that M2 is turned off. Therefore, outputs OUT and /OUT are inverted complementarily. A similar operation is performed in a case where transition of IN from Vss to Vcc and that of /IN from Vcc to Vss in a period of time from t3 to t4 are performed.

When the logical gate is operated with the low voltage, the threshold voltage of the MOS transistor must be lowered. If the threshold voltage is high, a current for operating the MOS transistor is reduced. In the foregoing case, the switching speed will be lowered. If the supply voltage has been made to be lower than the threshold voltage, the MOS transistor cannot be operated.

If the threshold voltage is lowered, the cutoff characteristic, which is realized when the gate-source voltage has been made to be 0V, deteriorates. Specifically, the sub-threshold current of the MOS transistor is enlarged and the standby current is enlarged. FIG. 9C shows current Icc which flows from Vcc to Vss when a complementary gate is being operated. In a case where the threshold voltage of the MOS transistor is low and the sub-threshold current is large, current Isb unintentionally flows in a standby mode (in a period from time t0 to t1 and that from time t2 to t3) in which transitions of the input signal and the output signal are inhibited and the potential has been defined.

FIG. 10 shows an example of a conventional inverter, which is the simplest logical gate composed of nMOS transistors. The gate of a nMOS transistor M11 is connected to a power supply terminal (Vcc) and the bulk of the same is connected to power source E so that 0V or negative voltage is being applied to a ground terminal (Vss). Reference numeral M11 represents a depletion type nMOS transistor arranged such that threshold voltage Vt realized when voltage E is applied between the bulk and the source is 0V and Vt realized when the voltage of output OUT is V0 is VtL. Input signal IN is supplied to the gate of the nMOS transistor M12 and the bulk of the same is connected to the power source E.

The operation of the foregoing inverter will now be described with reference to timing charts shown in FIGS. 11A to 11C. When IN is Vcc in a period of time from t0 to t1, M12 is in a state where it is turned on. At this time, also M11 is in a state where it is turned on. In a case where M12 has the drive capability considerably superior to that of M11, output OUT is made to be substantially Vss so that standby current Isb' flows. When transition of IN from Vcc to Vss has been performed in a period of time from time t1 to t2, transition of M12 to a state where it is turned off is performed so that output OUT is charged to a high level. If the gate width of M11 is too small at this time, the load capacitance connected to the OUT cannot be changed at high speed. Therefore, the gate width is required to be enlarged to correspond to the load capacitance.

In a standby mode in period of time from time t2 to t3, IN is Vss so that M12 is in a state where it is turned off. If the threshold voltage Vt of M12 is sufficiently high, the leak current (sub-threshold current) in the turned off state is sufficiently small. Thus, OUT is charged to Vcc. If the supply voltage Vcc is lowered due to the employment of fine MOS transistors, the operating margin of the circuit must be obtained by making Vt to be lower than Vcc. If Vcc is 0.5V for example, Vth is required to be lowered to about 0.1V to about 0.2V. The low threshold voltage of the foregoing level causes the sub-threshold current to be enlarged to tens to hundreds of nA. In the foregoing case, the leak current in the turned off state cannot be ignored. As a result, OUT can be charged to an unsatisfactory low level of V0, that is, the level cannot be raised to Vcc. Moreover, standby current Isb flows unintentionally. In a period of time from time t3 to t4, transition of IN from Vss to Vcc is performed so that OUT is raised to substantially Vss.

In general, power consumption P of a logical gate is expressed by $P=CVcc^2 f$, where C is the sum of a parasitic capacitance and a intrinsic capacitance of the MOS transistor forming the logical gate, Vcc is the supply voltage and f is the operation frequency. Assuming that the operation frequency is constant, the power consumption can be reduced by reducing the capacitor C or by lowering the supply voltage Vcc. The capacitor C can effectively be reduced by decreasing the number of the MOS transistors forming the logical circuit or by reducing the gate width of the transistor. Since power consumption P is in proportion to the square of Vcc, the power consumption can further effectively be reduced by lowering Vcc.

Recently, a pass-transistor logic has attracted attention as a logical gate capable of realizing a complicated logic while necessitating a small number of devices and a simple structure. FIG. 12 shows a dual-input AND and NAND gates each of which is formed by the pass-transistor logic. In the foregoing logical gate, AND logic is formed by two nMOS transistors M1 and M2; and NAND logic is formed by two nMOS transistors M3 and M4 as a pass-transistor network. Moreover, signals Y and /Y appearing at the output nodes N1 and N2 of the pass-transistor network are amplified by a buffer circuit formed by pMOS transistors M5 and M7 and nMOS transistors M6 and M8. To maintain the high level of the output nodes N1 and N2, a latch circuit consisting of two pMOS transistors M9 and M10 is provided.

The source of the nMOS transistor M1 is connected to the node N1, the drain of the same receives signal XA and the gate of the same receives signal XB. The source of the nMOS transistor M2 is connected to the node N2, the drain of the same receives signal XB and the gate of the same receives complementary signal /XB of the signal XB. Definitions are performed that logic 0 is realized when the input and output signals are ground voltage Vss and logic 1 is realized when the same is supply voltage Vcc. When input signal XB is logic 1, nMOS transistor M1 is conductive and nMOS transistor M2 is non-conductive. As a result, the output node N1 has the same logic as that of the signal XA so that the output node N1 has logic 0 when the signal XA is logic 0. When the signal XA is logic 1, the node N1 has logic 1. When the input signal XB is logic 0, the nMOS transistor M1 is non-conductive and the nMOS transistor M2 is conductive. As a result, the output node N1 has the same logic 0 as that of the signal XB.

The source of the nMOS transistor M3 is connected to the node N2, the drain of the same receives the signal /XB and the gate of the same receives the signal /XB. The source of the nMOS transistor M4 is connected to the node N2, the drain of the same receives complementary signal /XA of the signal XA and the gate of the same receives the signal XB. When the input signal XB is logic 1, the nMOS transistor M3 is non-conductive and the nMOS transistor M4 is conductive. As a result, the output node N2 has logic opposite to that of the signal XA so that the output node N2 has logic 1 when XA is logic 0 and has logic 0 when XA is logic 1. If the input signal XB is logic 0, the nMOS transistor M3 is conductive and the nMOS transistor M4 is non-conductive. As a result, the output node N1 has logic 1 which is opposite to that of the signal XB.

Since the signals Y and /Y are input signals passed through the nMOS transistors M1 to M4, their drive compatibilities have deteriorated due to the resistances of the transistors. Assuming that the threshold voltages of the nMOS transistors M1 to M4 are Vt, the outputs each denoting logic 1 from the foregoing transistors are made to be lower than the supply voltage by Vt. Therefore, when the following pass-transistor network is operated in response to the signals Y and /Y, the drive compatibility of the output signal from the pass-transistor further deteriorates. As a result, the operation speed is undesirably lowered and an erroneous operation takes place. Accordingly, the signal Y is inverted and amplified by a CMOS inverter formed by the pMOS transistor M5 and the nMOS transistor M6, while the signal /Y is inverted and amplified by a CMOS inverter formed by the pMOS transistor M7 and the nMOS transistor M8. As a result, an AND output having drive compatibility can be obtained from the output OUT and a NAND output having drive compatibility can be obtained from the output /OUT.

Since the outputs denoting logic 1 from the nodes N1 and N2 are lower than the supply voltage by Vt, the drive compatibility of the nMOS transistor M6 or M7, each having the gate which receives the foregoing output, deteriorates or the cutoff characteristic of the pMOS transistor M5 or M7, each having the gate, which receives the foregoing output, deteriorates. As a result, desired drive compatibility cannot sometimes be obtained or the power consumption is enlarged considerably due to a short-circuit current. Accordingly, the latch circuit composed of a pMOS transistor M9, having a source connected to the supply voltage Vcc, a gate connected to the node N2 and a drain connected to the node N1 and a pMOS transistor M10, having a source connected to Vcc, a gate connected to the node N1 and the drain connected to the node N2, maintains the potentials of the portions of logic 1 of the nodes N1 and N2 at Vcc.

As described above, in the gate circuit composed of the conventional pass-transistor logic, a dual-input AND/NAND gate having drive compatibility is formed by the buffer circuit having four nMOS transistors and two CMOS inverters; and the latch circuit having two pMOS transistors.

To operate the logical gate while maintaining the reliability of the device and even if the supply voltage Vcc has been lowered to prevent electric power consumption, the threshold voltage of the MOS transistor is required to be lowered. If the threshold voltage is high, the drive compatibility of the MOS transistor deteriorates causing the operation speed to be lowered. If the supply voltage is made to be lower than the threshold voltage, the MOS transistor cannot be operated. However, if the threshold voltage is lowered, the cutoff characteristic of the nonconductive transistor deteriorates. Specifically, transistors having the gates, to each of which logic 0 has been supplied, cannot be made non-conductive. In the foregoing case, there is a risk that an erroneous operation of the circuit takes place.

If the wiring capacitance is ignored, the load capacitance of the node N1 is made to be the sum of the gate capacitance of the nMOS transistor M6, the gate capacitance of the pMOS transistor M5, the drain coupling capacitance of the pMOS transistor M9 and the gate capacitance of the pMOS transistor M10. On the other hand, the load capacitance of the node N2 is made to be the sum of the gate capacitance of the nMOS transistor M8, the gate capacitance of the pMOS transistor M7, the drain coupling capacitance of the pMOS transistor M10 and the gate capacitance of the pMOS transistor M9. Therefore, the nodes N1 and N2 are required to drive large capacitances. As a result, the nMOS transistors M1 to M4 forming the pass-transistor network and the pMOS transistors M9 and M10 forming the latch circuit must have gates each having a large width.

To operate the MOS transistors in a state where the supply voltage has been lowered, the threshold voltage is required to be lowered. If the threshold voltage is high, the drive compatibility of the MOS transistor deteriorates. As a result, the operation speed will be lowered. If the supply voltage is lower than the threshold voltage, the MOS transistor cannot be operated. However, if the threshold voltage is lowered, the cutoff characteristic of the MOS transistor deteriorates. Thus, it leads to a fact that an erroneous operation of the circuit takes place. Since a leak current is enlarged in the foregoing case, the power consumption is enlarged unintentionally.

Recently, an invention of a structure has been disclosed in which a body region of MOS transistors formed on a SOI (Silicon On Insulator) substrate is connected to a gate electrode to lower the threshold voltage when the MOS transistor is conductive and to raise the threshold voltage when the same is non-conductive. FIG. 13 shows a nMOS transistor M1 having the foregoing structure.

FIG. 14 shows a result of plotting of voltage $V_{BS}$ between the body and the source of the nMOS transistor M1, threshold voltage $V_{TN}$ of the same and current $I_{BS}$ between the body and the source with respect to voltage $V_{GS}$ between the gate of the same and the source. Since the gate and the body are connected to each other, $V_{BS}=V_{GS}$. Since the voltage of the body is raised when $V_{GS}$ has been raised, $V_{TN}$ is lowered. Since the body of the nMOS transistor is a p-type semiconductor and the source of the same is an n-type semiconductor, a pn junction is formed by the body and the source. If $V_{GS}$ has been raised to be higher than forward directional voltage $V_F$ (about 0.7V), forward directional current $I_{BS}$ flows. Therefore, in a case where a semiconductor integrated circuit device comprising a MOS transistor of a type having the foregoing structure is operated with supply voltage higher than $V_F$, current $I_{BS}$ flows into the source from the body as well as the current which flows from the drain if $V_{GS}$ is made to be higher than $V_F$. In a case where the foregoing semiconductor integrated circuit device is operated with supply voltage lower than $V_F$, $V_{GS}$ is sometimes made to be higher than $V_F$ due to noise generated in the circuit or external noise. Since current consumption is enlarged when $I_{BS}$ flows, the reduction of the power consumption cannot be realized as desired. Since a current, which is not required for the operation of the circuit, flows, an erroneous operation of the circuit takes place and noise is generated. Thus, the reliability of the circuit deteriorates.

If the voltage between the body and the source is forwards biased to a level higher than $V_F$, a parasitic bipolar transistor is operated, the emitter, the base and the collector of which are the drain, the body and the source, respectively. If the drain voltage is too high, the breakdown voltage of the nMOS transistor encounters deterioration because impact ionization is accelerated in the vicinity of the drain due to electrons injected from the source into the body.

As described above, the conventional logic circuit comprising the MOS transistors encounters the following problems:

(1) Transistors are required by a number which is several times the number of basic gates, thus resulting in the cost of the chip being enlarged when the area of the device is enlarged. Since the power consumption is enlarged as the capacitance in the chip is enlarged, the characteristic of the device deteriorates due to rise of the temperature, the cost of the chip is further enlarged due to employment of a section for performing heat radiation and uses are limited because large electric power is required.

(2) If the voltage is lowered to maintain the reliability of the device and if the threshold voltage is lowered to obtain a margin for the circuit to operate, the current, which flows in the standby mode, is enlarged. As a result, there arises a problem in that the reduction in the power consumption cannot easily be achieved. Another problem arises in that the cutoff characteristic of the MOS transistor deteriorates and thus the circuit erroneously operated.

(3) Since the conventional pass-transistor logic circuit comprises a CMOS inverter which serves as the buffer circuit, the output load of the pass-transistor network is enlarged, thus causing a necessity to arise in that the gate widths of the transistors forming the pass-transistor network and those forming the latch circuit are enlarged. As a result, there arise problems in that the enlargement of the area of the device results in the cost of the chip being enlarged and that the power consumption is enlarged due to enlargement of the capacitance.

(4) The nMOS transistor, in which the gate and the body are connected to each other, has a problem in that a large current flows into a portion between the body and the source if the gate-source voltage exceeds forward directional voltage $V_F$ of the pn junction between the body and the source and, therefore, the power consumption is enlarged excessively. The pMOS transistor, in which the gate and the body are connected to each other, has a problem in that a large current flows between the body and the source if the gate-source voltage is made to be smaller than $-V_F$ and, therefore, the power consumption is enlarged excessively. What is worse, the bipolar transistor consisting of the source, body and the drain is operated, the impact ionization is accelerated in the vicinity of the drain. Thus, there arises a problem in that the breakdown voltage deteriorates. The foregoing problem is critical for nMOS transistors.

SUMMARY OF THE INVENTION

An object of the present invention is to provide a novel and improved semiconductor integrated circuit device. Specifically, objects of the present invention are to provide the following devices:

(1) a semiconductor integrated circuit device capable of decreasing the number of transistors forming the basic gates, reducing the cost of the chip and reducing power consumption;

(2) a semiconductor integrated circuit device capable of maintaining a margin for the operation of the circuit even if the supply voltage has been lowered and capable of reducing a standby current to be further adaptable to a high speed operation;

(3) a semiconductor integrated circuit device capable of lowering the voltage while having a sufficiently large operation margin without a necessity of lowering the threshold voltage and reducing an output load of a pass-transistor network without deterioration of drive compatibility; and (4) a semiconductor integrated circuit device capable of preventing flowing an electric body-source current even if the gate-source voltage has exceeded $V_F$ in a case of a nMOS transistor and even if the gate-source voltage has been made to be lower than $V_F$ in a case of a pMOS transistor.

In order to achieve the foregoing objects, according to the present invention, the present invention employs the following structures:

According to a first aspect of the present invention, there is provided a semiconductor integrated circuit device for forming a logic circuit comprising: a semiconductor substrate; and a MOS transistor formed on the semiconductor substrate and having a first gate, wherein a first signal supplied to the first gate and a second signal supplied to a substrate region corresponding to the semiconductor substrate are combined with each other so that one logical signal is transmitted (see FIGS. 15A and 15B). It is preferably the substrate formed on an insulator.

The semiconductor integrated circuit device according to the first aspect of the present invention has the structure such that the potential of the substrate is changed in accordance with the logic of the input signal so that the threshold voltage of the MOS transistor is changed. Although one input signal can be supplied to one MOS transistor, the present invention enables two different input signals can be supplied. As a result, combinations of the logic of the input signal to be supplied to the MOS transistor and the logic of the input signal for controlling the potential of the substrate enables control whether the MOS transistor is made to be conductive or non-conductive. Thus, a variety of logic circuits can be formed with a small number of transistors.

A semiconductor integrated circuit device according to the first aspect of the present invention further comprises a second gate formed in the lower portion of the semiconductor substrate, wherein the first gate of the MOS transistor is formed in the upper portion of the semiconductor substrate and the second signal is supplied to the second gate. A semiconductor integrated circuit device further comprises a second gate formed in the side portion of the semiconductor substrate, wherein the first gate of the MOS transistor is formed in the upper portion of the semiconductor substrate and the second signal is supplied to the second gate.

In place of applying the potential corresponding to the input signal to the substrate region, a second gate is formed in the lower portion or the side portion of the semiconductor substrate individually from the first gate. By applying the potential corresponding to the input signal to the second gate, the threshold voltage of the MOS transistor is changed. Therefore, also the foregoing structure enables a variety of logic circuits to be formed while requiring a small number of transistors.

It is preferable that silicon be employed to form the semiconductor substrate on the insulating film. More preferably, a SOI (Silicon On Insulation) substrate is employed. By using the foregoing MOS transistor, the following structures can be formed, wherein the MOS transistor and at least one of a resistance element and the MOS transistor are connected to each other so that a logic circuit is formed and the logic circuit is at least any one of OR, NOR, AND, NAND, EXOR and EXNOR circuits.

Specifically, use of the foregoing MOS transistor enables the following logical gates to be formed:

(1) By connecting a nMOS transistor and a resistance element (the resistance element is disposed adjacent to the power source) in series, a dual-input NOR gate or a dual-input NAND gate is formed (see FIG. 18);

(2) By connecting a pMOS transistor and a resistance element in series (the resistance element is disposed adjacent to the ground), a dual-input NOR gate or a dual-input NAND gate is formed (see FIG. 22);

(3) By connecting a pMOS transistor and a nMOS transistor in series, a dual-input NOR gate or a dual-input NAND gate is formed (see FIG. 23);

(4) By connecting a nMOS transistor and a resistance element in series (the resistance element is disposed adjacent to the ground), a dual-input OR gate or a dual-input AND gate is formed (see FIG. 24):

(5) By connecting a pMOS transistor and resistance element in series (the resistance element is disposed adjacent to the power source), a dual-input OR gate or a dual-input AND gate is formed (see FIG. 25);

(6) By connecting a pMOS transistor and a nMOS transistor in series, a dual-input OR gate or a dual-input AND gate is formed (see FIG. 26);

(7) By connecting two nMOS transistors and a resistance element in series (the resistance element is disposed adjacent to the power source), 4-input NAND gate is formed (see FIG. 28A);

(8) By, in series, connecting a resistance element to two pMOS transistors connected in parallel (the resistance element is disposed adjacent to the ground), a 4-input NAND gate is formed (see FIG. 28B);

(9) By, in series, connecting two nMOS transistors connected in series to two pMOS transistors connected in parallel, a 4-input NAND gate is formed (see FIG. 28C);

(10) By, in series, connecting a resistance element to two nMOS transistors connected in parallel (the resistance element is disposed adjacent to the power source), a 4-input NOR gate is formed (see FIG. 29A);

(11) By connecting two pMOS transistors and a resistance element (the resistance element is disposed adjacent to the ground), a 4-input NOR gate is formed (see FIG. 29B);

(12) By, in series connecting two nMOS transistor connected in parallel to two pMOS transistors connected in series, a 4-input NOR gate is formed (see FIG. 29C);

(13) By connecting two nMOS transistors and a resistance element in series (the resistance element is disposed adjacent to the ground), a 4-input AND gate is formed (see FIG. 30A);

(14) By, in series, connecting a resistance element to two pMOS transistors connected in parallel (the resistance element is disposed adjacent to the power source), a 4-input AND gate is formed (see FIG. 30B);

(15) By, in series, connecting two nMOS transistors connected in series to two pMOS transistors connected in parallel, a 4-input AND gate is formed (see FIG. 30C):

(16) By, in series, connecting a resistance element to two nMOS transistors connected in parallel (the resistance element is disposed adjacent to the ground), a 4-input OR gate is formed (see FIG. 31A);

(17) By connecting two pMOS transistors and a resistance in series (the resistance element is disposed adjacent to the power source), a 4-input OR gate is formed (see FIG. 31B);

(18) By, in series, connecting two nMOS transistors connected in parallel and two pMOS transistors connected in series, a 4-input OR gate is formed (FIG. 31C);

(19) By connecting two nMOS transistors and a resistance element in series (the resistance element is disposed adjacent to the power source), 2-rail 2-input EXNOR gate is formed (see FIG. 32A);

(20) By connecting four nMOS transistors in series, a 2-rail 2-input EXNOR gate is formed (see FIG. 32B);

(21) By connecting two nMOS transistors and two pMOS transistors in series, a 2-rail 2-input EXNOR gate is formed (see FIG. 32C);

(22) By, in series, connecting a resistance element to two nMOS transistors connected in parallel (the resistance element is disposed adjacent to the power source), a 2-rail 2-input EXNOR gate is formed (see FIG. 32D);

(23) By using two sets of two nMOS transistors connected in series to commonly connecting respective connection points, a 2-rail 2-input EXNOR gate is formed (see FIG. 32E);

(24) By using two sets of a nMOS transistor and a pMOS transistor connected in series to commonly connect respective connection points, a 2-rail 2-input EXNOR gate is formed (see FIG. 32F);

(25) By connecting two nMOS transistors and a resistance element (the resistance element is disposed adjacent to the ground), a 2-rail 2-input EXOR gate is formed (see FIG. 34A);

(26) By connecting a resistance element to two nMOS transistors connected in parallel (the resistance element is disposed adjacent to the ground), a 2-rail 2-input EXOR gate is formed (see FIG. 34B);

(27) By connecting a resistance element to two nMOS transistors (the resistance element is disposed adjacent to the power source), and by connecting a NOR gate to a gate (a first gate) to which respective transistors are commonly connected, a 2-rail 2-input EXOR gate is formed (see FIG. 34C); and

(28) By connecting a resistance element to two nMOS transistors (the resistance element is disposed adjacent to the power source) and by connecting a NOR gate to a substrate region (a second gate) to which respective transistors are commonly connected, a 2-rail 2-input EXOR gate is formed (see FIG. 34D).

According to the first aspect of the present invention, the basic gate having one function can be formed by using a small number of devices. Therefore, a logic circuit having many functions can be formed in the same area of the chip. Since a logic circuit can be formed in a small chip area, the cost of the chip can significantly be reduced and the power consumption can considerably be reduced. Thus, a semiconductor integrated circuit device exhibiting excellent performance and low power consumption can be realized.

An essential portion of a semiconductor integrated circuit device according to a second aspect of the present invention is to form a MOS transistor on a SOI (Silicon On Insulator) substrate to change the substrate potential of each MOS transistor to be adaptable to the state of operation. Moreover, the present invention is characterized in that the substrate potential of a MOS transistor forming a pass-transistor logic circuit is controlled by an input signal supplied to the gate to amplify the same by a 2-rail input buffer circuit which receives the output from the pass-transistor logic circuit by only a nMOS transistor and latches the same by a pMOS transistor. As a result, the MOS transistor is formed on a SOI substrate or the like so that the bulk (the substrate region) of the transistor is separated for each transistor. By applying a potential corresponding to the state of operation to each bulk, the threshold current of the transistor can be controlled.

A semiconductor integrated circuit device according to a second aspect of the present invention, comprises a circuit array in which at least three inverter circuits are connected and which consists of n circuits (n≧3); a pMOS transistor and a nMOS transistor in which the inverter circuits are formed on a semiconductor substrate, gates of which are commonly connected and which are, in series, connected between a power source and ground, wherein an input terminal of a k−2m (m=1, 2, . . . , where 2m=k−1)th inverter circuit in the circuit array is connected to a substrate region corresponding to the semiconductor substrate of the pMOS transistor and the nMOS transistor forming a k (k≧3) th inverter circuit in the circuit array.

The first semiconductor integrated circuit device according to the second aspect of the present invention enables the threshold voltage to be previously lowered to improve the drive capability when the MOS transistor in a k-th inverter circuit is made to be conductive. Therefore, the circuit is able to operate at high speed. Since the threshold voltage can be raised when cutting off is performed, the standby current can be reduced. Thus, even if the supply voltage is lowered, a total amplitude operation can be performed. As a result, a high speed and low current consumption circuit can be realized while maintaining the reliability of a very small device having a gate, the length of which is 0.1 μm or shorter. It is preferably the substrate formed on an insulator.

A semiconductor integrated circuit device according to the second aspect of the present invention comprises: a semiconductor substrate; a first pMOS transistor having a source connected to a power supply terminal, a gate connected to a first output node, a drain connected to a second output node and a first substrate region corresponding to the semiconductor substrate for receiving a first signal; a second pMOS transistor having a source connected to the power supply terminal, a gate connected to a second output node, a drain connected to a first output node and a second substrate region corresponding to the semiconductor substrate for receiving a second signal, which is a complementary signal of the first signal; a first nMOS transistor having a source connected to a ground terminal, a drain connected to a second output node and a gate and a third substrate region corresponding to the semiconductor substrate for receiving a first signal; and a second nMOS transistor having a source connected to the ground terminal, a drain connected to a first output node and a gate and a fourth substrate region corresponding to the semiconductor substrate for receiving a second signal. A semiconductor integrated circuit device comprises: a semiconductor substrate; a first pMOS transistor having a source connected to a power supply terminal, a gate and a substrate region corresponding to the semiconductor substrate, which are connected to a first output node, and a drain connected to a second output node; a second pMOS transistor having a source connected to the power supply terminal and a gate and a substrate region corresponding to the semiconductor substrate, which are connected to a second output node, and a drain connected to a first output node; a first input circuit connected between the first output node and a ground terminal for receiving one or a plurality of signals; and a second input circuit connected between the second output node and the ground terminal for receiving a complementary signal of the input signal of the first input circuit.

A second semiconductor integrated circuit device according to the second aspect of the present invention has the structure such that the threshold voltage is lowered when the MOS transistor is turned on in the complementary logical gate so that the drive capability is improved. Since the threshold voltage is raised when cutting off is performed, an effect can be obtained in that the standby current can be reduced. Therefore, the supply voltage can be lowered to a level lower than the absolute value of the threshold voltage when cutting off is performed. Thus, a high speed and low current consumption circuit can be realized while maintaining the reliability of a very small device having a gate, the length of which is 0.1 μm or shorter.

A third semiconductor integrated circuit device according to the second aspect of the present invention comprises: a semiconductor substrate; a first nMOS transistor having a drain and a gate connected to a power supply terminal, a source and a substrate region corresponding to the semiconductor substrate which are connected to a first node; a second nMOS transistor having a drain and a gate connected to the power supply terminal, a source connected to a second node and a substrate region corresponding to the semiconductor substrate and connected to the first node; a first input circuit connected between the first node and a ground terminal for receiving one or a plurality of signals; and a second input circuit connected between the second node and the ground terminal for receiving one or a plurality of signals. A semiconductor integrated circuit device comprises: a semiconductor substrate; a first nMOS transistor having a drain and a gate connected to a power supply terminal, a source connected to a first node and a substrate region corresponding to the semiconductor substrate and connected to a second node; a second nMOS transistor having a drain and a gate connected to the power supply terminal, a source connected to the second node and a substrate region corresponding to the semiconductor substrate and connected to the first node; a first input circuit connected between the first node and a ground terminal for receiving one or a plurality of signals; and a second input circuit connected between the second node and the ground terminal for receiving one or a plurality of signals. A semiconductor integrated circuit device comprises: a resistance element connected between a power supply terminal and a first node; a nMOS transistor having a drain and a gate connected to the power supply terminal, a source connected to a second node and a substrate region corresponding to the semiconductor substrate and connected to the first node; a first input circuit connected between the first node and a ground terminal for receiving one or a plurality of signals; and a second input circuit connected between the second node and the ground terminal for receiving one or a plurality of signals.

The third semiconductor integrated circuit device according to the second aspect of the present invention is able to lower the threshold voltage of the MOS transistor to be charged when the output load capacitance is charged. Thus, a high speed operation can be performed. Since the threshold voltage of the MOS transistor to be discharged can be raised at this time, the standby current can be reduced. When the output load capacitance is discharged, the threshold voltage of the MOS transistor to be discharged can be lowered. Thus, a high speed operation can be performed. Since the threshold voltage of the MOS transistor to be charged can be raised, the standby current can be reduced.

A fourth semiconductor integrated circuit device according to the second aspect of the present invention and forming a pass-transistor logic circuit comprises: a pass-transistor network including at least one MOS transistor having a gate and a substrate region corresponding to a semiconductor substrate which receive a first signal and a drain which receives a second signal, the logic circuit being arranged to transmit a third signal and a fourth signal which is a complementary signal of the third signal; a first pMOS transistor having a source connected to a power supply terminal, a gate connected to a first output node, a drain connected to a second output node and a substrate region corresponding to the semiconductor substrate for receiving the third signal; a second pMOS transistor having a source connected to the power supply terminal, a gate connected to the second node, a drain connected to the first output node and a substrate region corresponding to the semiconductor substrate for receiving the fourth signal; a first nMOS transistor having a source connected to a ground terminal, a drain connected to the second output node and a gate and a substrate region corresponding to the semiconductor substrate for receiving the third signal; and a second nMOS transistor having a source connected to the ground terminal, a drain connected to the first output node, and a gate and a substrate region corresponding to the semiconductor substrate for receiving the fourth signal.

The fourth semiconductor integrated circuit device according to the second aspect of the present invention has the structure such that the substrate potential of the MOS transistor forming the pass-transistor network is controlled in response to an input signal to be supplied to the gate. Therefore, the threshold voltage of the conductive transistor is lowered and that of the non-conductive transistor is raised. Moreover, the output from the pass-transistor network is amplified by the 2-rail input buffer circuit which receives it by only the nMOS transistor and latches the same by the pMOS transistor. Thus, the output capacitance of the pass-transistor network can be reduced.

As described above, according to the second aspect of the present invention, the MOS transistor is formed on, for example, a SOI substrate and the substrate potential of each MOS transistor is changed to be adaptable to the state of operation. Therefore, a semiconductor integrated circuit device can be realized which is able to maintain the circuit operation margin even if the supply voltage is lowered, in which the standby current can be reduced and which is further suitable to a high speed operation.

According to the second aspect of the present invention, a pass-transistor logic circuit can be realized, the threshold voltage of which is not lowered even if the voltage is lowered and which is able to maintain a sufficiently large operation margin. Moreover, since the input capacitance of the buffer circuit can be reduced, the load capacitance of the pass transistor network can be reduced. As a result, the gate width of the transistor forming the pass-transistor logic circuit can be reduced, thus causing the device area to be reduced.

Preferred structures according to the second aspect of the present invention are as follows:

(1) A first delay circuit connected to the gate of the first nMOS transistor to receive the first signal so as to transmit a third signal to the gate of the first nMOS transistor, and a second delay circuit connected to the gate of the second nMOS transistor to receive the second signal so as to transmit a fourth signal to the gate of the second nMOS transistor are further comprised;

(2) The nMOS transistor and the pMOS transistor are formed on the semiconductor substrate formed on an insulating film;

(3) The semiconductor substrates having the nMOS transistor and the pMOS transistor formed thereon are electrically separated from each other;

(4) The first and second input circuits are formed by one nMOS transistor or a plurality of nMOS transistors connected in parallel in such a manner that the substrate region corresponding to the semiconductor substrate is connected to the gate of the one or more nMOS transistors;

(5) The first and second input circuits are formed by one nMOS transistor or a plurality of nMOS transistor connected in parallel in such a manner that a delay circuit is formed between the gate of the one or more nMOS transistors and the substrate region corresponding to the semiconductor substrate;

(6) The substrate regions corresponding to the semiconductor substrate having the MOS transistors of the first and second input circuits are electrically separated from each other;

(7) The first and second input circuits are formed by one nMOS transistor or a plurality of nMOS transistors connected in series in which the substrate region corresponding to the semiconductor substrate is connected to a gate;

(8) The first and second input circuits are formed by one nMOS transistor or a plurality of nMOS transistors connected in series in which a delay circuit is connected between a gate and a substrate region corresponding to the semiconductor substrate;

(9) The first and second input circuits are formed by one nMOS transistor or a plurality of nMOS transistors connected in series in which a substrate region corresponding to the semiconductor substrate is connected to a gate;

(10) The first and second input circuits are formed by one nMOS transistor or a plurality of nMOS transistors connected in series in which a delay circuit is connected between a gate and a substrate region corresponding to the semiconductor substrate;

(11) Each of the MOS transistors is formed on a silicon substrate on an insulating film; and

(12) A third pMOS transistor having a source connected to the power supply terminal, a gate and a substrate region corresponding to the semiconductor substrate, which are connected to the second output node, and a drain for receiving the third signal; and a fourth pMOS transistor having a source connected to the power supply terminal, a gate and a substrate region corresponding to the semiconductor substrate, which are connected to the first output node, and a drain for receiving the fourth signal are further comprised.

The essential portion of a third aspect of the present invention lies in that the MOS transistor is formed on a SOI substrate or the like, the logic circuit is formed by a pass-transistor logic circuit and a 2-rail input buffer circuit, a limiter device for preventing the body potential not to exceed a predetermined potential which is lower than a forward potential of a pn junction is disposed between the gate and the body of the MOS transistor forming the pass-transistor network, an output signal from the pass-transistor network is supplied to the gate of a first-conductive-type MOS transistors forming the buffer circuit, a limiter device for preventing the body voltage not to exceed a predetermined potential which is lower than the forward voltage of the pn junction is disposed between the gate and the body, respective gates of second-conductive type MOS transistors forming the buffer circuit are cross-connected to the 2-rail output of the buffer circuit, and a limiter device is disposed between the respective bodies and the input signal of the buffer circuit to prevent the body potential not to exceed a predetermined potential which is lower than the forward voltage of the pn junction. Specifically, there is provided a semiconductor integrated circuit device comprising: a pass-transistor network including at least one MOS transistor having a gate for receiving a first signal, a drain for receiving a second signal and 2n (n is a natural number) inputs for outputting a third signal and a fourth signal which is a complementary signal of the third signal; a first limiter device for receiving the third signal to transmit a fifth signal; a first pMOS transistor having a source connected to a power source, a gate connected to a first output node and a substrate region corresponding to the semiconductor substrate for receiving the fifth signal; a second limiter device for receiving the fourth signal to transmit a sixth signal; a second pMOS transistor having a source connected to the power supply terminal, a gate connected to the second output node, a drain connected to the first output node and a substrate region corresponding to the semiconductor substrate for receiving the sixth signal; a third limiter device for receiving the third signal to transmit a seventh signal; a first nMOS transistor having a source connected to a ground terminal, a drain connected to the second output node, a gate for receiving the third signal, and a substrate region corresponding to the semiconductor substrate for receiving the seventh signal; a fourth limiter device for receiving the fourth signal to transmit an eighth signal; and a second nMOS transistor having a source connected to the ground terminal, a drain connected to the first output node, a gate for receiving the fourth signal and a substrate region corresponding to the semiconductor substrate for receiving the eighth signal. There is provided a semiconductor integrated circuit device comprising: a pass-transistor network including at least one MOS transistor having a gate for receiving a first signal, a drain for receiving a second signal and 2n (n is a natural number) inputs for outputting a third signal and a fourth signal which is a complementary signal of the third signal; a first limiter device for receiving the third signal to transmit a fifth signal; a first nMOS transistor having a source connected to a power source, a gate connected to a first output node and a substrate region corresponding to the semiconductor substrate for receiving the fifth signal; a second limiter device for receiving the fourth signal to transmit a sixth signal; a second nMOS transistor having a source connected to the power supply terminal, a gate connected to the second output node, a drain connected to the first output node and a substrate region corresponding to the semiconductor substrate for receiving the sixth signal; a third limiter device for receiving the third signal to transmit a seventh signal; a first pMOS transistor having a source connected to a ground terminal, a drain connected to the second output node, a gate for receiving the third signal, and a substrate region corresponding to the semiconductor substrate for receiving the seventh signal; a fourth limiter device for receiving the fourth signal to transmit an eighth signal; and a second pMOS transistor having a source connected to the ground terminal, a drain connected to the first output node, a gate for receiving the fourth signal and a substrate region corresponding to the semiconductor substrate for receiving the eighth signal.

Preferred aspects of the present invention are as follows:

(1) The first and second limiter devices are diodes arranged such that output voltage with respect to input voltage is set to a first predetermined voltage higher than the potential of the ground terminal and lower than the potential of the power supply terminal;

(2) The first and second limiter devices are pMOS transistors each having a source for receiving the input voltage, a drain for transmitting the output voltage and a gate to which voltage is applied which is lower than voltage obtained by adding first built in voltage between the source and the substrate region corresponding to the semiconductor substrate to a threshold voltage;

(3) Output voltage of each of the third and fourth limiter devices with respect to input voltage is set to a second predetermined potential which is higher than the potential of the ground terminal and lower than the potential of the power supply terminal; and (4) The third and fourth limiter devices are nMOS transistors each having a source for receiving the input voltage, a drain for transmitting the output voltage, and a gate to which voltage is applied which is higher than voltage obtained by adding second built in voltage between the source and the substrate region corresponding to the semiconductor substrate to threshold voltage.

According to the third aspect of the present invention, the MOS transistor is formed on the SOI substrate or the like so that the body regions of the transistors are separated for the respective transistors. Moreover, the body potential of the MOS transistor forming the pass-transistor logic circuit is controlled by a signal not to exceed a forward voltage. The body potential of the MOS transistor forming the buffer circuit is controlled by a signal not to exceed the forward voltage of the pn junction.

That is, according to the third aspect of the present invention, even if the device is operated with the supply voltage higher than $V_F$, the power consumption is not enlarged and erroneous operation and noise can be prevented. Since operation of a bipolar transistor formed by the source, the body and the drain can be prevented, impact ionization in the vicinity of the drain can be prevented. Thus, deterioration in the breakdown voltage can be prevented. Since the input capacitance of the buffer circuit can be prevented, the load capacitance of the network of the pass-transistor can be reduced. As a result, the gate width of the transistor forming the pass-transistor logic circuit can be reduced. Thus, the device area can be reduced.

The essential portion of the semiconductor integrated circuit device according to a fourth aspect of the present invention lies in that a capacitor is disposed between a gate and a body of the MOS transistor and a limiter circuit is disposed to prevent the potential difference between the body and the gate voltage not to exceed a predetermined potential which is lower than $V_F$ in the case of the nMOS transistor. Specifically, there is provided a semiconductor integrated circuit device comprising: a first MOS transistor having a gate, a source, a drain and a substrate region corresponding to a semiconductor substrate; a capacitor connected between the gate and the substrate region corresponding to the semiconductor substrate; and a limiter circuit for maintaining the potential of the substrate region corresponding to the semiconductor substrate at a level lower than a predetermined voltage level lower than forward voltage at a pn junction between the substrate region corresponding to the semiconductor substrate and the source. Preferred structures are as follows.

(1) The limiter circuit is formed by a second MOS transistor which is different from the first MOS transistor which has a source connected to the substrate region corresponding to the semiconductor substrate, a gate which is applied with first voltage and a drain which is applied with second voltage.

(2) The first MOS transistor and the capacitor are formed in one element region.

(3) The first MOS transistor and the second MOS transistor are formed in one element region.

The semiconductor integrated circuit device according to the fourth aspect of the present invention has the structure such that the gate and the body of the MOS transistor is separated as a DC manner.

The semiconductor integrated circuit device according to the fourth aspect of the present invention has the structure such that the limiter circuit provided for the body makes the potential of the body of the nMOS transistor to be lower than a predetermined potential in the case of the nMOS transistor and makes the same to be higher than a predetermined potential in the case of the pMOS transistor.

As described above, according to the fourth aspect of the present invention, the conventional characteristic obtainable from the structure in which the gate and the body are directly connected to each other is used. Moreover, even if the gate-source voltage of the nMOS transistor exceeds $V_F$, even if the gate-source voltage of the pMOS transistor is made to be lower than $-V_F$, no current flows into the pn junction composed of the body and the source. The circuit is able to operate normally even if the supply voltage is higher than $V_F$. Even if the supply voltage is lower than $V_F$, the circuit cannot easily be affected by change in the supply voltage and noise. Since the bipolar transistor composed of the source, the body and the drain does not operate, impact ionization in the vicinity of the drain can be prevented. Therefore, deterioration in the breakdown voltage can be prevented.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A and 1B respectively show a conventional dual-input NAND gate and a truth table;

FIGS. 2A and 2B respectively show a conventional dual-input NOR gate and a truth table;

FIGS. 15A and 15B respectively are a plan view and a cross sectional view showing a MOS transistor according to a first embodiment of the present invention;

FIGS. 16A and 16B respectively are a plan view and a cross sectional view showing the MOS transistor according to a second embodiment of the present invention;

FIGS. 19A to 19G are diagrams showing a variety of resistance elements according to the fourth embodiment of the present invention;

FIG. 20 is a graph showing the relationship between the gate-source voltage of the nMOS transistor and the drain current;

FIG. 21 shows a truth table for a dual-input NAND gate and a dual-input NOR gate;

FIG. 22 is a circuit diagram showing a dual-input logical gate (NOR and NAND) according to a fifth embodiment of the present invention;

FIG. 23 is a circuit diagram showing a dual-input logical gate (NOR and NAND) according to the fifth embodiment of the present invention;

FIG. 24 is a circuit diagram showing a dual-input logical gate (OR and AND) according to a sixth embodiment of the present invention;

FIG. 25 is a circuit diagram showing a dual-input logical gate (OR and AND) according to the sixth embodiment of the present invention;

FIG. 26 is a circuit diagram showing a dual-input logical gate (OR and AND) according to the sixth embodiment of the present invention;

FIG. 27 is a truth table for the dual-input AND gate and the dual-input OR gate;

FIGS. 28A to 28C are circuit diagrams showing a 4-input NAND gate according to a seventh embodiment of the present invention;

FIGS. 29A to 29C are circuit diagrams showing a 4-input NOR gate according to an eighth embodiment of the present invention;

FIGS. 30A to 30C are circuit diagrams showing a 4-input AND gate according to a ninth embodiment of the present invention;

FIGS. 31A to 31C are circuit diagrams showing a 4-input OR gate according to a tenth embodiment of the present invention;

FIGS. 32A to 32F are circuit diagrams showing a 2-rail 2-input EXNOR gate according to an eleventh embodiment of the present invention;

FIG. 33 is a truth table for a dual-input EXNOR gate;

FIGS. 34A to 34D are circuit diagrams showing a 2-rail 2-input EXOR gate according to a twelfth embodiment of the present invention;

FIG. 35 is a circuit diagram showing a buffer circuit according to a thirteenth embodiment of the present invention;

FIG. 37 is a circuit diagram showing a buffer circuit according to a fourteenth embodiment of the present invention;

FIGS. 40A and 40B are circuit diagrams showing a buffer circuit according to a sixteenth embodiment of the present invention;

FIG. 41 is circuit diagram showing a complementary type logical gate according to a seventeenth embodiment of the present invention;

FIGS. 42A to 42C are operation waveform graphs for explaining the operation of the circuit shown in FIG. 41;

FIG. 43 is a circuit diagram showing a modification of the seventeenth embodiment;

FIG. 44 is a circuit diagram showing a n-input complementary type gate according to an eighteenth embodiment of the present invention;

FIGS. 45A to 45C are circuit diagrams showing an input circuit;

FIG. 48 is a circuit diagram showing a twentieth embodiment of the present invention;

FIG. 49 is a circuit diagram showing a twenty-first embodiment of the present invention;

FIGS. 50A to 50C are circuit diagrams showing modifications of the input circuit according to the eighteenth embodiment to the twenty-first embodiment shown in FIGS. 45A to 45C;

FIG. 51 is a circuit diagram showing a pass-transistor logic circuit and a buffer circuit according to a twenty-second embodiment of the present invention;

FIG. 52 is a circuit diagram showing a dual-input AND employing the pass-transistor logic;

FIG. 53 is a circuit diagram showing a dual-input NAND employing the pass-transistor logic;

FIG. 54 is a circuit diagram showing a dual-input OR employing the pass-transistor logic;

FIG. 55 is a circuit diagram showing a dual-input NOR employing the pass-transistor logic;

FIG. 56 is a circuit diagram showing a dual-input EXOR employing the pass-transistor logic;

FIG. 57 is a circuit diagram showing a dual-input EXNOR employing the pass-transistor logic;

FIG. 58 is a circuit diagram showing a 3-input AND employing the pass-transistor logic;

FIG. 59 is a circuit diagram showing a 3-input NAND employing the pass-transistor logic;

FIG. 60 is a circuit diagram showing a 3-input OR employing the pass-transistor logic;

FIG. 61 is a circuit diagram showing a 3-input NOR employing the pass-transistor logic;

FIG. 62 is a circuit diagram showing a 3-input EXOR/EXNOR employing the pass-transistor logic;

FIGS. 63A and 63B are circuit diagrams showing a carrier signal generating circuit for a full adder formed by the pass-transistor logic;

FIG. 64 is a circuit diagram showing another example of the dual-input AND;

FIG. 65 is a circuit diagram showing another example of the dual-input NAND;

FIG. 66 is a circuit diagram showing another example of the dual-input OR;

FIG. 67 is a circuit diagram showing another example of the dual-input NOR;

FIG. 71 is a circuit diagram showing another example of the carry signal generating circuit for the full adder;

FIGS. 72A and 72B are circuit diagrams showing a pass-transistor logic circuit and a buffer circuit according to a twenty-third embodiment of the present invention;

FIG. 73 is a diagram showing modification of a pass-transistor logic circuit and a buffer circuit according to the twenty-second embodiment of the present invention;

FIGS. 79A to 79F are cross sectional views showing the limiter devices shown in FIGS. 78A to 78D;

FIGS. 84 to 87 are diagrams showing other examples of the pass-transistor logic circuit and the buffer circuit;

FIG. 91 is a graph showing the DC characteristic of the voltage between the body and the source, the threshold voltage and the body-source current with respect to the gate-source voltage;

FIG. 92 is a diagram showing an inverter using the nMOS transistors and pMOS transistors according to the present invention; and FIGS. 93A to 93C are graphs showing transient waveforms of the input voltage, output voltage, body voltage and the threshold voltage of the inverter shown in FIG. 92.

DETAILED DESCRIPTION OF THE PREFERRED EMBODIMENTS

Figures 3A, 3B:
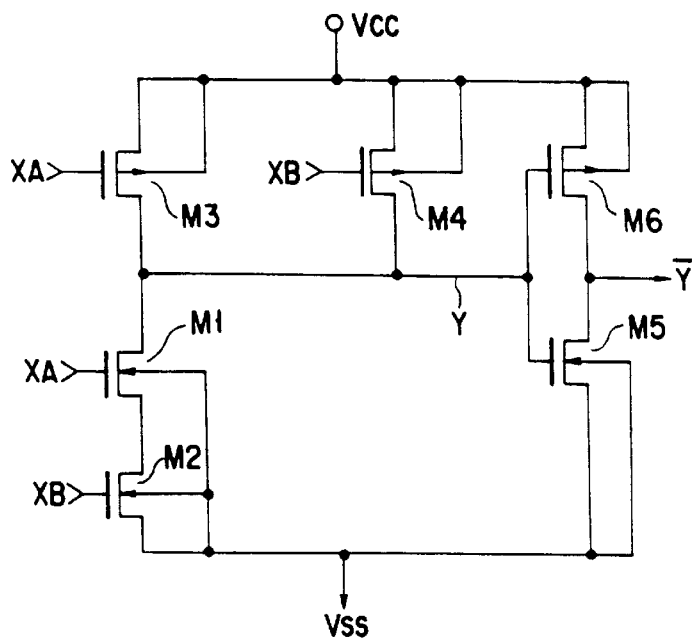
FIGS. 3A and 3B respectively show a conventional dual-input AND gate and a truth table.
Figures 4A, 4B:
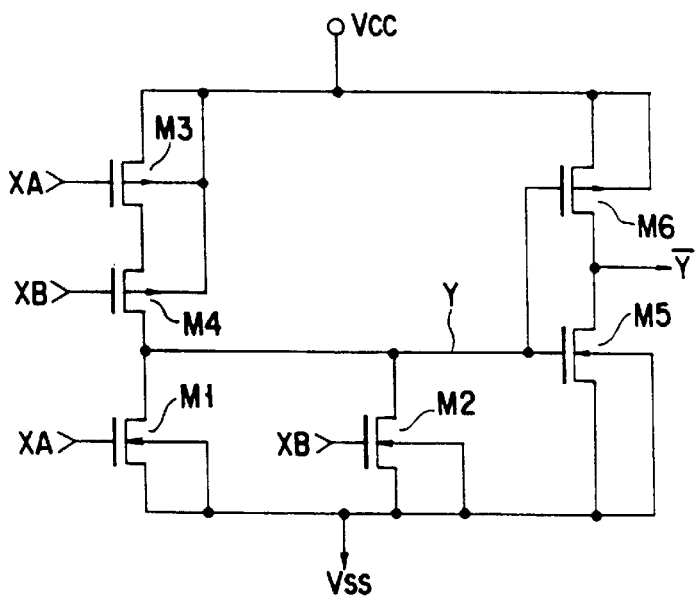
FIGS. 4A and 4B respectively show a conventional dual-input OR gate and a truth table.

Preferred embodiments of the present invention will now be described with reference to the drawings.

First Embodiment

FIGS. 15A and 15B show a nMOS transistor for forming a logic circuit according to a first embodiment of the present invention and having a body contact formed on an SOI substrate. FIG. 15A is a plan view and FIG. 15B is a cross sectional view taken along line 15B—15B shown in FIG. 15A.

The nMOS transistor according to this embodiment comprises a silicon oxide film 2 formed on a substrate 1; a element region (body) 3, which is a silicon layer (body) forming the semiconductor substrate and which is formed by a p-type diffusion layer; and an isolation region 4. Although the isolation is, in the structure shown in FIGS. 15A and 15B, performed by LOCOS (Local Oxidation) isolation, STI (Shallow Trench Isolation) may be employed. Moreover, a source and drain region 5 formed by an n-type diffusion layer and a gate 6 are provided. In addition, there are included an electrode 7 for supplying input signal XA to the gate 6; an electrode 8 for supplying input signal XB to the body 3; a contact 9 for establishing the direct connection between the electrode 8 and the body 3; and a p-type diffusion layer region having a high impurity density for reducing the contact resistance.

Although the nMOS transistor has been described, a pMOS transistor can be formed similarly by changing the type of the density of impurities in the diffusion layer.

Second Embodiment

FIGS. 16A and 16B show a nMOS transistor forming a logic circuit according to a second embodiment of the present invention and having two gate formed on an SOI substrate. FIG. 16A is a plan view, and FIG. 16B is a cross sectional view taken along line 16B—16B shown in FIG. 16A. The same elements as those shown in FIG. 15 are given the same reference numerals.

A first gate 6 is formed in the upper portion of the transistor. A second gate 11 is formed in a silicon oxide film 2 in the lower portion of the transistor. An electrode 7 for supplying input signal XA to the first gate 6 and an electrode 12 for supplying input signal XB to the second gate 11 are formed. Similarly to the first embodiment, a pMOS transistor can be formed by changing the type of the density of impurities in the diffusion layer.

Third Embodiment

Figure 17A:
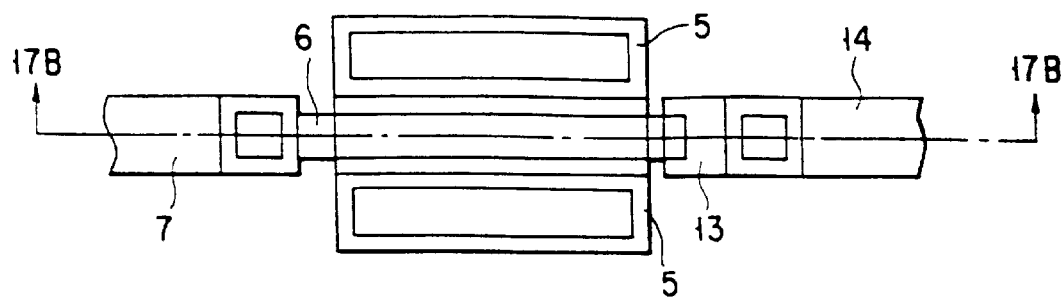
FIGS. 17A and 17B respectively are a plan view and a cross sectional view showing the MOS transistor according to a third embodiment of the present invention.
Figure 17B:
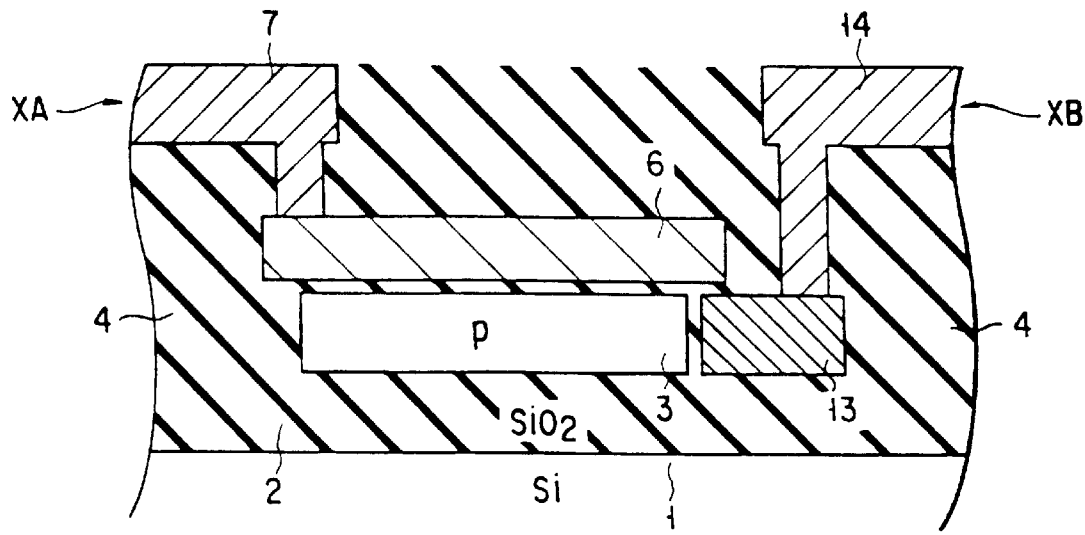

FIGS. 17A and 17b show a nMOS transistor for forming a logic circuit according to a third embodiment of the present invention and having two gates formed on a SOI substrate. FIGS. 17A is a plan view and 17B is a cross sectional view taken along line 17B—17B shown in FIG. 17A. The same elements as those shown in FIGS. 15A and 15B are given the same reference numerals.

An isolation region 4 is formed by STI. A first gate 6 is formed in the upper portion of the transistor, while a second gate 13 is formed on the side wall of the transistor in the isolation region 4. Moreover, an electrode 7 for supplying input signal XA to the first gate 6 and an electrode 14 for supplying input signal XB to the second gate 13 are formed. Also in this case, a pMOS transistor can be formed by changing the type of the density of impurities in the diffusion layer, similarly to the first embodiment.

The structure of the logical gate using the nMOS transistors and pMOS transistors according to the first embodiment will now be described. A similar logical gate may be formed by using the nMOS transistors and the pMOS transistors according to the second or third embodiments.

Fourth Embodiment

Figure 18:
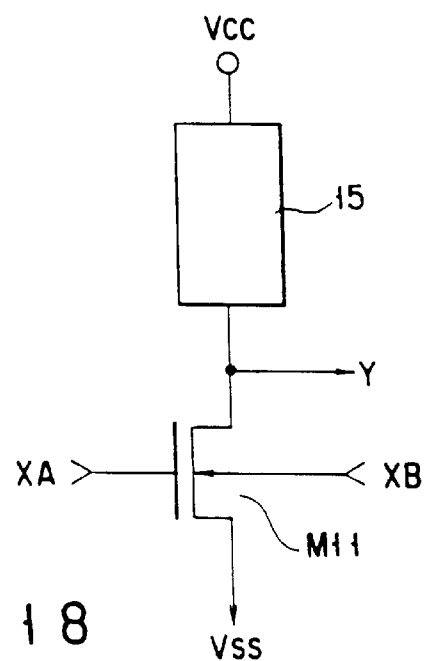
FIG. 18 is a circuit diagram showing a dual-input logical gate (NOR and NAND) according to a fourth embodiment of the present invention.

FIG. 18 shows a dual-input logical gate formed by using the nMOS transistor according to the present invention. A nMOS transistor M11 has a drain connected to output terminal Y, a gate to which input signal XA is supplied, a grounded source and a body to which input signal XB is supplied. A resistance element 15 is connected between power supply terminal Vcc and the output terminal Y.

FIGS. 19A to 19G show various examples of the resistance element 15. FIG. 19A shows a resistor formed by a p-type diffusion layer, a n-type diffusion layer or a polysilicon. FIG. 19B shows a resistor formed by a pMOS transistor M12 having a drain and a source which serve as the two ends of the resistance element, a portion between a gate and ground terminal Vss to which power source E1 is connected and a body in a floating state. FIG. 19C shows a resistor formed by a pMOS transistor M12 having a drain and a source which serve as the two ends of the resistance element, a portion between a gate and ground terminal Vss to which power source E1 is connected and a portion between a body and the ground terminal Vss to which power source E2 is connected. FIG. 19D shows a resistor formed by a pMOS transistor M12 having a drain and a source which serve as the two ends of the resistance element, a portion between a gate and ground terminal Vss to which power source E1 is connected and a portion between a body and the source to which power source E2 is connected. FIG. 19E shows a resistor formed by a nMOS transistor M13 having a drain and a source which serve as the two ends of the resistance element, a portion between a gate and ground terminal Vss to which power source E1 is connected, and a body which is in a floating state. FIG. 19F shows a resistor formed by a nMOS transistor M13 having a drain and a source which serve the as the two ends of the resistance element, a portion between a gate and ground terminal Vss to which power source E1 is connected and a portion between a body and the ground terminal Vss to which power source E2 is connected. FIG. 19G shows a resistor formed by a nMOS transistor M13 having a drain and a source which serve as the two ends of the resistance element, a portion between a gate and ground terminal Vss to which power source E1 is connected and a portion between a body and the source to which power source E2 is connected.

The MOS transistors M12 and M13 may be enhancement type transistors or depletion type transistors. The value of the power source E1 is set such that the MOS transistors M12 and M13 can be operated in linear regions.

FIG. 20 is a characteristic graph showing the relationship between the voltages, between the gate of the nMOS transistor and the source of the same, and drain currents. The drain current does not flow when the gate-source voltage is lower than the threshold voltage and flows when the same exceeds the threshold voltage. The threshold voltage is determined by the density of impurities in a channel region formed near the silicon surface below the gate and the potential of the body. Specifically, the threshold voltage is raised as the density of impurities is raised. The threshold voltage is raised as the potential of the body is lowered. Assumptions are made that the threshold voltage when logic 0 (ground potential Vss) has been supplied to the body is $V_{T0}$ and that the threshold voltage when logic 1 (the power supply potential Vcc) has been supplied to the same is $V_{T1}$. A portion 16 shown in FIG. 20 shows the characteristic realized when $V_{T1} < V_{T0} < Vcc$ and a portion 17 shows the characteristic realized when $Vss < V_{T1} < V_{T0}$.

The operation of the dual-input logical gate to be performed in the case where the nMOS transistor M11 has the characteristic indicated by the portion (16) will now be described with reference to a truth table shown in FIG. 21. When both of the input signals XA and XB are logic 0, the threshold voltage is $V_{T0}$ and the gate-source voltage is Vss. Therefore, the nMOS transistor M11 is cut off. As a result, the output terminal Y is charged by the resistance element 15 so that logic 1 is transmitted. When the input signal XA is logic 0 and XB is logic 1, the threshold voltage is $V_{T1}$. Since $V_{T1} < Vss$ though the gate-source voltage is Vss, the nMOS transistor M11 is made to be conductive. If the on-state resistance of the nMOS transistor M11 is smaller than the resistance of the resistance element 15 at this time, logic 0 is transmitted to the output terminal Y. When the input signal XA is logic 1 and XB is logic 0, the threshold voltage is $V_{T0}$ and gate-source voltage is Vcc. Therefore, nMOS transistor M11 is made to be conductive. When the on-state resistance of the nMOS transistor M11 is smaller than the resistance of the resistance element 15 at this time, logic 0 is transmitted to the output terminal Y. When both of the input signals XA and XB are logic 1, the threshold voltage is $V_{T1}$ and the gate-source voltage is Vcc. Therefore, the nMOS transistor is made to be conductive. When the on-state resistance of the nMOS transistor M11 is smaller than the resistance of the resistance element 15, logic 0 is transmitted to the output terminal Y.

As described above, the foregoing logical gate has the structure such that when both of the two inputs are logic 0, logic 1 is transmitted. In a case of the other inputs, logic 0 is transmitted. Specifically, dual-input NOR gate can be realized by two elements.

The operation of the dual-input logical gate to be performed in the case where the nMOS transistor M11 has the characteristic indicated by the portion (17) will now be described with reference to a truth table shown in FIG. 21. When both of the input signals XA and XB are logic 0, the threshold voltage is $V_{T0}$ and the gate-source voltage is Vss. Therefore, the nMOS transistor M11 is cut off. As a result, the output terminal Y is charged by the resistance element 15 so that logic 1 is transmitted. When the input signal XA is logic 0 and XB is logic 1, the threshold voltage is $V_{T1}$ and the gate-source voltage is Vss. Therefore, the nMOS transistor M11 is cut off. As a result, the output terminal Y is charged by the resistance element 15 so that logic 1 is transmitted. When the input signal XA is logic 1 and XB is logic 0, the threshold voltage is $V_{T0}$. Since $V_{T0} > Vcc$ though gate-source voltage is Vcc, the nMOS transistor M11 is cut off. As a result, the output terminal Y is charged by the resistance element 15 so that logic 1 is transmitted. When both of the input signals XA and XB are logic 1, the threshold voltage is $V_{T1}$ and the gate-source voltage is Vcc. Therefore, the nMOS transistor M11 is made to be conductive. When the on-state resistance of the nMOS transistor M11 is smaller than the resistance of the resistance element 15, logic 0 is transmitted to the output terminal Y.

As described above, the foregoing logical gate has the structure such that when both of the two inputs are logic 1, logic 0 is transmitted. In the case of the other inputs, logic 1 is transmitted. Specifically, a dual-input NAND can be realized by two elements.

Fifth Embodiment

A fifth embodiment having a structure such that each of a NOR gate and a NAND gate is formed by two elements is shown in FIGS. 22 and 23.

FIG. 22 shows a dual-input logical gate formed by using a pMOS transistor M14 and having a drain connected to the output terminal Y, a gate which is supplied with the input signal XA, a source connected to the power supply terminal Vcc and a body which is supplied with the input signal XB, wherein the resistance element 15 is connected between the ground terminal Vss and the output terminal Y. The gate-source voltage of the pMOS transistor, the drain current and the threshold voltage have signs opposite to those of the nMOS transistor. Therefore, the characteristic, which are realized when the signs are made opposite, are made to be the same as those shown in FIG. 20. The characteristic of the pMOS transistor will hereinafter be considered with reference to FIG. 20.

The operation of the dual-input logical gate to be performed in the case where the pMOS transistor M14 has the characteristic indicated by the portion (16) will now be described with reference to a truth table shown in FIG. 21. When both of the input signals XA and XB are logic 0, the threshold voltage is $V_{T1}$ and the gate-source voltage is Vcc. Therefore, the pMOS transistor M14 is made to be conductive. When the on-state resistance of the pMOS transistor M14 is smaller than the resistance of the resistance element 15 at this time, logic 1 is transmitted to the output terminal Y. When the input signal XA is logic 0 and XB is logic 1, the threshold voltage is $V_{T0}$ and the gate-source voltage is Vcc. Therefore, the pMOS transistor M14 is made to be conductive. When the on-state resistance of the pMOS transistor M14 is smaller than the resistance of the resistance element 15 at this time, logic 1 is transmitted to output terminal Y. When input signal XA is logic 1 and XB is logic 0, the threshold voltage is $V_{T1}$. Since $V_{T1}$<Vss though the gate-source voltage is Vss, the pMOS transistor M14 is made to be conductive. When the on-state resistance of the pMOS transistor M14 is smaller than the resistance of the resistance element 15 at this time, logic 1 is transmitted to the output terminal Y. When both of the input signals XA and XB are logic 1, the threshold voltage is $V_{T0}$ and the gate-source voltage is Vss. Therefore, the pMOS transistor M14 is cut off. As a result, the output terminal Y is discharged by the resistance element 11 so that logic 0 is transmitted.

As described above, the foregoing logical gate has the structure such that when both of the inputs are logic 1, logic 0 is transmitted. In the case of the other inputs, logic 1 is transmitted. Specifically, a dual-input NAND gate can be realized by two elements.

The operation of the dual-input logical gate to be performed in the case where the pMOS transistor M14 has the characteristic indicated by the portion (17) will now be described with reference to a truth table shown in FIG. 21. When both of the input signals XA and XB are logic 0, the threshold voltage if $V_{T1}$ and the gate-source voltage is Vcc. Therefore, the pMOS transistor M14 is made to be conductive. When the on-state resistance of the pMOS transistor M14 is smaller than the resistance of the resistance element 15 at this time, logic 1 is transmitted to the output terminal Y. When the input signal XA is logic 0 and XB is logic 1, the threshold voltage is $V_{T0}$. Since $V_{T0}$>Vcc though the gate-source voltage is Vcc, the pMOS transistor M14 is cut off. As a result, the output terminal Y is discharged by the resistance element 15 so that logic 0 is transmitted. When the input signal XA is logic 1 and XB is logic 0, the threshold voltage is $V_{T1}$ and the gate-source voltage Vss. Therefore, the pMOS transistor M14 is cut off. As a result, the output terminal Y is discharged by the resistance element 15 so that logic 0 is transmitted. When both of the input signals XA and XB are logic 1, the threshold voltage is $V_{T0}$ and the gate-source voltage is Vss. Therefore, the pMOS transistor M14 is cut off. As a result, the output terminal Y is discharged by the resistance element 15 so that logic 0 is transmitted.

As described above, the foregoing logical gate has the structure such that when both of the two inputs are logic 0, logic 1 is transmitted. In the case of the other inputs, logic 0 is transmitted. Specifically, a dual-input logical gate NOR gate can be realized by two elements.

FIG. 23 shows a dual-input logical gate formed by the nMOS transistor M11 and the pMOS transistor M14. Specifically, the nMOS transistor M11 has the structure such that the drain is connected to the output terminal Y, the gate is supplied with the input signal XA, the source is connected to the ground terminal Vss, and the body is supplied with the input signal XB. The pMOS transistor M14 has a structure such that the drain is connected to the output terminal Y, the gate is supplied with the input signal XA, the source is connected to the power supply terminal Vcc and the body is supplied with the input signal XB.

The operation of the foregoing logical gate is the combination of the operation of the nMOS transistor M11 shown in FIG. 18 and that of the pMOS transistor M14 shown in FIG. 22. Specifically, when the nMOS transistor M11 has the characteristic indicated by the portion (16) shown in FIG. 20 and the pMOS transistor M14 has the characteristic indicated by the portion (17) shown in FIG. 20, the foregoing logical gate operates as a NOR gate. When the nMOS transistor M11 has the characteristic indicated by the portion (17) shown in FIG. 20 and the pMOS transistor M14 has the characteristic indicated by the portion (16) shown in FIG. 20, the foregoing logical gate operates as a NAND gate. In either case, each of a dual-input logical gate NAND gate and a NOR gate can be realized by two elements.

Sixth Embodiment

An embodiment will now be described in which an OR gate or an AND gate is formed by two elements will now be described with reference to FIGS. 24 to 26.

FIG. 24 shows a dual-input logical gate formed by using a nMOS transistor M15 and having a structure such that the source is connected to the output terminal Y, the gate is supplied with the input signal XA, the drain is connected to the power supply terminal Vcc, the body is supplied with the input signal XB and the resistance element 15 is connected between the ground terminal Vss and the output terminal Y.

The operation to be performed in the case where the nMOS transistor M15 has the characteristic indicated by the portion (16) shown in FIG. 20 will now be described with reference to a truth table shown in FIG. 27. When both of the input signals XA and XB are logic 0, the threshold voltage is $V_{T0}$ and the gate voltage is Vss. Therefore, the nMOS transistor M15 is cut off. As a result, the output terminal Y is discharged by the resistance element 15 so that logic 0 is transmitted. When the input signal XA is logic 0 and XB is logic 1, the threshold voltage is $V_{T1}$. Since $V_{T1}$<Vss though the gate voltage is Vss, the nMOS transistor M15 is made to be conductive. When the on-state resistance of the nMOS transistor M15 is smaller than the resistance of the resistance element 15 at this time, logic 1 is transmitted to the output terminal Y. When the input signal XA is logic 1 and XB is logic 0, the threshold voltage is $V_{T0}$ and the gate voltage is Vcc. Therefore, the nMOS transistor M15 is made to be conductive. When the on-state resistance of the nMOS transistor M15 is smaller than the resistance of the resistance element 15, logic 1 is transmitted to the output terminal Y. When both of the input signals XA and XB are logic 1, the threshold voltage is $V_{T1}$ and the gate voltage is Vcc. Therefore, the nMOS transistor M15 is made to be conductive. When the on-state resistance of the nMOS transistor M15 is smaller than the resistance of the resistance element 15 at this time, logic 1 is transmitted to the output terminal Y.

As described above, the foregoing logical gate has the structure such that when both of the two inputs are logic 0, logic 0 is transmitted. In the case of the other inputs, logic 1 is transmitted. Specifically, a dual-input OR gate can be realized by two elements.

The operation to be performed in the case where the nMOS transistor M15 has the characteristic indicated by the portion (17) shown in FIG. 20 will now be described with reference to a truth table shown in FIG. 27. When both of the input signals XA and XB are logic 0, the threshold voltage is $V_{T0}$ and the gate voltage is Vss. Therefore, the nMOS transistor M15 is cut off. As a result, the output terminal Y is discharged by the resistance element 15 so that logic 0 is transmitted. When the input signal XA is logic 0 and XB is logic 1, the threshold voltage is $V_{T1}$ and the gate voltage is Vss. Therefore, the nMOS transistor M15 is cut off. As a result, the output terminal Y is discharged by the resistance element 15 so that logic 0 is transmitted. When the input signal XA is logic 1 and XB is logic 0, the threshold voltage is $V_{T0}$. Since $V_{T0}$<Vcc though the gate voltage is Vcc, the nMOS transistor M15 is cut off. As a result, the output terminal Y is discharged by the resistance element 15 so that logic 0 is transmitted. When both of the input signals XA and XB are logic 1, the threshold voltage is $V_{T1}$ and the gate voltage is Vcc. Therefore, the nMOS transistor M15 is made to be conductive. When the on-state resistance of the nMOS transistor M15 is smaller than the resistance of the resistance element 15 at this time, logic 1 is transmitted to the output terminal Y.

As described above, the foregoing logical gate has the structure such that when both of the input signals are logic 1, logic 1 is transmitted. In the case of the other inputs, logic 0 is transmitted. Specifically, a dual-input AND gate can be realized by two elements.

FIG. 25 shows a dual-input logical gate formed by using the pMOS transistor M16 and having a structure such that the source is connected to the output terminal Y, the gate is supplied with the input signal XA, the drain is connected to the ground terminal Vss, the body is supplied with the input signal XB, the resistance element 15 is connected between the power supply terminal Vcc and the output terminal Y. The characteristics of the pMOS transistor in the case where the signs of the gate-source voltage, the drain current and the threshold voltage are made opposite are, similar to the circuit shown in FIG. 24, shown in FIG. 20.

The operation to be performed in the case where the nMOS transistor M16 has the characteristic indicated by the portion (16) shown in FIG. 20 will now be described with reference to a truth table shown in FIG. 27. When both of the input signals XA and XB are logic 0, the threshold voltage is $V_{T1}$ and the gate voltage is Vss. Therefore, the pMOS transistor M16 is made to be conductive. When the on-state resistance of the pMOS transistor M16 is smaller than the resistance of the resistance element 15 at this time, logic 0 is transmitted to the output terminal Y. When the input signal XA is logic 0 and XB is logic 1, the threshold voltage is $V_{T0}$ and the gate voltage is Vss. Therefore, the pMOS transistor M16 is made to be conductive. When the on-state resistance of the pMOS transistor M16 is smaller than the resistance of the resistance element 15, logic 0 is transmitted to the output terminal Y. When the input signal XA is logic 1 and XB is logic 0, the threshold voltage is $V_{T1}$. Since $V_{T1}$<Vss though the gate voltage is Vcc, the pMOS transistor M16 is made to be conductive. When the on-state resistance of the pMOS transistor M16 is smaller than the resistance of the resistance element 15, logic 0 Is transmitted to the output terminal Y. When both of the input signals XA and XB are logic 1, the threshold voltage is $V_{T0}$ and the gate voltage is Vcc. Therefore, the pMOS transistor M16 is cut off. As a result, the output terminal Y is charged by the resistance element 15 so that logic 1 is transmitted.

As described above, the foregoing logical gate has the structure such that both of the two inputs are logic 1, logic 1 is transmitted. In the case of the other inputs, logic 0 is transmitted. Specifically, a dual-input logical gate AND gate can be realized by two elements.

The operation to be performed in the case where the pMOS transistor M16 has the characteristic indicated by the portion (17) will now be described with reference to a truth table shown in FIG. 27. When both of the input signals XA and XB are logic 0, the threshold voltage is $V_{T1}$ and the gate voltage is Vss. Therefore, the pMOS transistor M16 is made to be conductive. When the on-state resistance of the pMOS transistor M16 is smaller than the resistance of the resistance element 15, logic 0 is transmitted to the output terminal Y. When the input signal XA is logic 0 and XB is logic 1, the threshold voltage is $V_{T0}$. Since $V_{T0}$>Vcc though the gate voltage is Vss, pMOS transistor M16 is cut off. As a result, the output terminal Y is charged by the resistance element 15 so that logic 1 is transmitted. When the input signal XA is logic 1 and XB is logic 0, the threshold voltage is $V_{T1}$ and the gate voltage is Vcc. Therefore, the pMOS transistor M16 is cut off. As a result, the output terminal Y is charged by the resistance element 15 so that logic 1 is transmitted. When both of the input signals XA and XB are logic 1, the threshold voltage is $V_{T0}$ and the gate-source voltage is Vss. Therefore, the pMOS transistor M16 is cut off. As a result, the output terminal Y is charged by the resistance element 15 so that logic 1 is transmitted.

As described above, the foregoing logical gate has the structure such that when both of the two inputs are logic 0, logic 0 is transmitted. In the case of the other inputs, logic 1 is transmitted. Specifically, a dual-input OR gate can be realized by two elements.

FIG. 26 shows a dual-input logical gate formed by using the nMOS transistor M15 and the pMOS transistor M16. Specifically, the nMOS transistor M15 has the structure such that the source is connected to the output terminal Y, the gate is supplied with the input signal XA, the drain is connected to the power supply terminal Vcc and the body is supplied with the input signal XB. The pMOS transistor M16 has the structure such that the source is connected to the output terminal Y, the gate is supplied with the input signal XA, the drain is connected to the ground terminal Vss and the body is supplied with the input signal XB.

The operation of the foregoing logical gate is the combination of the operation of the nMOS transistor M15 shown in FIG. 24 and that of the pMOS transistor M16 shown in FIG. 25. Specifically, when the nMOS transistor M15 has the characteristic indicated in the portion (16) and the pMOS transistor M16 has the characteristic indicated in the portion (17), the foregoing logical gate operates as a OR gate. When the nMOS transistor M15 has the characteristic indicated in the portion (17) and the pMOS transistor M16 has the characteristic indicated in the portion (16), the foregoing logical gate operates as an AND gate. In either case, each of a dual-input AND gate and OR gate can be realized by two elements.

Seventh Embodiment A preferred embodiment of a 4-input logical gate, and particularly a preferred embodiment of a 4-input NAND gate will now be described with reference to FIGS. 28A to 28C.

FIG. 28A shows a 4-input NAND gate composed of two nMOS transistors and one resistance element. A nMOS transistor M17 has a structure such that the drain is connected to the output terminal Y, the gate is supplied with the input signal XA, the source is connected to node N, and the body is supplied with the input signal XB. A nMOS transistor M18 has a structure such that the drain is connected to the node N, the gate is supplied with input signal XC, the source is connected to the ground terminal Vss, the body is supplied with input signal XD and the resistance element 15 is connected between the power supply terminal Vcc and the output terminal Y.

A case will now be considered in which both of the nMOS transistors M17 and M18 have the characteristic indicated in portion (17) shown in FIG. 20. When all of input signals XA, XB, XC and XD are logic 1, both of the nMOS transistors M17 and M18 are made to be conductive. When the series on-state resistance of the nMOS transistors M17 and M18 is smaller than the resistance of the resistance element 15, logic 0 is transmitted to the output terminal Y. When at least any one of the input signals XA, XB, XC and XD is logic 0, the nMOS transistor, to which logic 0 is supplied, is cut off. As a result, the output terminal Y is charged by the resistance element 15 so that logic 1 is transmitted.

As described above, according to this embodiment, a 4-input NAND gate can be realized by three elements. By connecting any one of the gate or the body of the nMOS transistor M17, the gate or the body of the nMOS transistor M18 to the power supply terminal Vcc, 3-input NAND gate can be realized by three elements.

FIG. 28B shows a 4-input NAND gate formed by two pMOS transistors and one resistance element. The pMOS transistor M19 is connected to the output terminal Y, the gate is supplied with the input signal XA, the source is connected to the power supply terminal Vcc, and the body is supplied with the input signal XB. The pMOS transistor M20 has a structure such that the drain is connected to the output terminal Y, the gate is supplied with the input signal XC, the source is connected to the power supply terminal Vcc, the body is supplied with the input signal XD and the resistance element 15 is connected between the ground terminal Vss and the output terminal Y.

A case will now be described in which both of the pMOS transistors M19 and M20 have the characteristic indicated in the portion (17) shown in FIG. 20. When the input signals XA, XB, XC and XD are logic 1, both of the pMOS transistors M19 and M20 are cut off. As a result, the output terminal Y is charged by the resistance element 15 so that logic 0 is transmitted. If at least any one of the input signals XA, XB, XC and XD is logic 0, the pMOS transistor, to which logic 0 is supplied, is made to be conductive. When the on-state resistance of the conductive pMOS transistor is smaller than the resistance of the resistance element 15, logic 1 is transmitted to the output terminal Y.

As described above, a 4-input NAND gate can be realized by three elements. By connecting any one of the gate or the body of the pMOS transistor M19, the gate or the body of the pMOS transistor M20 to the power supply terminal Vcc, a 3-input NAND gate can be realized by three elements.

FIG. 28C shows a 4-input AND gate formed by using nMOS transistors M17 and M18 and the pMOS transistors M19 and M20. Specifically, the nMOS transistor M17 has a structure such that the drain is connected to the output terminal Y, the gate is supplied with the input signal XA, the source is connected to the node N, and the body is supplied with the input signal XB. The nMOS transistor M18 has a structure such that the drain is connected to the node N, the gate is supplied with the input signal XC, the source is connected to the ground terminal Vss, and the body is supplied with the input signal XD. The pMOS transistor M19 has a structure such that the drain is connected to the output terminal Y, the gate is supplied with the input signal XA, the source is connected to the power supply terminal Vcc and the body is supplied with the input signal XB. The pMOS transistor M20 has a structure such that the drain is connected to the output terminal Y, the gate is supplied with the input signal XC, the source is connected to the power supply terminal Vcc and the body is supplied with the input signal XD.

A case will now be considered in which the nMOS transistors M17 and M18 have the characteristic indicated in the portion (17) shown in FIG. 20 and the pMOS transistors M19 and M20 have the characteristic indicated in the portion (16) shown in FIG. 20. When all of the input signals XA, XB, XC and XD are logic 1, the both of the nMOS transistors M17 and M18 are made to be conductive, and both of the pMOS transistors M19 and M20 are cut off. As a result, logic 0 is transmitted to the output terminal Y. If any one of the input signals XA, XB, XC and XD is logic 0, the nMOS transistor, to which logic 0 is supplied, is cut off. On the other hand, the pMOS transistor, to which logic 0 is supplied, is made to be conductive. As a result, logic 1 is transmitted to the output terminal Y.

As described above, a 4-input NAND gate can be realized by four elements. By connecting any one of the gate or the body of the nMOS transistor M17 or the gate or the body of the nMOS transistor M18 to the power supply terminal Vcc and by connecting either of the bodies to the power supply terminal Vcc, a 3-input NAND gate can be realized by three elements.

Eighth Embodiment

An embodiment of a 4-input logical gate, and particularly, an embodiment of a 4-input NOR gate will now be described with reference to FIGS. 29A to 29C.

FIG. 29A shows a 4-input NOR gate formed by two nMOS transistors and one resistance element. The nMOS transistor M21 has a structure such that the drain is connected to the output terminal Y, the gate is supplied with the input signal XA, the source is connected to the ground terminal Vss, and the body is supplied with the input signal XB. The nMOS transistor M22 has a structure such that the drain is connected to the output terminal Y, the gate is supplied with the input signal XC, the source is connected to the ground terminal Vss, the body is supplied with the input signal XD and the resistance element 15 is connected between the power supply terminal Vcc and the output terminal Y.

A case where both of the nMOS transistors M21 and M22 have the characteristic indicated in the portion (17) shown in FIG. 20 will now be considered. When all of the input signals XA, XB, XC and XD are logic 0, both of the nMOS transistors M21 and M22 are cut off. As a result, the output terminal Y is charged by the resistance element 15 so that logic 1 is transmitted. If at least any one of the input signals XA, XB, XC and XD is logic 1, the nMOS transistor, to which logic 1 is supplied, is made to be conductive. When the on-state resistance of the conductive nMOS transistor is smaller than the resistance of the resistance element 15, logic 0 is transmitted to the output terminal Y.

As described above, a 4-input NOR gate can be realized by three elements. By connecting any one of the gate or the body of the nMOS transistor M21, the gate or the body of the nMOS transistor M22 to the ground terminal Vss, a 3-input NOR gate can be realized by three elements.

FIG. 29B shows a 4-input NAND gate formed by two pMOS transistors and one resistance element. The pMOS transistor M23 has a structure such that the source is connected to the power supply terminal Vcc, the gate is supplied with the input signal XA, the drain is connected to the node N and the body is supplied with the input signal XB. The pMOS transistor M24 has a structure such that the source is connected to the node N, the gate is supplied with the input signal XC and drain is connected to the output terminal Y, the body is supplied with the input signal XD and the resistance element 15 is connected between the ground terminal Vss and the output terminal Y.

A case will now be considered in which both of the pMOS transistors M23 and M24 have the characteristic indicated in the portion (16) shown in FIG. 20. When all of the input signals XA, XB, XC and XD are logic 0, both of the pMOS transistors M23 and M24 are made to be conductive. When the series on-state resistance of the pMOS transistors M23 and M24 is smaller than the resistance of the resistance element 15, logic 1 is transmitted to the output terminal Y. If any one of the input signals XA, XB, XC and XD is logic 1, the pMOS transistor, to which logic 1 is supplied, is cut off. As a result, the output terminal Y is discharged by the resistance element 15 so that logic 0 is transmitted.

As described above, a 4-input NOR gate can be realized by three elements. By connecting any one of the gate or the body of the pMOS transistor M23, the gate or the body of the pMOS transistor M24 to the ground terminal Vss, a three-input NOR gate can be realized by three elements.

FIG. 29C shows a 4-input NOR gate formed by the nMOS transistors M21 and M22 and the pMOS transistors M23 and M24. Specifically, the nMOS transistor M21 has a structure such that the drain is connected to the output terminal Y, the gate is supplied with the input signal XA, the source is connected to the ground terminal Vss and the body is supplied with the input signal XB. The nMOS transistor M22 has a structure such that the drain is connected to the output terminal Y, the gate is supplied with the input signal XC, the source is connected to the ground terminal Vss and the body is supplied with the input signal XD. The pMOS transistor M23 has a structure such that the drain is connected to the node N, the gate is supplied with the input signal XA, the source is connected to the power supply terminal Vcc, and the body is supplied with the input signal XB. The pMOS transistor M24 has a structure such that the drain is connected to the output terminal Y, the gate is supplied with the input signal XC, the source is connected to the node N and the body is supplied with the input signal XD.

A case will now be considered in which both of the nMOS transistors M21 and M22 have the characteristic indicated in the portion (17) shown in FIG. 20 and both of the pMOS transistors M23 and M24 have the characteristic indicated in the portion (16) shown in FIG. 20. When all of the input signals XA, XB, XC and XD are logic 0, both of the nMOS transistors M21 and M22 are cut off. On the other hand, both of the pMOS transistors M23 and M24 are made to be conductive. As a result, logic 1 is transmitted to the output terminal Y. If at least any one of the input signals XA, XB, XC and XD is logic 1, the nMOS transistor, to which logic 1 is supplied, is made to be conductive. On the other hand, the pMOS transistor, to which logic 0 is supplied, is cut off. As a result, logic 0 is transmitted to the output terminal Y.

As described above, a 4-input NOR gate can be realized by four elements. By connecting any one of the gate or the body of the nMOS transistor M22 to the ground terminal Vss and by connecting any one of the gate or the body of the pMOS transistor M23 or the gate or the body of the nMOS transistor M24 to the ground terminal Vss, a three-input NOR gate can be realized by three elements.

Ninth Embodiment

An embodiment of the 4-input logical gate, and more particularly an embodiment of the 4-input NAND gate is shown in FIGS. 30A to 30C.

FIG. 30A shows a 4-input AND gate formed by two nMOS transistors and one resistance element. The nMOS transistor M25 has a structure such that the drain is connected to the power supply terminal Vcc, the gate is supplied with the input signal XA, the source is connected to the node N and the body is supplied with the input signal XB. The nMOS transistor M26 has a structure such that the drain is connected to the node N, the gate is supplied with the input signal XC, the source is connected to the output terminal Y, the body is supplied with the input signal XD and the resistance element 15 is connected between the ground terminal Vss and the output terminal Y.

A case will now be considered in which both of the nMOS transistors M25 and M26 have the characteristic indicated in the portion (17) shown in FIG. 20. If all of the input signals XA, XB, XC and XD are logic 1, both of the nMOS transistors M25 and M26 are made to be conductive. When the series on-state resistance of the nMOS transistors M25 and M26 is smaller than the resistance of the resistance element 15, logic 1 is transmitted to the output terminal Y. If at least any one of the input signals XA, XB, XC and XD is logic 0, the nMOS transistor, to which logic 0 is supplied, is cut off. As a result, the output terminal Y is discharged by the resistance element 15 so that logic 0 is transmitted.

As described above, a 4-input AND gate can be realized by three elements. By connecting any one of the gate or the body of the nMOS transistor M25 or the gate or the body of the nMOS transistor M26 to the power supply terminal Vcc, a three-input AND gate can be realized by three elements.

FIG. 30B shows a 4-input AND gate formed by two pMOS transistors and one resistance element. The pMOS transistor M27 has a structure such that the source is connected to the output terminal Y, the gate is supplied with the input signal XA, the drain is connected to the ground terminal Vss, and the body is supplied with the input signal XB. The pMOS transistor M28 has a structure such that the source is connected to the output terminal Y, the gate is supplied with the input signal XC, the drain is connected to the ground terminal Vss, the body is supplied with the input signal XD, and the resistance element 15 is connected between the power supply terminal Vcc and the output terminal Y.

A case will now be considered in which both of the pMOS transistors M27 and M28 have the characteristic indicated in the portion (16) shown in FIG. 20. When all of the input signals XA, XB, XC and XD are logic 1, both of the pMOS transistors M27 and M28 are cut off. As a result, the output terminal Y is charged by the resistance element 15 so that logic 1 is transmitted. If at least any one of the input signals XA, XB, XC and XD is logic 0, the pMOS transistor, to which the logic 0 is supplied, is made to be conductive. When the on-state resistance of the conductive pMOS transistor is smaller than the resistance of the resistance element 15, logic 0 is transmitted to the output terminal Y.

As described above, a 4-input AND gate can be realized by three elements. By connecting any one of the gate or the body of the pMOS transistor M27 or the gate or the body of the pMOS transistor M28 to the power supply terminal Vcc, a three-input AND gate can be realized by three elements.

FIG. 30C shows a 4-input AND gate formed by the nMOS transistors M25 and M26 and the pMOS transistors M27 and M28. Specifically, the nMOS transistor M25 has a structure such that the drain is connected to the power supply terminal Vcc, the gate is supplied with the input signal XA, the source is connected to the node N and the body is supplied with the input signal XB. The nMOS transistor M26 has a structure such that the drain is connected to the node N, the gate is supplied with the input signal XC, the source is connected to the output terminal Y and the body is supplied with the input signal XD. The pMOS transistor M27 has a structure such that the source is connected to the output terminal Y, the gate is supplied with the input signal XA, the drain is connected to the power supply terminal Vcc, and the body is supplied with the input signal XB. The pMOS transistor M28 has a structure such that the source is connected to the output terminal Y, the gate is supplied with the input signal XC, the drain is connected to the power supply terminal Vcc and the body is supplied with the input signal XD.

A case will now be considered in which both of the nMOS transistors M25 and M26 have the characteristic indicated in the portion (17) shown in FIG. 20 and both of the pMOS transistors M27 and M28 have the characteristic indicated in the portion (16) shown in FIG. 25. When all of the input signals XA, XB, XC and XD are logic 1, both of the nMOS transistors M25 and M26 are made to be conductive, and both of the pMOS transistors M27 and M28 are cut off. As a result, logic 1 is transmitted to the output terminal Y. If at least any one of the input signals XA, XB, XC and XD is logic 0, the nMOS transistor, to which logic 0 is supplied, is cut off. On the other hand, the pMOS transistor, to which logic 0 is supplied, is made to be conductive. As a result, logic 0 is transmitted to the output terminal Y.

As described above, a 4-input AND gate can be realized by four elements. By connecting any one of the gate or the body of the nMOS transistor M25 or the gate or the body of the nMOS transistor M26 to the power supply terminal Vcc and by connecting any one of the gate or the body of the pMOS transistor M27 or the gate or the body of the nMOS transistor M28 to the power supply terminal Vcc, a three-input NAND gate can be realized by three elements.

Tenth Embodiment

An embodiment of a 4-input logical gate, and more particularly, an embodiment of a 4-input OR gate is shown in FIGS. 31A to 31C.

FIG. 31A shows a 4-input OR gate formed by two nMOS transistors and one resistance element. The nMOS transistor M29 has a structure such that the source is connected to the output terminal Y, the gate is supplied with the input signal XA, the drain is connected to the power supply terminal Vcc and the body is supplied with the input signal XB. The nMOS transistor M30 has a structure such that the source is connected to the output terminal Y, the gate is supplied with input signal XC, the source is connected to the power supply terminal Vcc, the body is supplied with the input signal XD and the resistance element 15 is connected between the ground terminal Vss and the output terminal Y.

A case will now be considered in which both of the nMOS transistors M29 and M30 has the characteristic indicated in the portion (16) shown in FIG. 20. If all of the input signals XA, XB, XC and XD are logic 0, both of the nMOS transistors M29 and M30 are cut off. As a result, the output terminal Y is discharged by the resistance element 15 so that logic 0 is transmitted. If at least any one of the input signals XA, XB, XC and XD is logic 1, the nMOS transistor, to which the logic 1 is supplied, is made to be conductive. When the on-state resistance of the conductive nMOS transistor is smaller than the resistance of the resistance element 15, logic 1 is transmitted to the output terminal Y.

As described above, a 4-input OR gate can be realized by three elements. By connecting any one of the gate or the body of the nMOS transistor M29 or the gate or the body of the nMOS transistor M30 to the ground terminal Vss, a three-input OR gate can be realized by three elements.

FIG. 31B shows a 4-input OR gate formed by two pMOS transistors and one resistance element. The pMOS transistor m31 has a structure such that these is connected to the output terminal Y, the gate is supplied with the input signal XA, the drain is connected to the node N and the body is supplied with the input signal XB. The pMOS transistor M32 has a structure such that the source is connected to the node N, the gate is supplied with the input signal XC, the drain is connected to the ground terminal Vss, the body is supplied with the input signal XD and the resistance element 15 is connected between the power supply terminal Vcc and the output terminal Y.

A case will now be considered in which both of the pMOS transistors M31 and M32 have the characteristic indicated in the portion (17) shown in FIG. 20. When all of the input signals XA, XB, XC and XD are logic 0, both of the pMOS transistors M31 and M32 are made to be conductive. If the series on-state resistance of the pMOS transistors M31 and M32 is smaller than the resistance of the resistance element 15, logic 0 is transmitted to the output terminal Y. If at least any one of the input signals XA, XB, XC and XD is logic 1, the pMOS transistor, to which logic 1 is supplied, is cut off. As a result, the output terminal Y is charged by the resistance element 15 so that logic 1 is transmitted.

As described above, a 4-input OR gate can be realized by three elements. By connecting any one of the gate or the body of the pMOS transistor M31 or the gate or the body of the pMOS transistor M32 to the ground terminal Vss, a three-input OR gate can be realized by three elements.

FIG. 31C shows a 4-input OR gate formed by nMOS transistors M29 and M30 and pMOS transistors M31 and M32. Specifically, the nMOS transistor M29 has a structure such that the source is connected to the output terminal Y, the gate is supplied with the input signal XA, the source is connected to the power supply terminal Vcc and the body is supplied with the input signal XB. The nMOS transistor M30 has a structure such that the source is connected to the output terminal Y, the gate is supplied with the input signal XC, the source is connected to the power supply terminal Vcc and the body is supplied with the input signal XD. Moreover, the pMOS transistor M31 has a structure such that the source is connected to the output terminal Y, the gate is supplied with the input signal XA, the drain is connected to the node N and the body is supplied with the input signal XB. The pMOS transistor M32 has a structure such that the drain is connected to the node N, the gate is supplied with the input signal XC, the source is connected to the ground terminal Vss and the body is supplied with the input signal XD.

A case will now be considered in which both of the nMOS transistors M29 and M30 have the characteristic indicated in the portion (16) shown in FIG. 20 and both of the pMOS transistors M31 and M32 have the characteristic indicated in the portion (17) shown in FIG. 20. When all of input signals XA, XB, XC and XD are logic 0, both of the nMOS transistors M29 and M30 are cut off. On the other hand, both of the pMOS transistors M31 and M32 are made to be conductive. As a result, logic 0 is transmitted to the output terminal Y. If at least any one of the input signals XA, XB, XC and XD is logic 1, the nMOS transistor, to which logic 1 is supplied, is made to be conductive. On the other hand, the pMOS transistor, to which logic 0 is supplied, is cut off. As a result, logic 1 is transmitted to the output terminal Y.

As described above, a 4-input OR gate can be realized by four elements. By connecting any one of the gate or the body of the nMOS transistor M29 or the gate or the body of the nMOS transistor M23 to the ground terminal Vss and by connecting any one of the gate or the body of the pMOS transistor M31 or the gate or the body of the pMOS transistor M32 to the ground terminal Vss, a three-input OR gate can be realized by three elements.

Eleventh Embodiment

An embodiment of en EXNOR gate is shown in FIGS. 32A to 32F.

FIG. 32A shows a dual-rail input EXNOR gate formed by two nMOS transistors and one resistance element. The nMOS transistor M33 has a structure such that the drain is connected to the output terminal Y, the gate is supplied with the input signal XA, the source is connected to the node N1 and the body is supplied with the input signal XB. The nMOS transistor M34 has a structure such that the drain is connected to the node N1, the gate is supplied with complementary signal /XA of the input signal XA, the source is connected to the ground terminal Vss, the body is supplied with the complementary signal /XB of the input signal XB, and the resistance element 15 is connected between the ground terminal Vss and the output terminal Y.

The operation to be performed when both of the nMOS transistors M33 and M34 have the characteristic indicated in the portion (16) shown in FIG. 20 will now be described with reference to a truth table shown in FIG. 33. When both of the input signals XA and XB are logic 0, the nMOS transistor M33 is cut off and the nMOS transistor M34 is made to be conductive. As a result, the output terminal Y is charged by the resistance element 15 so that logic 1 is transmitted. When the input signal XA is logic 0 and XB is logic 1, the threshold voltage of the nMOS transistor M33 is $V_{T1}$ and the threshold voltage of the nMOS transistor M34 is $V_{T0}$. Since $V_{T1}$<Vss though the gate-source voltage of the nMOS transistor M33 is Vss, the nMOS transistor M33 is made to be conductive. Since the gate-source voltage of the nMOS transistor M34, the nMOS transistor M34 is made to be conductive. At this time, if the series on-state resistance of the nMOS transistors M33 and M34 is smaller than the resistance of the resistance element 15, logic 0 is transmitted to the output terminal Y. When the input signal XA is logic 1 and XB is logic 0, the threshold voltage of the nMOS transistor M33 is $V_{T0}$ and the threshold voltage of the nMOS transistor M34 is $V_{T1}$. Since the gate-source voltage of the nMOS transistor M33 is Vcc, the nMOS transistor M33 is made to be conductive. Since $V_{T1}$<Vss though the gate-source voltage of the nMOS transistor M34 is Vss, the nMOS transistor M34 is made to be conductive. If the series on-state resistance of the nMOS transistors M33 and M34 is smaller than the resistance of the resistance element 15, logic 0 is transmitted to the output terminal Y.

When the input signal XA is logic 1 and XB is logic 0, the threshold voltage of the nMOS transistor M33 is $V_{T0}$ an the threshold voltage of the nMOS transistor M34 is $V_{T1}$. Since the gate-source voltage of the MOS transistor M33 is Vcc, the nMOS transistor M33 is made to be conductive. Since $V_{T1}$<Vss though the gate-source voltage of the nMOS transistor M34 is Vss, the nMOS transistor M34 is made to be conductive. If the series on-state resistance of the nMOS transistor M33 and M34 is smaller than the resistance of the resistance element 15, logic 0 is transmitted to the output terminal Y. When both of the input signals XA and XB are logic 1, the nMOS transistor M33 is made to be conductive and the nMOS transistor M34 is cut off. As a result, the output terminal Y is charged by the resistance element 15 so that logic 1 is transmitted.

As described above, a dual-input EXNOR gate can be realized by three elements. Note that the embodiment may be arranged such that the input of the gate and the body of the nMOS transistor M33 may be interchanged. The input of the gate and the body of the nMOS transistor M34 may be interchanged. By connecting an inverter to the output terminal Y and by making the output from the inverter to be Sum signal and the node N1 to be a carry signal, a half adder can be realized.

FIG. 32B shows a 2-rail 2-input EXNOR gate formed by four nMOS transistors. The nMOS transistors M33 and M34 are connected in the same manner as that shown in FIG. 32A and thus they are operated similarly to those shown in FIG. 32A. The drain of the nMOS transistor M35 is connected to the power supply terminal Vcc, the gate is supplied with the input signal XA, the source is connected to the node N2, and the body is supplied with the complementary signal /XB of the input signal XB. The nMOS transistor M36 has a structure such that the drain is connected to the node N2, the gate is supplied with complementary signal /XA of the input signal XA, the source is connected to the output terminal Y and the body is supplied with the input signal XB.

The operation to be performed when the nMOS transistors M35 and M36 have the characteristic indicated in the portion (16) shown in FIG. 20 will now be described with reference to a truth table shown in FIG. 33. When both of the input signals XA and XB are logic 0, the nMOS transistor M33 is cut off and the nMOS transistors M34, M35 and M36 are made to be conductive. As a result, logic 1 is transmitted to the output terminal Y. When the input signal XA is logic 0 and XB is logic 1, the nMOS transistors M33, M34 and M35 are made to be conductive and the nMOS transistor M36 is cut off. As a result, logic 0 is transmitted to the output terminal Y. When the input signal XA is logic 1 and the XB is logic 0, the nMOS transistors M33, M34 and M36 are made to be conductive and M35 is cut off. As a result, logic 0 is transmitted to the output terminal Y. When both of the input signals XA and XB are logic 1, the MOS transistors M33, M35 and M36 are made to be conductive and M34 is cut off. As a result, logic 1 is transmitted to the output terminal Y.

As described above, a dual-input EXNOR gate can be realized by four elements. Note that the input for the gate and that for the body of the nMOS transistor M35 may be interchanged. The input for the gate and that for the body of the nMOS transistor M36 may be interchanged. The gate of the nMOS transistor M35 may be supplied with the complementary signal /XA and the body of the same may be supplied with XB. The gate of the nMOS transistor M36 may be supplied with XA and the body of the same may be supplied with /XB. Moreover, the foregoing arrangements may be combined to effectively embody the present invention. When an inverter is connected to the output terminal Y, the output from the inverter is made to be sum signal and the node N1 is made to be a carry signal, a half adder can be realized.

FIG. 32C shows a 2-rail 2-input EXNOR gate formed by a nMOS transistor and two pMOS transistors. The nMOS transistors M33 and M34 are connected in the same manner as that shown in FIG. 32 and they are operated similarly. The source of the pMOS transistor M37 is connected to the power supply terminal Vcc, the gate of the same is supplied with input signal XA, the drain of the same is connected to node N3 and the body of the same is supplied with the complementary signal /XB of the input signal XB. The pMOS transistor M38 has a structure such that the source is connected to the node N3, the gate is supplied with the complementary signal /XA of the input signal XA, the drain is connected to the output terminal Y and the body is supplied with the input signal XB.

The operation to be performed when both of the pMOS transistors M37 and M38 have the characteristic indicated in the portion (16) shown in FIG. 20 will now be described with reference to the truth table shown in FIG. 33. When both of the input signals XA and XB are logic 0, the nMOS transistor M33 is cut off and the nMOS transistor M34 and the pMOS transistors M37 and M38 are made to be conductive. As a result, logic 1 is transmitted to the output terminal Y. When the input signal XA is logic 0 and XB is logic 1, the nMOS transistors M33 and M34 and the pMOS transistor M37 are made to be conductive. On the other hand, the pMOS transistor M38 is cut off. As a result, logic 0 is transmitted to the output terminal Y. When the input signal XA is logic 1 and XB is logic 0, the nMOS transistors M33 and M34 and the pMOS transistor M38 are made to be conductive. On the other hand, the pMOS transistor M37 is cut off. As a result, logic 0 is transmitted to the output terminal Y. When both of the input signals XA and XB are logic 1, the nMOS transistor M33 and the pMOS transistors M37 and M38 are made to be conductive. On the other hand, the nMOS transistor M34 is cut off. As a result, logic 1 is transmitted to the output terminal Y.

As described above, a dual-input EXNOR gate can be realized by four elements. This embodiment may be arranged such that the inputs for the gate and the body of the pMOS transistor M37 may be interchanged. The inputs for the gate and the body of the pMOS transistor M38 may be interchanged. Moreover, a structure may be employed in which /XA is supplied to the gate of the pMOS transistor M37 and XB is supplied to the body of the same, XA is supplied to the gate of the pMOS transistor M38 and /XB is supplied to the body of the same. The combination of the foregoing arrangements can effectively be applied to the present invention. When an inverter is connected to the output terminal Y, the output from the inverter is made to be Sum signal and the node N1 is made to be a carry signal, a half adder can be realized.

FIG. 32D shows a 2-rail 2-input EXNOR gate formed by nMOS transistors and one resistance element. The nMOS transistor M39 has a structure such that the drain is connected to the output terminal Y, the gate is supplied with the input signal XA, the source is connected to the ground terminal Vss, and the body is supplied with the complementary signal /XB of the input signal XB. The nMOS transistor M40 has a structure such that the drain is connected to the output terminal Y, the gate is supplied with the input signal XB, the source is connected to the ground terminal Vss, the body is supplied with the complementary signal /XB of the input signal XB and the resistance element 15 is connected between the power supply terminal Vcc and the output terminal Y.

A case will now be considered when both of the nMOS transistors M39 and M40 have the characteristic indicated in the portion (17) shown in FIG. 20. When both of the input signals XA and XB are logic 0, both of the nMOS transistors M39 and M40 are cut off. As a result, the output terminal Y is charged by the resistance element 15 so that logic 1 is transmitted. When the input signal XA is logic 0 and the XB is logic 1, the nMOS transistor M39 is cut off and M40 is made to be conductive. When the on-state resistance of the nMOS transistor M40 is smaller than the resistance of the resistance element 15, logic 0 is transmitted to the output terminal Y. When the input signal XA is logic 1 and XB is logic 0, the nMOS transistor M39 is made to be conductive and M40 is cut off. When the on-state resistance of the nMOS transistor M39 is smaller than the resistance of the resistance element 15, logic 0 is transmitted to the output terminal Y. When both of the input signals XA and XB are logic 1, the threshold voltages of the nMOS transistors M39 and M40 are $V_{T0}$ and the gate-source voltage of each of the nMOS transistors M39 and M40 is Vcc. Since $V_{T0}$>Vcc, both of the nMOS transistors M39 and M40 are cut off. As a result, the output terminal Y is charged by the resistance element 15 so that logic 1 is transmitted.

As described above, a dual-input EXNOR gate can be realized by three elements. Note that this embodiment may be arranged such that the inputs for the gate and the body of the nMOS transistor M39 may be interchanged and those for the gate and the body of the nMOS transistor M40 may be interchanged. The present invention can effectively be applied to their combination.

FIG. 32E shows a 2-rail 2-input EXNOR gate formed by four nMOS transistors. The nMOS transistors M39 and M40 are connected similar to those shown in FIG. 32D and thus they are operated similarly to the same. The nMOS transistor M41 has a structure such that the drain is connected to the power supply terminal Vcc, the gate is supplied with the input signal XA, the source is operated to the output terminal Y and the body is supplied with the input signal XB. The nMOS transistor M42 has a structure such that the drain is connected to the power supply terminal Vcc, the gate is supplied with the complementary signal /XA of the input signal XA, the source is connected to the output terminal Y and the body is supplied with the complementary signal /XB of the input signal XB.

A case will be considered that both of the nMOS transistors M41 and M42 have the characteristic indicated in the portion (17) shown in FIG. 20. When both of the input signals XA and XB are logic 0, the nMOS transistors M39, M40 and M41 are cut off and M42 is made to be conductive. As a result, logic 1 is transmitted to the output terminal Y. When the input signal XA is logic 0 and XB is logic 1, the nMOS transistors M39, M41 and M42 are cut off and M40 is made to be conductive. As a result, logic 0 is transmitted to the output terminal Y. When the input signal XA is logic 1 and XB is logic 0, the nMOS transistors M40, M41 and M42 are cut off and M39 is made to be conductive. As a result, logic 0 is transmitted to the output terminal Y. When both of the input signals XA and XB are logic 1, the nMOS transistors M39, M40 and M42 are cut off and M41 is made to be conductive. As a result, logic 1 is transmitted to the output terminal Y.

As described above, a dual-input EXNOR gate can be realized by four elements. Note that this embodiment may be arranged such that the inputs for the gate and the body of the nMOS transistor M41 may be interchanged and those of the gate and the body of the nMOS transistor M42 may be interchanged. The present invention may effectively be applied to their combinations.

FIG. 32F shows a 2-rail 2-input EXNOR gate formed by two nMOS transistors and two pMOS transistors. The nMOS transistors M39 and M40 are connected to similarly to those shown in FIG. 32D and are operated similarly. The pMOS transistor M43 has a structure such that the source is connected to the power supply terminal Vcc, the gate is supplied with the input signal XA, the drain is connected to the output terminal Y and the body is supplied with the input signal XB. The pMOS transistor M44 has a structure such that the source is connected to the power supply terminal Vcc, the gate is supplied with the complementary signal /XA of the input signal XA, the drain is connected to the output terminal Y and the body is supplied with the complementary signal /XB of the input signal XB.

A case will now be considered in which both of the pMOS transistors M43 and M44 have the characteristic indicated in the portion (17) shown in FIG. 20. When both of the input signals XA and XB are logic 0, the nMOS transistors M39 and M40 and the pMOS transistor M44 are cut off. The pMOS transistor M43 is made to be conductive. As a result, logic 1 is transmitted to the output terminal Y. When input signal XA is logic 0 and XB is logic 1, the nMOS transistor M39 and pMOS transistors M43 and M44 are cut off and the nMOS transistor M40 is made to be conductive. As a result, logic 0 is transmitted to the output terminal Y. When the input signal XA is logic 1 and XB is logic 0, the nMOS transistor M40 and the pMOS transistors M43 and M44 are cut off and the nMOS transistor M39 is made to be conductive. As a result, logic 0 is transmitted to the output terminal Y. When both of the input signals XA and XB are logic 1, the nMOS transistors M39 and M40 and the pMOS transistor M43 are cut off and the pMOS transistor M44 is made to be conductive. As a result, logic 1 is transmitted to the output terminal Y.

As described above, a dual-input EXNOR gate can be realized by four elements. Note that this embodiment may be arranged such that inputs for the gate and the body of the pMOS transistor M43 are interchanged or those for the gate and the body of the pMOS transistor M44 are interchanged. The present invention can effectively be applied to their combination.

Twelfth Embodiment

An embodiment of an EXOR gate is shown in FIGS. 34A to 34D.

FIG. 34A shows a 2-rail 2-input EXOR gate formed by two nMOS transistors and one resistance element. A nMOS transistor M45 has a structure such that the drain is connected to the power supply terminal Vcc, the gate is supplied with the input signal XA, the source is connected to the node N and the body is supplied with the input signal XB. The nMOS transistor M46 has a structure such that the drain is connected to the node N, the gate is supplied with the complementary signal /XA of the input signal XA, the source is connected to the output terminal Y, the body is supplied with the complementary signal /XB of the input signal XB and the resistance element 15 is connected between the ground terminal Vss and the output terminal Y.

Figures 5A, 5B:
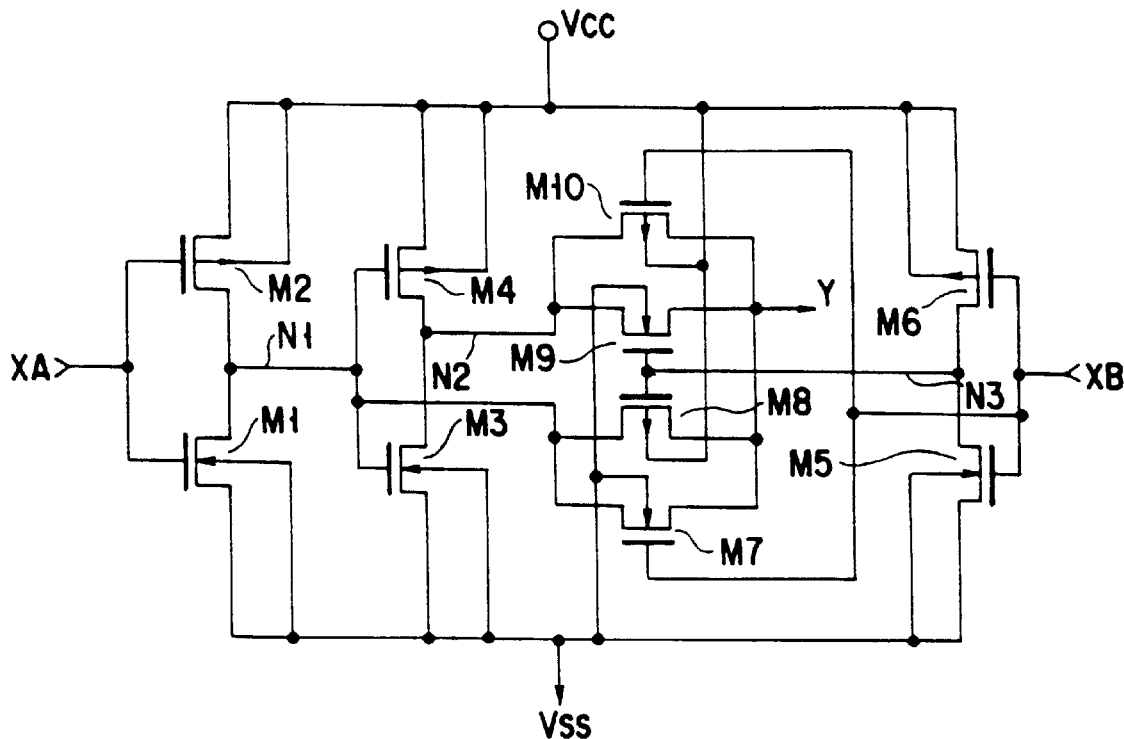
FIGS. 5A and 5B respectively show a conventional dual-input EXOR gate and a truth table.

The operation to be performed when both of the nMOS transistors M45 and M46 have the characteristic indicated in the portion (16) shown in FIG. 20 will now be described with the truth table shown in FIG. 5B. When both of the input signals XA and XB are logic 0, the nMOS transistor M45 is cut off and M46 is made to be conductive. As a result, the output terminal Y is discharged by the resistance element 15 so that logic 0 is transmitted. When the input signal XA is logic 0 and XB is logic 1, the threshold voltage of the nMOS transistor M45 is $V_{T1}$ and that of the nMOS transistor M46 is $V_{T0}$. Since $V_{T1}$<Vss though the gate-source voltage of the nMOS transistor M45 is Vss, the nMOS transistor M45 is made to be conductive. Since the gate-source voltage of the nMOS transistor M46 is Vcc, the nMOS transistor M46 is made to be conductive. When series on-state resistance of the nMOS transistors M45 and M46 is smaller than the resistance of the resistance element 15 at this time, logic 1 is transmitted to the output terminal Y. When the input signal XA is logic 1 and XB is logic 0, the threshold voltage of the nMOS transistor M45 is $V_{T0}$ and that of the nMOS transistor M46 is $V_{T1}$. Since the gate-source voltage of the MOS transistor M45 is Vcc, the nMOS transistor M33 is made to be conductive. Since $V_{T1}$<Vss though the gate-source voltage of the nMOS transistor M46 is Vss, the nMOS transistor M46 is made to be conductive. When the series on-state resistance of the nMOS transistors M45 and M46 is smaller than the resistance of the resistance element 15, logic 1 is transmitted to the output terminal Y. When both of the input signals XA and XB are logic 1, the nMOS transistor M45 is made to be conductive and M46 is cut off. As a result, the output terminal Y is discharged by the resistance element 15 so that logic 0 is transmitted.

As described above, a dual-input EXOR gate can be realized by three element. Note that this embodiment may be arranged such that the inputs for the gate and the body of the nMOS transistor M45 are interchanged or those for the gate and the body of the nMOS transistor M46 are interchanged. By making the output terminal Y to be Sum signal and the node N to be a carry signal, a half adder can be realized.

FIG. 34B shows a 2-rail 2-input EXOR gate formed by two nMOS transistors and one resistance element. The nMOS transistor M47 has a structure such that the source is connected to the output terminal Y, the gate is supplied with the input signal XA, the drain is connected to the power supply terminal Vcc and the body is supplied with the complementary signal /XB of the input signal XB. The nMOS transistor M48 has a structure such that the source is connected to the output terminal Y, the gate is supplied with the complementary signal /XA of the input signal XA, the drain is connected to the power supply terminal Vcc, the body is supplied with the input signal XB and the resistance element 15 is connected between the ground terminal Vss and the output terminal Y.

A case will now be considered when both of the nMOS transistors M47 and M48 have the characteristic indicated in the portion (17) shown in FIG. 20. When both of the input signals XA and XB is logic 0, the threshold voltage of the nMOS transistor M47 is $V_{T1}$ and that of the nMOS transistor M48 is $V_{T0}$. Since the gate-source voltage is Vss, the nMOS transistor M47 is cut off. Since $V_{T0}$<Vcc though the gate-source voltage of the nMOS transistor M48 is Vcc, the nMOS transistor M48 is cut off. As a result, the output terminal Y is discharged by the resistance element 15 so that logic 0 is transmitted. When the input signal XA is logic 0 and XB is logic 1, the nMOS transistor M47 is cut off and M48 is made to be conductive. When the on-state resistance of the nMOS transistor M48 is smaller than the resistance of the resistance element 15, logic 1 is transmitted to the output terminal Y.

When the input signal XA is logic 1 and XB is logic 0, the nMOS transistor M47 is made to be conductive and M48 is cut off. When the on-state resistance of the nMOS transistor M48 is smaller than the resistance of the resistance element 15, logic 1 is transmitted to the output terminal Y. When both of the input signals XA and XB is logic 1, the threshold voltage of the MOS transistor M47 is $V_{T0}$ and that of the MOS transistor M48 is $V_{T1}$. Since $V_{T0}$>Vcc though the gate-source voltage is Vcc, the nMOS transistor M47 is cut off. Since the gate-source voltage is Vss, the nMOS transistor M48 is cut off. As a result, the output terminal Y is discharged by the resistance element 15 so that logic 0 is transmitted.

As described above, a dual-input EXOR gate can be realized by three elements. Note that this embodiment may be arranged such that the inputs for the gate and body of the nMOS transistor are interchanged and those for the gate and the body of the nMOS transistor M48 are interchanged. The present invention may be effectively applied to their combination.

FIG. 34C shows a dual-input EXOR gate formed by one NOR gate, two nMOS transistors and one resistance element. The NOR gate 18 are supplied with two input signals XA and XB and has output terminal N4. The NOR gate 18 may be the conventional NOR gate shown in FIG. 2A or the NOR gate according to the present invention shown in FIGS. 18, 22 and 23. The nMOS transistor M49 has a structure such that the drain is connected to the output terminal Y, the gate is connected to the node N4, the source is connected to the node N5 and the body is supplied with the input signal XA. The nMOS transistor M50 has a structure such that the drain is connected to the node N5, the gate is connected to the node N4, the source is connected to the ground terminal Vss, the body is supplied with the input signal XB and the resistance element 15 is connected between the power supply terminal Vcc and the output terminal Y.

The operation to be performed when both of the nMOS transistors M49 and M50 have the characteristic indicated in the portion (16) shown in FIG. 20 will now be described with reference to the truth table shown in FIG. 5B. When both of the input signals XA and XB are logic 0, the node N4 is logic 1 so that the nMOS transistors M49 and M50 are made to be conductive. When the series on-state resistance of the nMOS transistors M49 and M50 is smaller than the resistance of the resistance element 15, logic 0 is transmitted to the output terminal Y. When the input signal XA is logic 0 and XB is logic 1, the node N4 is logic 0, the threshold voltage of the nMOS transistor M49 is $V_{T0}$ and that of the nMOS transistor M50 is $V_{T1}$. Since $V_{T1}$<Vss though the gate voltage of the nMOS transistor M50 is Vss, the nMOS transistor M50 is made to be conductive. The nMOS transistor M49 is cut off because the gate voltage is Vss. As a result, the output terminal Y is charged by the resistance element 15 so that logic 1 is transmitted.

When the input signal XA is logic 1 and XB is logic 0, the node N4 is logic 0, the threshold voltage of the nMOS transistor M49 is $V_{T1}$ and that of the nMOS transistor M50 is $V_{T0}$. The nMOS transistor M50 is cut off because its gate voltage is Vss. Since $V_{T1}$<Vss though the gate voltage is Vss, the nMOS transistor M49 is made to be conductive. As a result, the output terminal Y is charged by the resistance element 15 so that logic 1 is transmitted. When both of the input signals XA and XB are logic 1, the node N4 is logic 0, the threshold voltages of the nMOS transistors M49 and M50 are $V_{T1}$. Since $V_{T1}$<Vss though the gate voltage is Vss, the nMOS transistors M49 and M50 are made to be conductive. When the series on-state resistance of the nMOS transistors M49 and M50 is smaller than the resistance of the resistance element 15, logic 0 is transmitted to the output terminal Y.

Therefore, when a gate consisting of two elements is employed as the NOR gate, a dual-input EXOR gate can be realized by five devices. By making the output terminal Y to be Sum signal and the node N to be a carry signal, a half adder can be realized.

FIG. 34D shows a dual-input EXOR gate formed by one NOR gate 18, two nMOS transistors and one resistance element. The nMOS transistor M49 has a structure such that the drain is connected to the output terminal Y, the gate is supplied with the input signal XA, the source is connected to the node N5 and the body is connected to the node N4. The nMOS transistor 50 has a structure such that the drain is connected to the node N5, the gate is supplied with the input signal XB, the source is connected to the ground terminal Vss, the body is connected to the node N4 and the resistance element 15 is connected between the power supply terminal Vcc and the output terminal Y.

The operation to be performed in the case where both of the nMOS transistors M49 and M50 have the characteristic indicated by the portion (16) shown in FIG. 20 will now be described with reference to a truth table shown in FIG. 5. When both of the input signals XA and XB are logic 0, the node N4 is logic 1 so that both of the MOS transistors M49 and M50 are made to be conductive. When the series on-state resistance of the nMOS transistors M49 and M50 is smaller than the resistance of the resistance element 15, logic 0 is transmitted to the output terminal Y. When the input signal XA is logic 0 and XB is logic 1, the node N4 is logic 0, the threshold voltage of the nMOS transistor M49 is $V_{T0}$ and that of the nMOS transistor M50 is $V_{T1}$. Since $V_{T1}$<Vss though the gate voltage of the nMOS transistor M50 is Vss, the nMOS transistor M50 is made to be conductive. Since the gate voltage of the nMOS transistor M49 is Vss, the nMOS transistor M49 is cut off. As a result, the output terminal Y is charged by the resistance element 15 so that logic 1 is transmitted.

When the input signal XA is logic 1 and XB is logic 0, the node N4 is logic 0, the threshold voltage of the nMOS transistor M49 is $V_{T1}$ and that of the nMOS transistor M50 is $V_{T0}$. The nMOS transistor M50 is cut off because its gate voltage is Vss. Since $V_{T1}$<Vss though the gate voltage of the MOS transistor M49 is Vss, the MOS transistor M49 is made to be conductive. As a result, the output terminal Y is charged by the resistance element 15 so that logic 1 is transmitted. When both of the input signals XA and XB are logic 1, the node N4 is logic 0 and the threshold voltages of the nMOS transistors M49 and M50 are $V_{T1}$. Since $V_{T1}$<Vss though the gate voltage is Vss, the nMOS transistors M49 and M50 are made to be conductive. When the series on-state resistance of the nMOS transistors M49 and M50 is smaller than the resistance of the resistance element 15, logic 0 is transmitted to the output terminal Y.

Therefore, when a gate consisting of two elements is employed as the NOR gate, a dual-input EXOR gate can be realized by five devices. By making the output terminal Y to be Sum signal and the node N to be a carry signal, a half adder can be realized.

Though the dual-input NAND gate, 4-input NAND gate, dual-input AND gate, 4-input AND gate, dual-input NOR gate, 4-input NOR gate, dual-input OR gate and 4-input OR gate have been described in the foregoing embodiments, the foregoing structure may be extended to n-input (n is a natural number not less than five). Although the embodiment of the dual-input EXNOR gate and the dual-input EXOR gate have been described, the foregoing structure may be applied to m-input (m is a natural number not less than three). Moreover, the present invention may be applied to a pass gate logic. By combining the foregoing structures, a variety of logic circuits can be formed. By combining the characteristics indicated in the portions (16) and (17) shown in FIG. 20 with the plural MOS transistors forming one logic circuit, a variety of logic circuits can be formed.

FIG. 35 is a diagram showing a buffer circuit according to a thirteenth embodiment of the present invention. A pMOS transistor Mp1 and a nMOS transistor Mn1 form a first inverter I1. Similarly, Mp2 and Mn2 form a second inverter I2, and Mp3 and Mn3 form a third inverter.

Each of the sources of Mp1 to Mp3 is connected to a power supply terminal (Vcc), and each of the sources of Mn1 to Mn3 is connected to a ground terminal (Vss). Gates of Mp1 to Mn1 are commonly connected to input terminals and drains of the same are commonly connected to node N1. Gates of Mp2 and Mn2 are commonly connected to the node N1 and drains of the same are commonly connected to node N2. Gates of Mp3 and Mn3 are commonly connected to the node N2 and drains of the same are commonly connected to an output terminal. Note that symbol CL represents a load capacitance.

Figure 6:
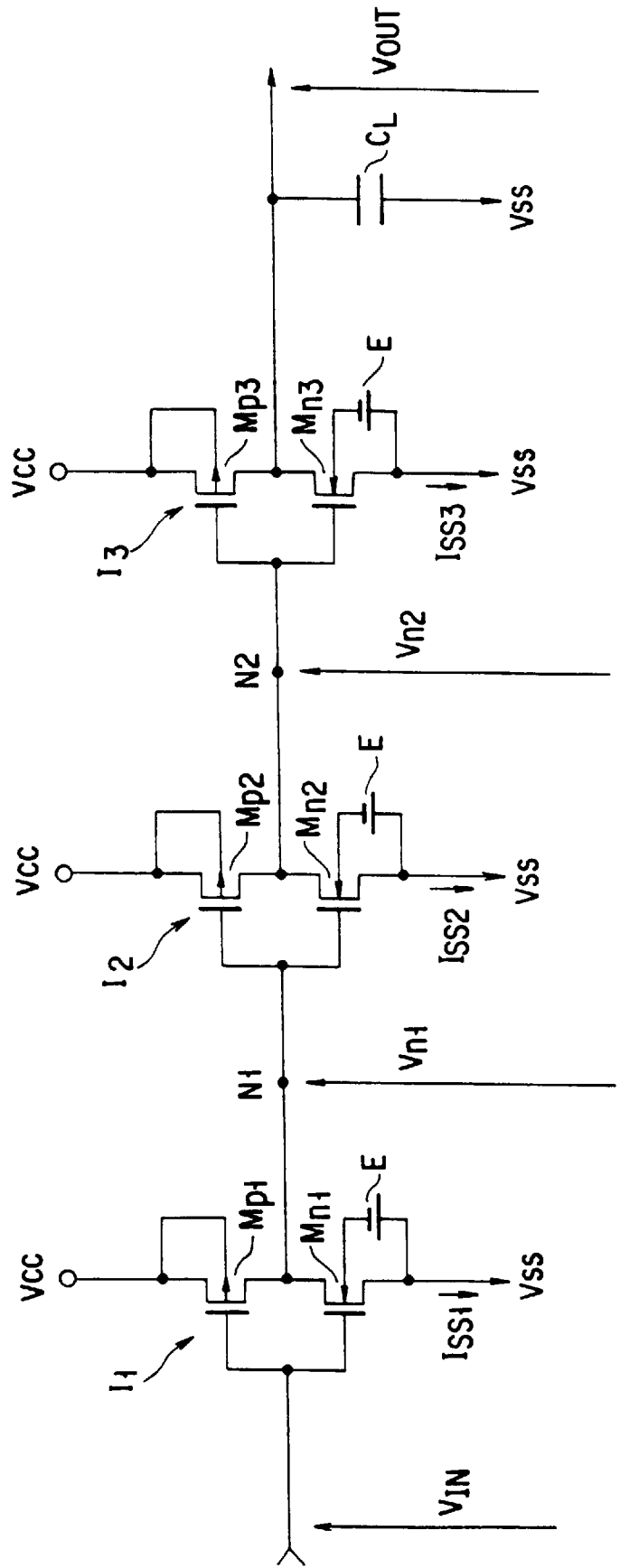
FIG. 6 is a diagram showing a conventional buffer circuit composed of three inverter circuits.

Although the foregoing basic structure is the same as that of the conventional example shown in FIG. 6, this embodiment has a structure such that the potential to be supplied to the bulk of each MOS transistor of the inverter I3 is changed. Specifically, each MOS transistor forming the buffer circuit is formed on a SOI substrate by employing the known SOI technique. Therefore, the bulk regions of the transistor are separated from one another. An input terminal of the inverter I1 is connected to a n-type region, which is the bulk of Mp3 and a p-type region, which is the bulk of Mn3.

The n-type region, which is the bulk of Mp1 and Mp2 is supplied with supply voltage Vcc similarly to the conventional structure. The p-type region, which is the bulk of Mn1 and Mn2 is supplied with gate voltage Vss or negative voltage similarly to the conventional structure.

Figure 7A:
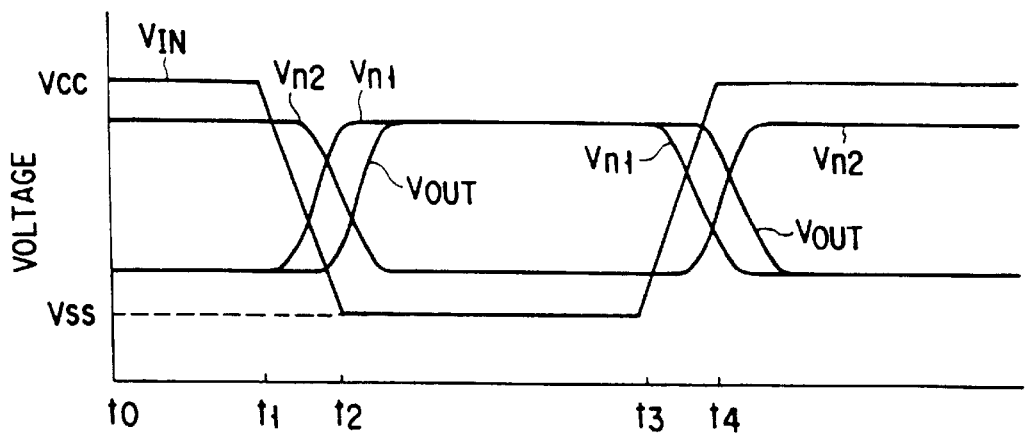
FIGS. 7A and 7B are operation waveform graphs for explaining the operation of the buffer circuit shown in FIG. 6.
Figure 7B:
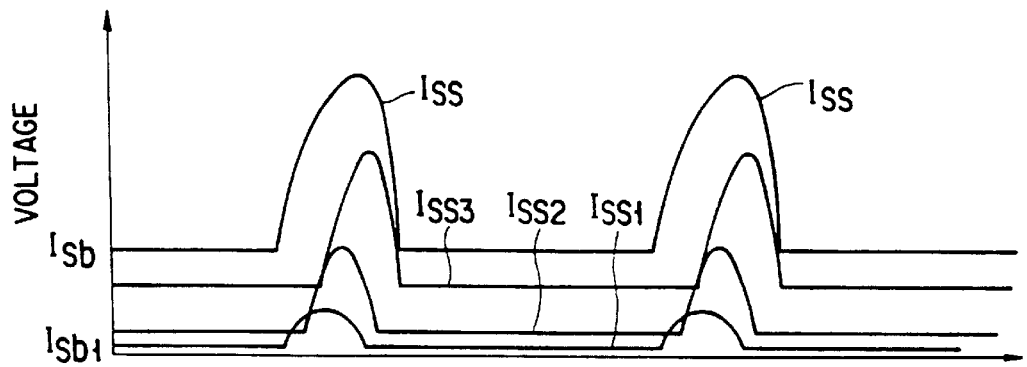
Figure 36A:
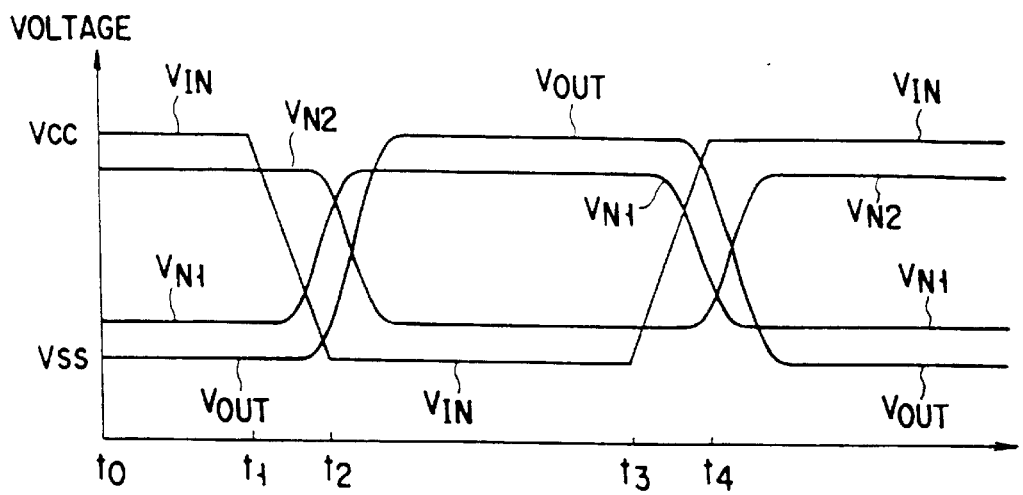
FIGS. 36A to 36C are operation waveform graphs for explaining the operation of the circuit shown in FIG. 35.
Figure 36B:
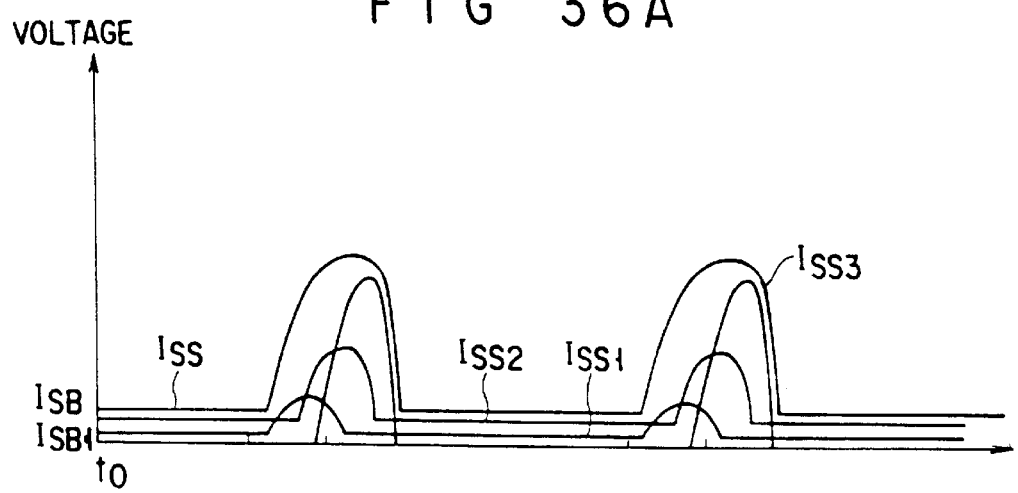
Figure 36C:
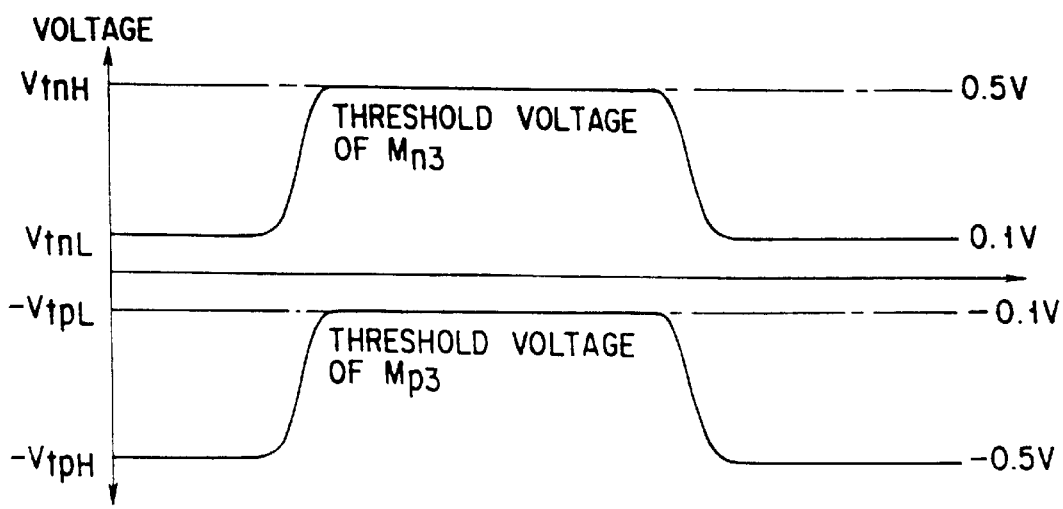

The operation of the foregoing circuit will now be described with reference to operation waveforms shown in FIGS. 36A to 36C. Since Mn1, Mn2, Mp1, Mp2, Vn1 and Vn2 are basically the same as those shown in FIGS. 7A and 7B, they are omitted from detailed description.

An assumption is performed that the supply voltage is 0.5V and the gate voltage is 0V. Since input voltage Vin from t0 to t1 is 0.5V, the level of Vout is lowered. Since a forward bias acts between the bulk and the source of Mn3 at this time, the threshold voltage of Mn3 is lowered. An assumption is performed that the threshold voltage VtnL is, for example, 0.1V. The voltage between the bulk and the source of Mp3 is 0V. An assumption is performed that absolute value VtpH of Mp3 at this time is, for example, 0.5V. In the foregoing case, Mn3 is made to be conductive and Mp3 is completely cut off. Therefore, Iss3 does not substantially flow and the output voltage Vout is made to be 0V.

While indicating a leak current (sub-threshold current), which flows into the inverter I1, by Isb1, Iss1=Isb1. Since the sub-threshold current is in proportion to the gate width, Iss2=3×Isb1. In the conventional structure, the leak current, which flows into the inverter I3 and which is expressed as Iss3=9×Isb1, is too large to reduce power consumption. Employment of the structure according to this embodiment in which Mp3 is completely cut off is able to make Iss3 to be substantially zero. Therefore, the standby current Isb, which flows at this time, can be reduced to 4/13 of the current which flows in the conventional structure.

When lowering of Vin has been commenced in a period of time from t1 to t2, a forward bias takes place between the bulk and the source of Mp3, the absolute value of the threshold voltage is reduced. An assumption is performed that the absolute value VtpL of the threshold voltage at this tie is, for example, 0.1V. Since the voltage between the bulk and the source of Mn3 approaches 0 v, the threshold voltage is raised. An assumption is performed that the threshold voltage VtnH is, for example, 0.5V, at this time. In the foregoing case transition of Mn3 to the non-conductive state takes place. If Vn2 has been made to be 0.4V or lower, Mp3 is made to be conductive. Therefore, transition of Vout the high level is performed.

In period of time from t2 to t3, Vin is in a standby mode in which Vin is a constant value of 0V. The level of Vn2 is lowered. At this time, the absolute value of the threshold voltage of Mp3 is 0.1V and that of Mn3 is 0.5V. In the foregoing case, Mp3 is made to be conductive and Mn3 is completely cut off. Therefore, also the standby current Isb, which flows at this time, is only the sum of Iss1 and Iss2. Thus, the standby current can be reduced to 4/13 of the standby current which flows in the conventional structure.

When transition of Vin from 0V to 0.5V has been performed in a period of time from t3 to t4, the voltage between the bulk and the source of Mp3 is made to be 0V and the absolute value of the threshold voltage is raised from 0.1V to 0.5V. Since a forward bias acts between the bulk and the source of Mn3, the threshold voltage is lowered from 0.5V to 0.1V. Therefore, when transition of Vn2 from 0V to 0.5V takes place, Mp 3 is made to be non-conductive. When Vn2 has been raised to be higher than 0.1V, Mn3 is made to be conductive. Thus, Vout is made to be 0V.

As described above, this embodiment has the structure such that the bulk voltage of Mn3 and Mp3 forming the third inverter is controlled so as to enable the drive capability to be set to an excellent state by previously lowering the threshold voltage. Thus, the third inverter can be operated at high speed. Since the threshold voltage can be raised when cutting off is performed, the sub-threshold current of Mn3 and Mp3 can be made to be substantially zero. Thus, the sub-threshold current can be reduced to 4/13 of that which flows in the conventional structure.

FIG. 37 shows a buffer circuit according to a fourteenth embodiment of the present invention. The common elements to those shown in FIG. 35 are given the same reference numerals and the common elements are omitted from detailed description.

This embodiment is different from the thirteenth embodiment in that the bulks of the MOS transistors of the inverters I1 and I2 are connected to respective inputs. Specifically, the bulks of MOS transistors Mp1 and Mn1 of the inverter I1 are connected to the input terminal, while the bulks of the MOS transistors Mp2 and Mn2 of the inverter I2 are connected to the node N1.

Figure 38A:
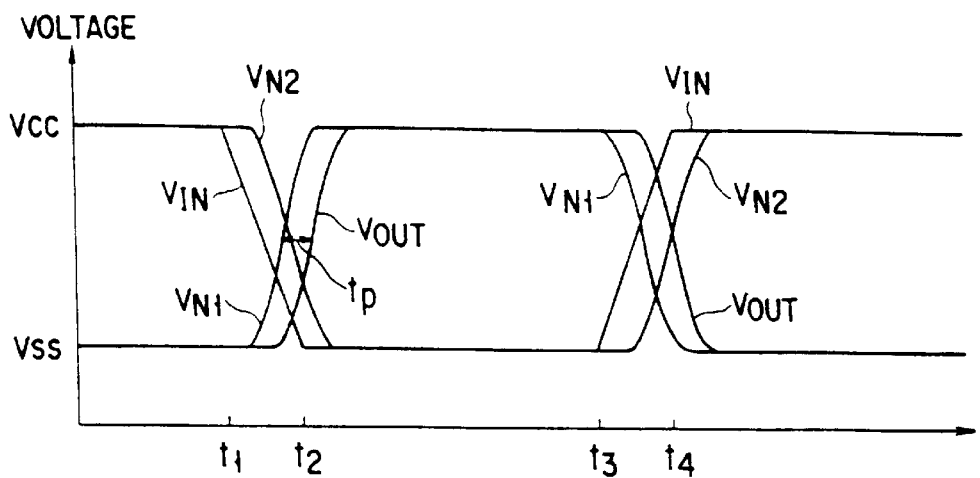
FIGS. 38A to 38C are operation waveform graphs for explaining the operation of the circuit shown in FIG. 37.
Figure 38B:
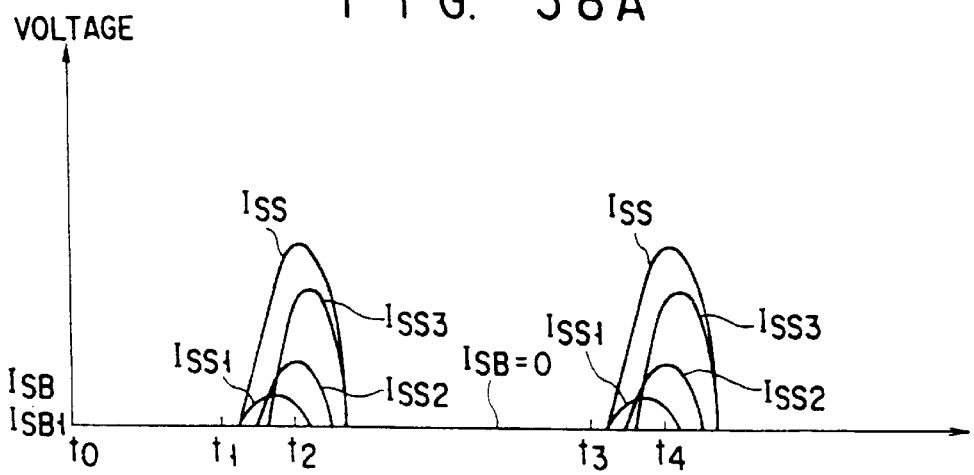
Figure 38C:
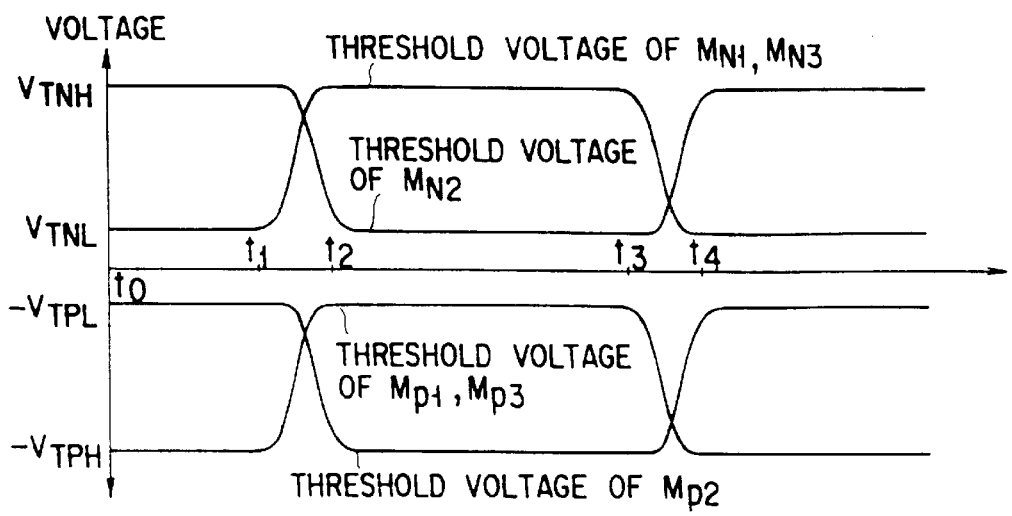

As a result of the foregoing structure, as shown in timing charts shown in FIGS. 38A to 38C, the threshold voltages of Mn1, Mn2, Mp1 and Mp2 are changed in accordance with the input voltage. Since also Vn1 and Vn2 performs a total amplitude operation, the gate-source voltage of Mn2, Mn3, Mp2 and Mp3 is enlarged. Thus, the total delay time tp of inverters I2 and I3 can be reduced as compared with the conventional structure. Since Iss1 and Iss2 do not substantially flow in the standby mode, the standby current can further be reduced.

Figure 39A:
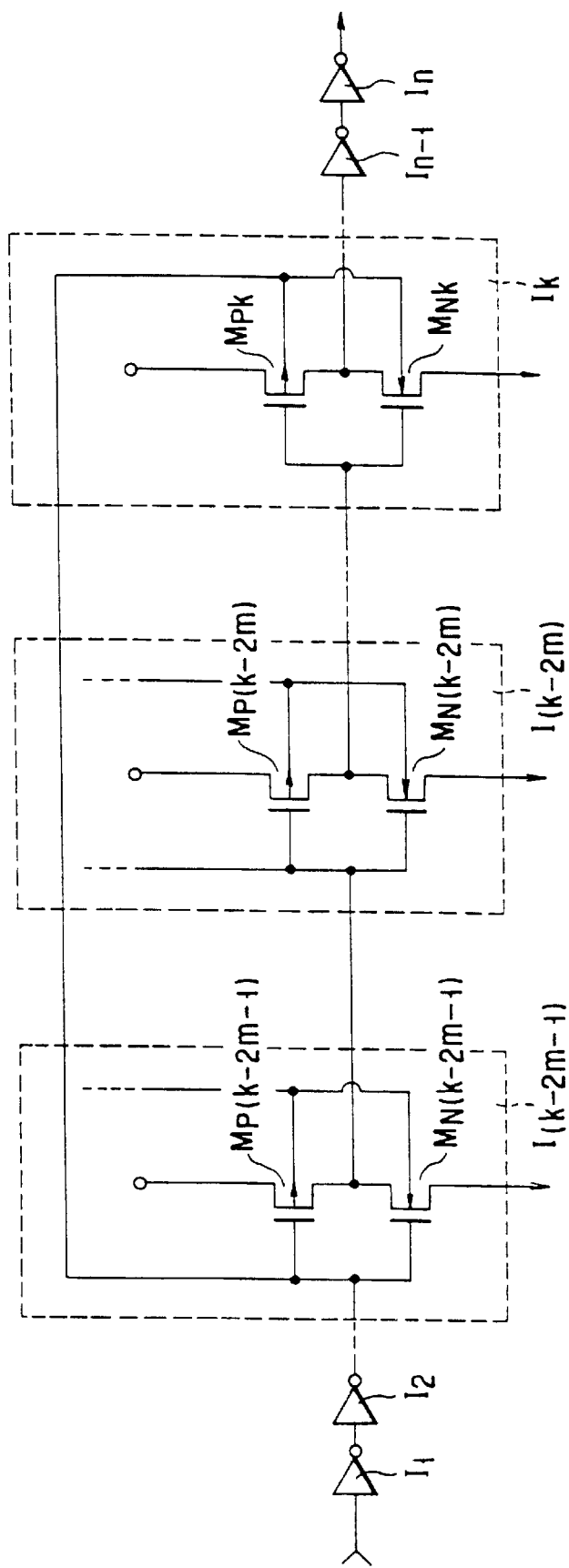
FIGS. 39A and 39B are circuit diagram showing a buffer circuit according to a fifteenth embodiment of the present invention.
Figure 39B:
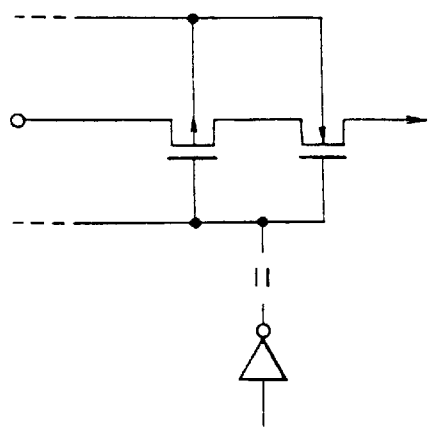

FIGS. 39A and 39B show a buffer circuit according to a fifteenth embodiment of the present invention. The buffer circuit according to this embodiment is formed by three or more inverters.

In the case where the buffer circuit is formed by three or more inverters array, the bulk of the MOS transistors forming the k-th ($\geq 3$) inverter $I_k$ is required to be connected to an input terminal of an inverter $I_k-2m$ (m=1,2, ... , where $2m \geq k-1$). Also in the foregoing case, the bulk of the MOS transistor forming inverters, for example, $I_k-1$ and $I_k-2$ except the k-th inverter $I_k$, may be connected to each input.

FIGS. 40A and 40B show a buffer circuit according to a sixteenth embodiment of the present invention.

The circuit shown in FIG. 40A has a structure such that a NAND circuit 10 is connected to the input portion of the inverter array consisting of three or more inverters. Note that the NAND circuit 10 may be replaced by another logic circuit, such as a NOR circuit. The circuit shown in FIG. 40B has a structure such that a NAND circuit 20 is connected to the output portion of an inverter array consisting of three or more inverters. Also in the foregoing case, similar to the structure shown in FIG. 40A, another logic circuit, such as a NOR circuit, may be employed in place of the NAND circuit 20.

Logic circuits may be connected to both of the input and output portions. By combining the foregoing structures, a variety of circuits can be formed.

FIG. 41 is a circuit diagram showing a complementary logical gate according to a seventeenth embodiment of the present invention.

Symbols M3 and M4 represent nMOS transistors to which complementary signals IN and /IN are supplied, in which the sources are commonly connected to the ground terminal (Vss) and complementary signals OUT and /OUT are transmitted from the drains. Symbols M1 and M2 represents pMOS transistors having gates cross-connected to OUT and /OUT, in which the sources are commonly connected to the power supply terminal (Vcc) and the drains are respectively connected to OUT and /OUT.

Figure 8:
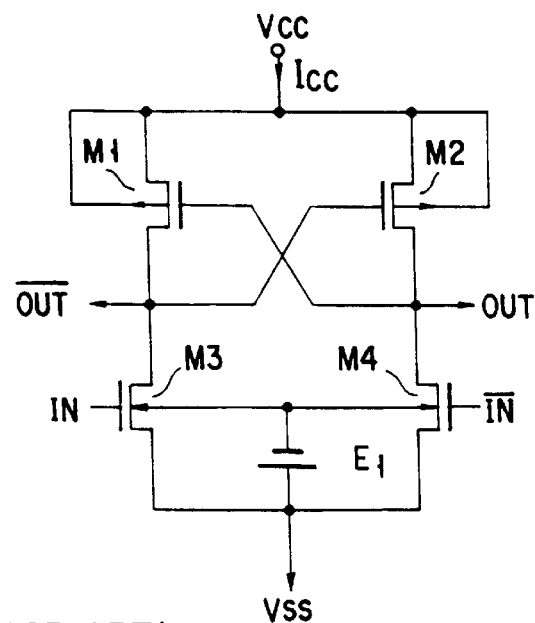
FIG. 8 is a diagram showing a conventional complementary type logical gate using MOS transistors.
Figure 9A:
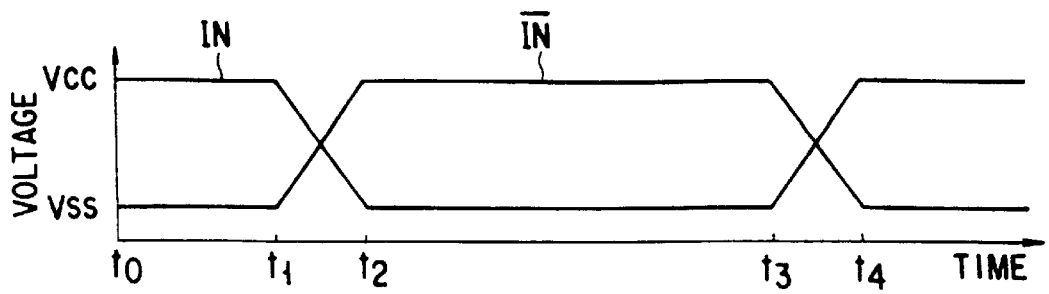
FIGS. 9A to 9C are operation waveform graphs for explaining the operation of the circuit shown in FIG. 8.
Figure 9B:
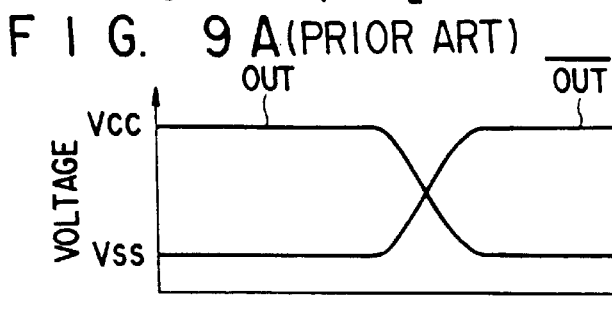
Figure 9C:
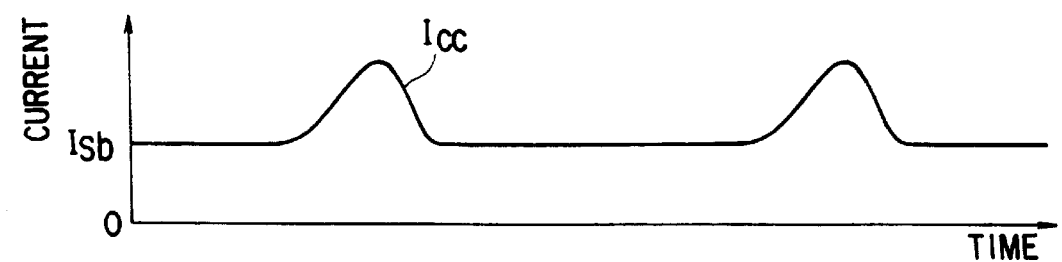
Figure 10:
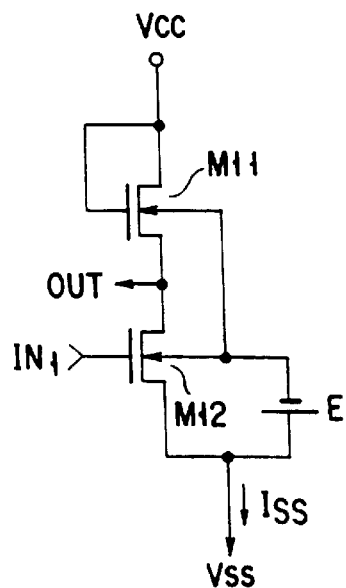
FIG. 10 is a diagram showing a conventional inverter circuit formed by nMOS transistors.
Figures 11A, 11B, 11C:
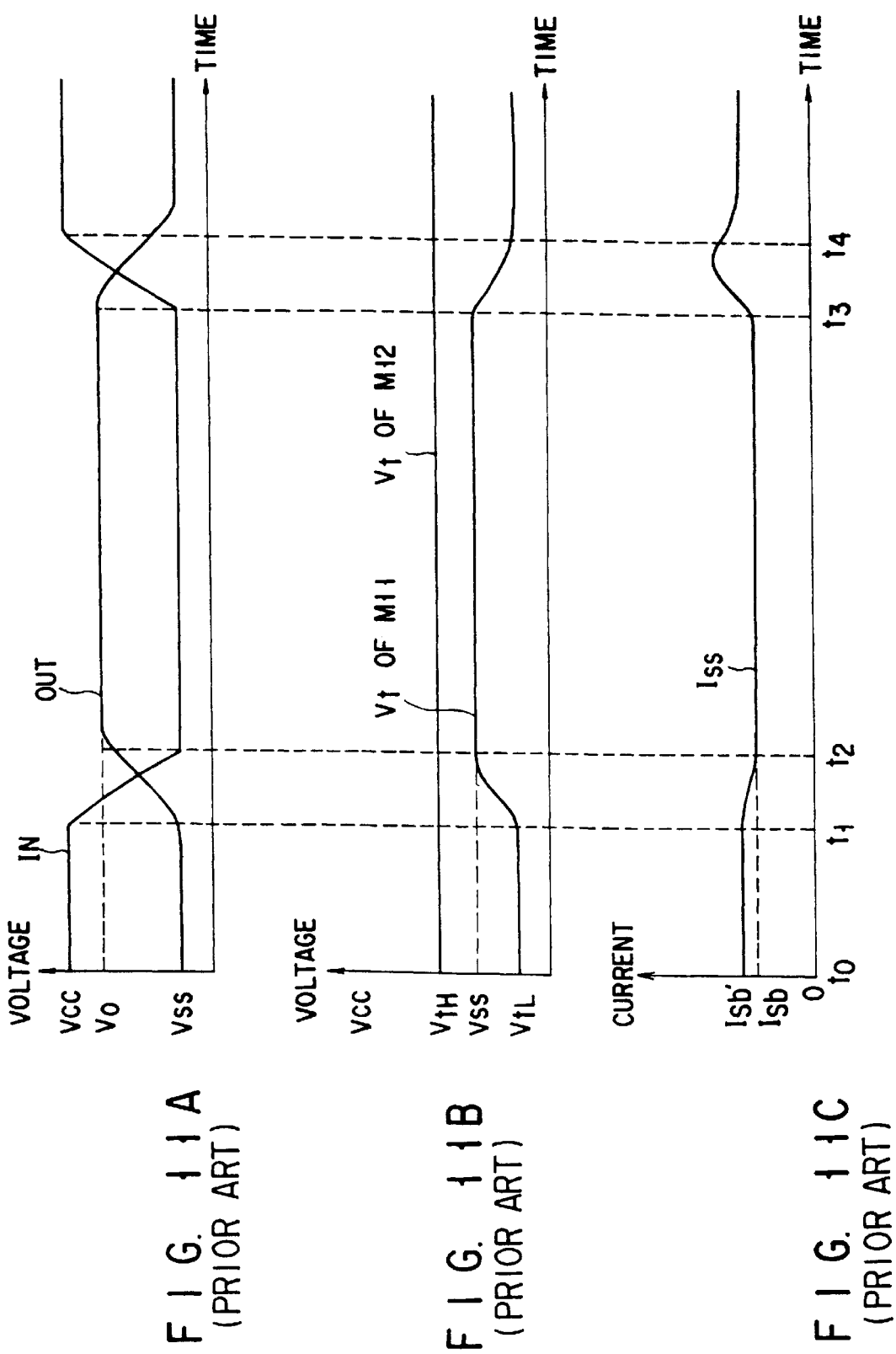
FIGS. 11A to 11C are operation waveform graphs for explaining the operation of the circuit shown in FIG. 10.
Figure 12:
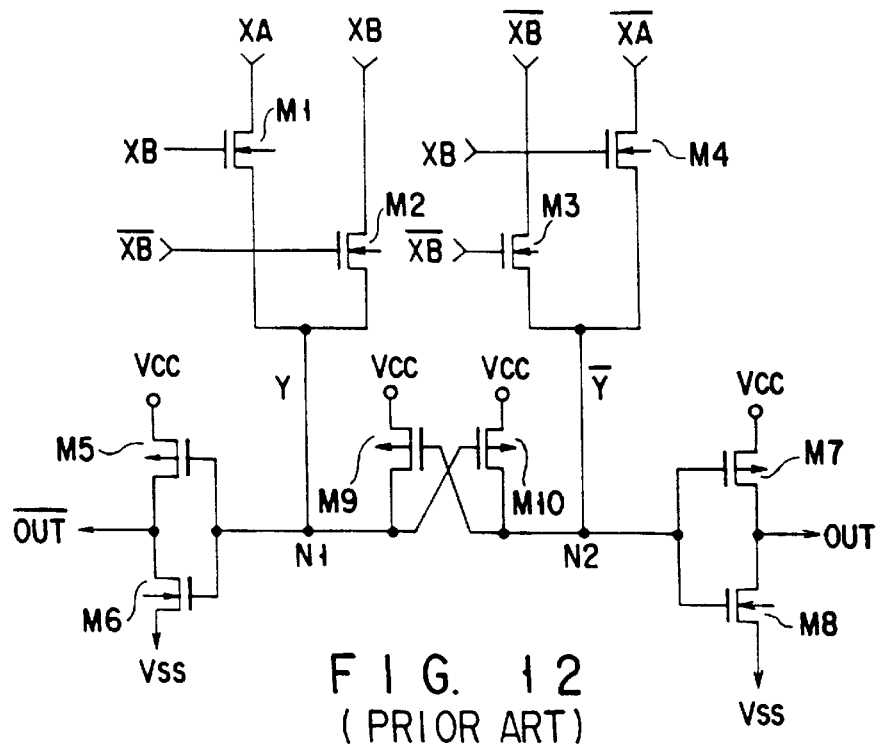
FIG. 12 is a circuit diagram showing a dual-input AND/NAND gate employing a conventional pass-transistor logic.
Figure 13:
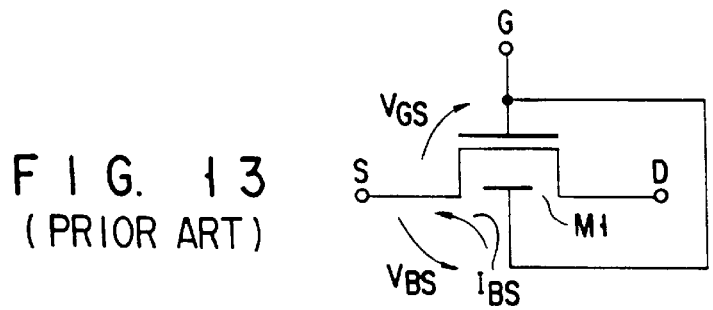
FIG. 13 is a diagram showing a conventional nMOS transistor in which the gate and the body are directly connected to each other.
Figure 14:
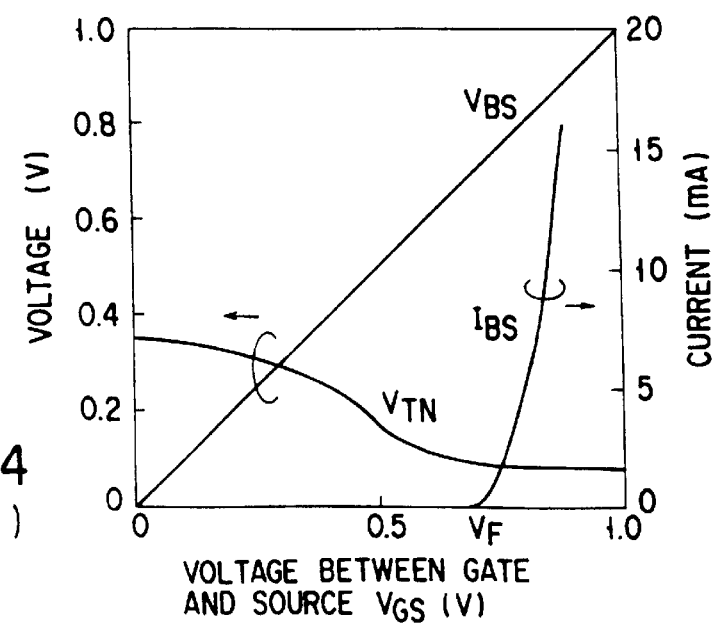
FIG. 14 is a graph showing a DC characteristic of the body-source voltage, the threshold voltage and body-source current with respect to the gate-source voltage.

The foregoing basic structure is the same as that of the conventional structure shown in FIG. 8. In this embodiment, the potential to be applied to the bulk of each transistor is changed. Specifically, the MOS transistors M1 to M4 are formed on a SOI substrate by using a known SOI technique and all of the bulk regions are separated from one another. The bulks of M1 and M3 are connected to the input terminals to which the signal IN is supplied, while M2 and M4 are connected to input terminals to which the signal /IN is supplied.

Referring to FIGS. 42A to 42C, the operation of the complementary logical gate according to this embodiment will now be described. The signals IN and /IN are complementary signals having an amplitude between the supply voltage Vcc and the gate voltage Vss. The supply voltage Vcc is set to be 0.5V and the gate voltage Vss is set to be 0V.

Since IN is 0.5V and /IN is 0V in a period of time from t0 to t1, a substrate bias effect makes threshold voltage VtnL of the nMOS transistor M3 to be lower than absolute value VtnH of the threshold voltage of the nMOS transistor M4. When VtnL is 0.1V and VtnH is 0.5V, M3 is turned on and M4 is turned off and the sub-threshold current does not substantially flow in M4.

On the other hand, the absolute value VtpH of the threshold voltage of the pMOS transistor M1 is larger than the absolute value VtpL of the threshold voltage of the pMOS transistor M2. Therefore, substantially no sub-threshold current flows in M1. As a result, substantially no short circuit current flows so that Isb is reduced.

In a period of time from t1 to t2, since transitions of IN and /IN take place, all of the MOS transistors are turned on so that Icc flows.

In a period of time from t2 to t3, IN is 0V and /IN is 0.5V. Therefore, the absolute value of the threshold voltage of M1 is made to be VtpH, that of M2 is made to be VtpL, the threshold voltage of M3 is made to be VtnL and the threshold voltage of M4 is made to be VtnH. Therefore, M1 is turned on, M2 is turned off, M3 is turned off, and M4 is turned on so that sub-threshold currents in M2 and M3 are reduced.

In a period of time from t3 to t4, transitions of IN and /IN take place so that all of the MOS transistors are turned on and, therefore, Icc flows.

As described above, according to this embodiment, the bulks of M1 and M3 are connected to the input terminal for receiving IN and the bulks of M2 and M4 are connected to the input terminal for receiving /IN so that the threshold voltage of the MOS transistor to be turned on is lowered. On the other hand, the threshold voltage of the MOS transistor, which is turned off, can be raised. By lowering the threshold voltage of the MOS transistor which is turned on, the drive capability can be improved. By raising the threshold voltage of the MOS transistor, which is turned off, the standby current can be reduced. Thus, a high speed and low current consumption circuit can be realized.

FIG. 43 shows a modification of the seventeenth embodiment in which a delay circuit 0 is inserted between input signals IN and /IN and the substrate to shift the operation timing between the gate and the substrate potential. In the foregoing case, inputs IN and /IN are, by the delay circuit 70, delayed by delay time τ and supplied to the MOS transistors M3 and M4 respectively. As a result, the substrate potential of each of the MOS transistors M1, M2, M3 and M4 is controlled before the MOS transistor M3 or M4 is operated.

FIG. 44 is a circuit diagram showing an n-input complementary gate according to an eighteenth embodiment of the present invention.

The source of a first pMOS transistor M1 is connected to a power supply terminal (Vcc); the gate and the bulk (the substrate region) are connected to a first output node /OUT; and the source is connected to a second output node (/OUT). The source of the second pMOS transistor M2 is connected to Vcc; the gate and the bulk are connected to a second output node; and the source is connected to a first output node. A first input circuit 30 for receiving a plurality of signals IN (1, 2, ..., n) is inserted between the first output node and Vss. Between the second output node and Vss, there is inserted a second input circuit 40 for receiving the complementary signal /IN of the input signal IN.

As described above, the bulk potentials of the pMOS transistors MI and M2 are connected to the corresponding gates. When M1 is cut off, OUT is Vcc=0.5V and /OUT is Vss=0V. Since the voltage Vbs between the bulk and the source of M1 is 0V at this time, the threshold voltage is made to be −VtpH so that the sub-threshold current is small. On the other hand, since the voltage Vbs between the bulk and the source of M2 is −0.5V, the threshold voltage is made to be −VtpL so that M2 is turned on.

Examples of the input circuits 30 and 40 are shown in FIGS. 45A to 45C.

FIG. 45A shows a single input circuit formed by one nMOS transistor M5. The bulk of M5 is connected to the gate, which is an input, so that the threshold voltage at the time of cutting off is controlled to be VtnH and that at the time of turning on is controlled to be VtnL.

FIG. 45C shows an example in which two nMOS transistors M8 and M9 are connected in parallel so that dual-input OR circuit is structured. Also in this case, the bulks of M8 and M9 are connected to the respectively gates to control the threshold voltage at the time of cutting off to be VtnH and that at the time of turning on to be VtnL.

Although sine input and dual-input structures have been described, the threshold voltage of a circuit structured by combining the foregoing arrangements can be controlled by connecting the bulks to the respective gates.

Figure 46:
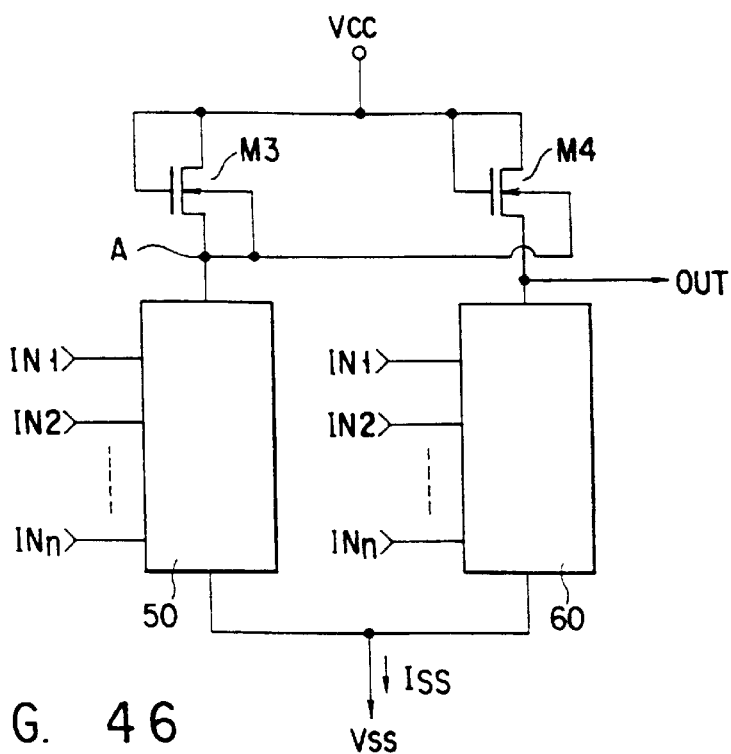
FIG. 46 is a circuit diagram showing a logical gate circuit according to a nineteenth embodiment of the present invention.

FIG. 46 is a circuit diagram showing a logical gate circuit according to a nineteenth embodiment of the present invention. The MOS transistors are formed on a SOI substrate by employing a known SOI technique. Therefore, all of the bulk regions of the respective transistors are separated from one another.

The gate of a depletion type nMOS transistor M3 is connected to a power supply terminal (Vcc) and the bulk is connected to node A, which is the source. The gate of a nMOS transistor M4 is connected to Vcc and the bulk of the same is connected to the node A. Between the source (the node A) and the ground terminal (Vss) of M3, there is inserted a first input circuit 50 for receiving a plurality of signals IN (1, 2, ..., n). Similarly, a second input circuit 60 for receiving the foregoing signal IN is inserted between the source and Vss of M4.

The input circuits 50 and 60 are structured as shown in FIGS. 45A to 45C. FIG. 45A shows a case where n=1 in which the bulk of the MOS transistor M5 is connected to the gate. FIG. 45B shows a structure in which two MOS transistors M6 and M7 are connected in series so that a dual-input AND circuit is structured, in which the bulk of M6 is connected to the gate of M6 and the bulk of M7 is connected to the gate of M7. FIG. 45C shows a structure in which two MOS transistors M8 and M9 are connected in parallel so that a dual-input OR circuit is structured. The bulk of M8 is connected to the gate of M8 and the bulk of M9 is connected to the gate of M9. Although the input circuits 50 and 60 have the same structure, the gate widths of the transistors may be different from each other.

The logical gate shown in FIG. 46 is operated in the same manner when input IN1 shown in FIG. 45A is high level, when both of IN1 and IN2 shown in FIG. 45B are high level and when at least either IN1 or IN2 shown in FIG. 45C is high level. When IN1 shown in FIG. 45A is low level, when at least either of IN1 or IN2 shown in FIG. 45B is low level and when both of IN1 and IN2 shown in FIG. 45C are low level, the logical gate shown in FIG. 46 is operated in the same manner.

Figure 47A:
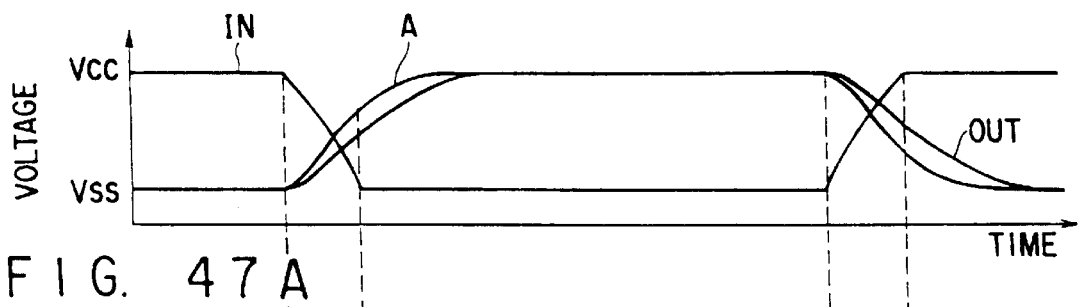
FIGS. 47A to 47C are operation waveform graphs for explaining the operation of the circuit shown in FIG. 46.
Figure 47B:
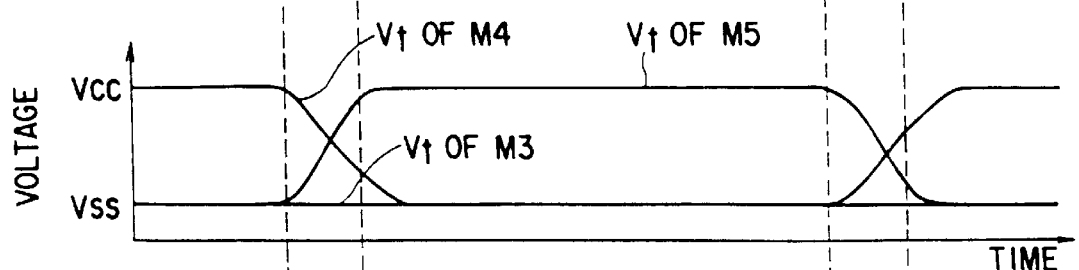
Figure 47C:

Referring to timing charts shown in FIGS. 47A to 47C, the operation of the logical gate in a case where the circuit shown in FIG. 46 will now be described. The supply voltage Vcc is, in the foregoing case, set to be 0.5V and gate voltage Vss is set to be 0V. Moreover, the input circuits 50 and 60 have the structures shown in FIG. 45A.

Since IN is 0.5V in a period of time from time t0 to t1, a 0.5V forward bias effects between the bulk and the source of the MOS transistor M5 of the input circuit 50 so that the threshold voltage is lowered as compared with the case where the voltage between the bulk and the source is 0V. The threshold voltage at this time is made to be 0V. The voltage between the bulk and the source of a depletion type transistor M3 is always 0V and the threshold voltage at this time is made to be 0V. The MOS transistor M5 is in a state where it is turned on, and also the MOS transistor M3 is in a state where it is turned on. In a case where the drive capability of M5 is considerably larger than M3, the node A is substantially Vss.

Since the MOS transistor M5 of the input circuit 60 is in a state where it is turned on, the output OUT is made to be Vss. At this time, the voltage between the bulk and the source is 0V similar to that of M3. The threshold voltage at this time is made to be Vcc. Thus, M4 is completely cut off and substantially no sub-threshold current flows.

When transition of IN from Vcc to Vss has been performed in a period of time from time t1 to t2, the voltage between the bulk and the source of M5 is made to be 0V. Therefore, the threshold voltage is raised to 0.5V. As a result, M5 is completely cut off. At this time, the node A is charged by M3 so that the potential of the node A is raised. As a result, the voltage between the bulk and the source of M4 is made to be forward bias so that the threshold voltage of M4 is lowered. Thus, M4 is brought to a state where it is turned on. As a result, the output OUT is substantially charged to about Vcc.

In a standby mode from time t2 to t3, no standby current flows because M5 has been completely cut off.

In a period of time from time t3 to t4, transition of IN from Vss to Vcc takes place so that M5 is turned on. Therefore, an current flows so that the node A and the output OUT are made to be Vss.

The logical gate according to this embodiment has the structure such that the depletion type transistor M3 is always turned on and the gate width of M3 is considerably smaller than that of M4 and M5 so that the standby current is reduced. Even if the load capacitance is enlarged, the gate width of M3 is not required to be enlarged.

Although the dual-input structure has been described with reference to FIGS. 45B and 45C, the present invention can effectively be applied to a multi-input AND or OR circuit having three or more inputs or to a structure formed by combining the foregoing arrangements.

FIG. 48 is a circuit diagram according to a twentieth embodiment of the present invention. FIG. 49 is a circuit diagram showing a twenty-first embodiment of the present invention.

The embodiment shown in FIG. 48 is different from that shown in FIG. 46 in that the bulk of the depletion type nMOS transistor M3 is connected to the output OUT. Also the foregoing logical gate is able to reduce the standby current without reduction in the operation margin.

The embodiment shown in FIG. 49 is different from that shown in FIG. 46 is that the depletion type nMOS transistor M3 is replaced by resistor R1. Also the foregoing logical gate is able to reduce the standby current without reduction in the operation margin.

As modifications of the input circuits according to the eighteenth embodiment to twenty-first embodiment shown in FIGS. 45A to 45C, a structure as shown in FIGS. 50A to 50C may be employed in which a delay circuit 70 is inserted between the input and the substrate of the nMOS transistor forming the input circuits 1 and 2.

Referring to FIG. 50A, input IN1 is delayed by the delay circuit 70 by delay time t and supplied to the MOS transistor M5. As a result, the substrate potential can be controlled before M5 is operated. In the structure shown in FIG. 50B, inputs IN1 and IN2 are delayed by the delay circuit 70 by delay time t and supplied to the MOS transistors M6 and M7, respectively. As a result, the substrate potential of each of M6 and M7 is controlled before M6 and M7 are operated. In the structure shown in FIG. 50C, inputs IN1 and IN2 are, by the delay circuit 70, supplied to the MOS transistors M8 and M9, respectively. As a result, the substrate potentials of M6 and M7 can be controlled before M6 and M7 are operated.

FIG. 51 is a circuit diagram showing a pass-transistor network and a buffer circuit according to a twenty-second embodiment of the present invention.

A pass-transistor network 1 receives 2n complementary signals IN1, /IN, ..., INn, /INn and transmits two complementary signals Y and /Y. The pMOS transistor M11 has a structure such that the source is connected to the supply voltage Vcc, the gate is connected to the output terminal OUT, the drain is connected to the output terminal /OUT, and the substrate region is connected to the output Y of the pass-transistor network 1. The pMOS transistor M12 has a structure such that the source is connected to Vcc, the gate is connected to the /OUT, the drain is connected to OUT and the substrate region is connected to the output /Y of the pass-transistor network 1. The nMOS transistor M13 has a structure such that the source is connected to the ground potential Vss, the gate and the substrate region are connected to the output Y and the drain is connected to /OUT. The nMOS transistor M14 has a structure such that the source is connected to Vss, the gate and the substrate region are connected to output /Y and the drain is connected to OUT. The transistors M11 to M14 are formed on the SOI substrate.

The circuit formed by the MOS transistors M11 to M14 is a 2-rail input buffer circuit which receives the complementary output signals Y and /Y of the pass-transistor network 1 and transmits the complementary signals OUT and /OUT.

The input capacitance of the foregoing 2-rail input buffer circuit is the gate capacitance and the substrate capacitance of the nMOS transistor M13 or M14 and the substrate capacitance of the pMOS transistor M11 or M12. However, the MOS transistor formed on the substrate has substantially no source and drain coupling capacitance, its substrate capacitance is substantially zero. Therefore, the input capacitance of the 2-rail input buffer circuit is only the gate capacitance of the nMOS transistor M13 or M14. As described above, the output load capacitance of the pass-transistor network 1 is smaller than that of a conventional buffer circuit formed by CMOS inverter. Therefore, the necessity of enlarging the gate width of the transistors for forming the pass-transistor network 1 can be eliminated. Thus, contribution can be made to reduce the area of the device and the power consumption.

FIGS. 52 to 71 are circuit diagrams showing examples of the pass-transistor network 1. FIG. 52 shows a dual-input logical product (AND). Specifically, the nMOS transistor M15 has a structure such that the drain receives the signal XA, the gate and the substrate region receives the signal XB and the source is connected to the output Y. The nMOS transistor M16 has a structure such that the drain receives the signal XB, the gate and the substrate region receives the complementary signal /XB and the source is connected to the output Y.

When the input signal XB is logic 1, the nMOS transistor M15 is made to be conductive and the nMOS transistor M16 is non-conductive. As a result, the output Y has the same logic as that of the signal XA so that the output Y is logic 0 when XA is logic 0 and is logic 1 when XA is logic 1. Since the signal XB having logic 1 has been supplied to the substrate region of the MOS transistor M15 at this time, the threshold voltage of the MOS transistor M15 is lowered. Assuming that the threshold voltage is 0V, threshold drop does not take place when logic 1 is transmitted.

If the input signal XB is logic 0, the nMOS transistor M15 is non-conductive and the nMOS transistor M16 is conductive. As a result, the output node N1 has the same logic 0 as that of the signal XB. Specifically, in the foregoing AND circuit, logic 1 free from threshold drop is transmitted from the output Y when both of the input signals XA and XB are logic 1. In the case of the other combinations, logic 0 is transmitted.

FIG. 53 shows a dual-input NAND gate. Specifically, the nMOS transistor M17 has a structure such that the drain is supplied with signal /XA, the gate and substrate region is supplied with the signal XB and the source is connected to the output /Y. The nMOS transistor M18 has a structure such that the drain is supplied with the signal /XB, the gate and the substrate region are supplied with the signal /XB and the source is connected to the output /Y. Also in this structure, similarly to the foregoing structure, when both of the input signals XA and XB are logic 1, logic 0 is transmitted to the output Y. In the other cases, logic 1 without threshold drop is transmitted.

FIG. 54 shows a dual-input OR gate. Specifically, the nMOS transistor M19 has a structure such that the drain is supplied with the signal XA, the gate and the substrate region is supplied with the signal complementary signal /XB and the source is connected to the output Y. The nMOS transistor M20 has a structure such that the drain is supplied with the signal XB, the gate and the substrate region is supplied with the signal XB and the source is connected to the output Y. Also in this case, similarly to the foregoing structure, when both of the input signals XA and XB are logic 0, logic 0 is transmitted to the output Y. In the case of the other combinations, logic 1 without threshold drop is transmitted.

FIG. 55 shows a dual-input NOR gate. Specifically, the nMOS transistor M21 has a structure such that the drain is supplied with the signal /XA, the gate and the substrate region are supplied with the signal /XB and the source is connected to the output /Y. The nMOS transistor M22 has a structure such that the drain is supplied with the signal /XB, the gate and the substrate region are supplied with the signal XB and the source is connected to the output /Y. Also in this case, similarly to the foregoing structure, when both of the input signals XA and XB are logic 0, logic 1 without threshold drop can be transmitted to the output Y. In the case of the other combinations, logic 0 is transmitted.

FIG. 56 shows a dual-input EXOR gate. Specifically, the nMOS transistor M23 has a structure such that the drain is supplied with the signal XA, the gate and the substrate region are supplied with the signal /XB and the source is connected to the output Y. The nMOS transistor M24 has a structure such that the drain is supplied with the signal /XA, the gate and the substrate region are supplied with the signal XB and the source is connected to the output Y. Also in this case, similarly to the foregoing structure, when both of the input signals XA and XB are logic 0 or logic 1, logic 0 is transmitted to the output Y. In the case of the other combinations, logic 1 without threshold drop is transmitted.

FIG. 57 shows a dual-input EXNOR gate. Specifically, the nMOS transistor M25 has a structure such that the drain is supplied with the signal /XA, the gate and the substrate region are supplied with the signal /XB and the source is connected to the output /Y. The nMOS transistor M26 has a structure such that the drain is supplied with the signal XA, the gate and the substrate region are supplied with the signal XB and the source is connected to the output /Y. Also in this case, similarly to the foregoing structure, when both of the input signals XA and XB are logic 0 or logic 1, logic 1 without threshold drop can be transmitted to the output Y. In the case of the other combinations, logic 0 is transmitted.

FIG. 58 shows a 3-input AND gate. Specifically, the nMOS transistor M27 has a structure such that the drain is supplied with the signal XC, the gate and the substrate region are supplied with the signal XA and the source is connected to the node N1. The nMOS transistor M28 has a structure such that the drain is connected to the node N1, the gate and the substrate region are supplied with the signal XB and the source is connected to the output Y. The nMOS transistor M29 has a structure such that the drain is supplied with the signal XA, the gate and the substrate region are supplied with the signal /XA and the source is connected to the output Y. The nMOS transistor M30 has a structure such that the drain is supplied with the signal XB, the gate and the substrate region are supplied with the signal /XB and the source is connected to the output Y.

Also in this case, similarly to the foregoing structure, when all of the input signals XA, XB and XC are logic 1, logic 1 without threshold drop can be transmitted to the output Y. In the case of the other combinations, logic 0 is transmitted.

FIG. 59 shows a 3-input NAND gate. Specifically, the nMOS transistor M31 has a structure such that the drain is supplied with signal /XC, the gate and the substrate region are supplied with the signal XA and the source is connected to the node N2. The nMOS transistor M32 has a structure such that the drain is connected to the node N2, the gate and the substrate region are supplied with the signal XB and the source is connected to the output /Y. The nMOS transistor M33 has a structure such that the drain is supplied with the signal /XA, the gate and the substrate region are supplied with the signal /XA and the source is connected to the output /Y. The nMOS transistor M34 has a structure such that the drain is supplied with signal /XB, the gate and the substrate region are supplied with the signal /XB and the source is connected to the output /Y.

Also in this case, similarly to the foregoing structure, when all of the input signals XA, XB and XC are logic 1, logic 0 is transmitted to the output Y. In the case of the other combinations, logic 1 without threshold drop is transmitted.

FIG. 60 shows a 3-input OR gate. Specifically, the nMOS transistor M35 has a structure such that the drain is supplied with the signal XC, the gate and the substrate region are supplied with the signal /XA and the source is connected to the node N3. The nMOS transistor M36 has a structure such that the drain is connected to the node N3, the gate and the substrate region are supplied with the signal /XB and the source is connected to the output Y. The nMOS transistor M37 has the drain is supplied with the signal XA, the gate and the substrate region are supplied with the signal XA and the source is connected to the output Y. The nMOS transistor M38 has a structure such that the drain is supplied with the signal XB, the gate and the substrate region are supplied with the signal XB and the source is connected to the output Y.

Also in this case, similarly to the foregoing structure, when all of the input signals XA, XB and XC are logic 0, logic 0 is transmitted to the output Y. In the case of the other combinations, logic 1 without threshold drop is transmitted.

FIG. 61 shows a 3-input NOR gate. Specifically, the nMOS transistor M39 has a structure such that the drain is supplied with the signal /XC, the gate and the substrate region are supplied with the signal /XA and the source is connected to the node N4. The nMOS transistor M40 has a structure such that the drain is connected to the node N4, the gate and the substrate region are supplied with the signal /XB and the source is connected to the output /Y. Moreover, the nMOS transistor M41 has a structure such that the drain is supplied with the signal /XA, the gate and the substrate region are supplied with the signal XA and the source is connected to the output /Y. The nMOS transistor M42 has a structure such that the drain is supplied with the signal /XB, the gate and the substrate region are supplied with the signal XB and the source is connected to the output /Y.

Also in this case, similarly to the foregoing structure, when all of the input signals XA, XB and XC are logic 0, logic 1 without threshold drop can be transmitted to the output Y. In the case of the other combinations, logic 0 is transmitted.

FIG. 62 shows a 3-input EXOR/EXNOR gate. Specifically, the nMOS transistor M43 has a structure such that the drain is supplied with the signal XB, the gate and the substrate region are supplied with the signal XA and the source is connected to the node N5. The nMOS transistor M44 has a structure such that the drain is supplied with the signal /XB, the gate and the substrate region are supplied with the signal /XA and the source is connected to the node N5. The nMOS transistor M45 has a structure such that the drain is supplied with the signal XB, the gate and the substrate region are supplied with the signal /XA and the source is connected to the node N6. The nMOS transistor M46 has a structure such that the drain is supplied with the signal /XB, the gate and the substrate region are supplied with the signal XA and the source is connected to the node N6.

The nMOS transistor M47 has a structure such that the drain is connected to the node N5, the gate and the substrate region are supplied with the signal /XC and the source is connected to the output Y. The nMOS transistor M48 has a structure such that the drain is connected to the node N5, the gate and the substrate region are supplied with the signal XC and the source is connected to the output Y. The nMOS transistor M49 has a structure such that the drain is connected to the node N6, the gate and the substrate region are supplied with the signal XC and the source is connected to the output /Y. The nMOS transistor M50 has a structure such that the drain is connected to the node N6, the gate and the substrate region are supplied with the signal /XC and the source is connected to the output /Y.

Also in this case, similarly to the foregoing structure, when all of the input signals XA, XB and XC are logic 0 or logic 1, logic 1 without threshold drop can be transmitted to the output Y. Logic 0 is transmitted to the output /Y. In the case of the other combinations, logic 0 is transmitted to the output Y, and logic 1 without threshold drop is transmitted to the output /Y. Also the foregoing outputs are sum signals SUM and /SUM of a full adder.

FIG. 63A shows a circuit for generating carry signal C0 of the full adder. Specifically, the nMOS transistor M51 has a structure such that the drain is supplied with the signal /XA, the gate and the substrate region are supplied with the signal XB and the source is connected to the node N7. The nMOS transistor M52 has a structure such that the drain is supplied with the signal /XC, the gate and the substrate region are supplied with the signal /XB and the source is connected to the node N7. The nMOS transistor M53 has a structure such that the drain is supplied with the signal /XA, the gate and the substrate region are supplied with the signal /XB and the source is connected to the node N8. The nMOS transistor M54 has a structure such that the drain is supplied with the signal /XC, the gate and the substrate region are supplied with the signal XB and the source is connected to the node N8.

The nMOS transistor M55 has a structure such that the drain is connected to the node N7, the gate and the substrate region are supplied with the signal XA and the source is connected to output C0. The nMOS transistor M56 has a structure such that the drain is connected to the node N8, the gate and the substrate region are supplied with the signal /XA and the source is connected to the output C0.

Also in this case, similarly to the foregoing structure, when at least two of the input signals XA, XB and XC are logic 1, logic 1 without threshold drop can be transmitted to the output C0. In the case of the other combinations, logic 0 is transmitted.

FIG. 63B shows a circuit for generating a complementary signal /C0 of the carry signal. Specifically, the nMOS transistor M57 has a structure such that the drain is supplied with the signal XA, the gate and the substrate region are supplied with the signal XB and the source is connected to the node N9. The nMOS transistor M58 has a structure such that the drain is supplied with the signal XC, the gate and the substrate region are supplied with the signal /XB and the source is connected to the node N9. The nMOS transistor M59 has a structure such that the drain is supplied with the signal XA, the gate and the substrate region are supplied with the signal /XB and the source is connected to the node N10. The nMOS transistor M60 has a structure such that the drain is supplied with the signal XC, the gate and the substrate region are supplied with the signal XB and the source is connected to the node N10.

Moreover, the nMOS transistor M61 has a structure such that the drain is connected to the node N9, the gate and the substrate region are supplied with the signal XA and the source is connected to the output /C0. The nMOS transistor M62 has a structure such that the drain is connected to the node N10, the gate and the substrate region are supplied with the signal /XA and the source is connected to the output /C0.

Also in this case, similarly to the foregoing structure, when at least two of the input signals XA, XB and XC are logic 1, logic 0 is transmitted to the output /C0. In the case of the other combinations, logic 1 without threshold drop is transmitted.

FIG. 64 shows another example of the dual-input NAND. Specifically, the nMOS transistor M63 has a structure such that the source is supplied with the signal XA, the gate and the substrate region are supplied with the signal /XB and the drain is connected to the output Y. The nMOS transistor M64 has a structure such that the drain is connected to the output Y, the gate and the substrate region are supplied with the signal /XB and the source is connected to the ground potential Vss. Moreover, the pMOS transistor M65 has a structure such that the source is supplied with the signal XB, the gate and the substrate region are supplied with the signal /XA and the drain is connected to the output Y. The nMOS transistor M66 has a structure such that the drain is connected to the output Y, the gate and the substrate region are supplied with the signal /XA and the source is connected to the ground potential Vss.

When both of the input signals XA and XB are logic 0, both of the pMOS transistors M63 and M65 are non-conductive and both of the nMOS transistors M64 and M66 are conductive.

As a result, logic 0 is transmitted to the output Y. When the input signal XA is logic 1 and XB is logic 0, the nMOS transistor M64 and the pMOS transistor M65 are conductive and the pMOS transistor M63 and the nMOS transistor M66 are non-conductive. As a result, logic 0 is transmitted to the output Y.

When the input signal XA is logic 0 and XB is logic 1, the nMOS transistor M64 and the pMOS transistor M65 are non-conductive and the pMOS transistor M63 and the nMOS transistor M66 are conductive. As a result, logic 0 is transmitted to the output Y. When both of the input signals XA and XB are logic 1, both of the pMOS transistors M63 and M65 are conductive and both of the nMOS transistors M64 and M66 are non-conductive. As a result, logic 1 is transmitted to the output Y. Specifically, in the foregoing AND circuit, when both of the input signals XA and XB are logic 1, logic 1 is transmitted to the output Y. In the case of the other combinations, logic 0 is transmitted.

FIG. 65 shows another example of the dual-input NAND. Specifically, the pMOS transistor M67 has a structure such that the source is connected to the supply voltage Vcc, the gate and the substrate region are supplied with the signal XB and the drain is connected to the output /Y. The nMOS transistor M68 has a structure such that the drain is connected to the output /Y, the gate and the substrate region are supplied with the signal XB and the source is connected to Vcc. The pMOS transistor M69 has a structure such that the source is connected to Vcc, the gate and the substrate region are supplied with the signal XA and the drain is connected to the output /Y. The nMOS transistor M70 has a structure such that the drain is connected to the output /Y, the gate and the substrate region are supplied with the signal XA and the source is supplied with the signal /XB.

Also in this case, similarly to the foregoing structure, when both of the input signals XA and XB are logic 1, logic 0 is transmitted to the output Y. In the case of the other combinations, logic 1 is transmitted.

FIG. 66 shows another example of the dual-input OR. Specifically, the pMOS transistor M71 has a structure such that the source is connected to the supply voltage Vcc, the gate and the substrate region are supplied with the signal /XB and the drain is connected to the output Y. The nMOS transistor M72 has a structure such that the drain is connected to the output Y, the gate and the substrate region are supplied with the signal /XB and the source is supplied with the signal XA. The pMOS transistor M73 has a structure such that the source is connected to Vcc, the gate and the substrate region are supplied with the signal /XA and the drain is connected to the output Y. The nMOS transistor M74 has a structure such that the drain is connected to the output Y, the gate and the substrate region are supplied with the signal /XA and the source is supplied with the signal XB.

Also in this case, similarly to the foregoing structure, when both of the input signals XA and XB are logic 0, logic 0 is transmitted to the output Y. In the case of the other combinations, logic 1 is transmitted.

FIG. 67 shows another example of the dual-input OR. Specifically, the pMOS transistor M75 has a structure such that the source is supplied with the signal /XA, the gate and the substrate region are supplied with the signal XB and the drain is connected to the output /Y. The nMOS transistor M76 has a structure such that the drain is connected to the output /Y, the gate and the substrate region are supplied with the signal XB and the source is connected to the ground potential Vss. Moreover, the pMOS transistor M77 has a structure such that the source is supplied with the signal /XB, the gate and the substrate region are supplied with the signal XA and the drain is connected to the output /Y. The nMOS transistor M78 has a structure such that the drain Is connected to the output /Y, the gate and the substrate region are supplied with the signal XA and the source is connected to the ground potential Vss.

Also in this case, similarly to the foregoing structure, when both of the input signals XA and XB are logic 0, logic 1 is transmitted to the output Y. In the case of the other combinations, logic 0 is transmitted.

Figures 68, 69:
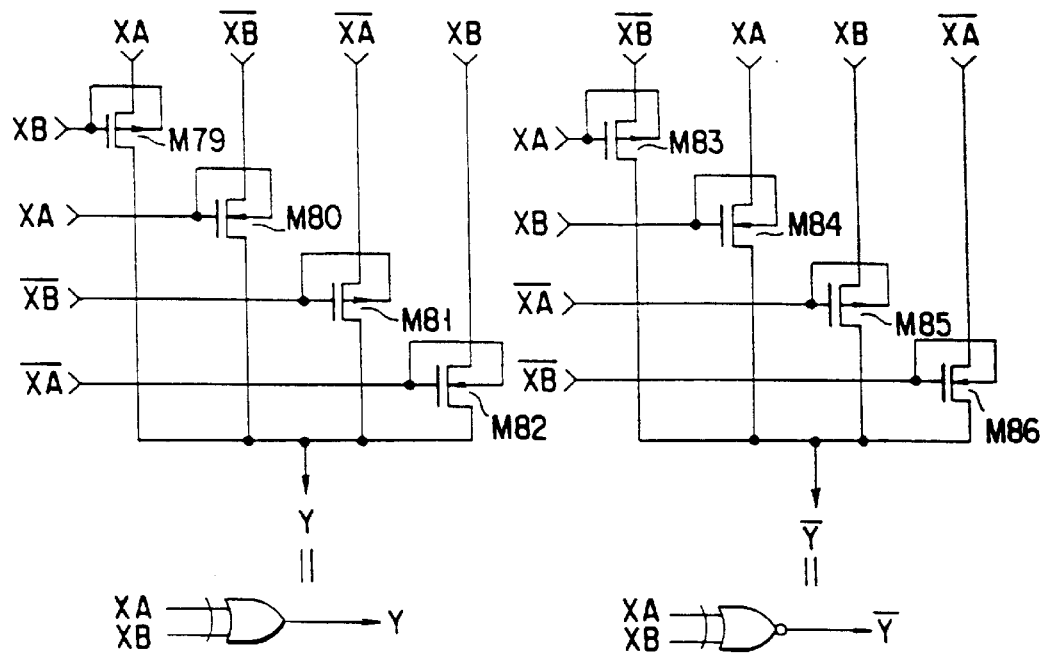
FIG. 68 is a circuit diagram showing another example of the dual-input EXOR.
FIG. 69 is a circuit diagram showing another example of the dual-input EXNOR.

FIG. 68 shows another example of the dual-input EXOR. Specifically, the pMOS transistor M79 has a structure such that the source is supplied with the signal XA, the gate and the substrate region are supplied with the signal XB and the drain is connected to the output Y. The nMOS transistor M80 has a structure such that the drain is supplied with the signal /XB, the gate and the substrate region are supplied with the signal XA and the source is connected to the output Y. The pMOS transistor M81 has a structure such that the source is supplied with the signal /XA, the gate and the substrate region are supplied with the signal /XB and the drain is connected to the output Y. The nMOS transistor M82 has a structure such that the drain is supplied with the signal XB, the gate and the substrate region are supplied with the signal /XA and the source is connected to the output Y.

Also in this case, similarly to the foregoing structure, when both of the input signals XA and XB are logic 0 or logic 1, logic 0 is transmitted to the output Y. In the case of the other combinations, logic 1 is transmitted.

FIG. 69 shows another example of the dual-input EXNOR. Specifically, the pMOS transistor M83 has a structure such that the source is supplied with the signal /XB, the gate and the substrate region are supplied with the signal XA and the drain is connected to the output /Y. The nMOS transistor M84 has a structure such that the drain is supplied with the signal XA, the gate and the substrate region are supplied with the signal XB and the source is connected to the /Y. The pMOS transistor M85 has a structure such that the source is supplied with the signal XB, the gate and the substrate region are supplied with the signal /XA ad the drain is connected to the output /Y. The nMOS transistor M86 has a structure such that the drain is supplied with the signal /XA, the gate and the substrate region are supplied with the signal /XB and the source is connected to the output Y.

Also in this case, similarly to the foregoing structure, when both of the input signals XA and XB are logic 0 or logic 1, logic 1 is transmitted to the output Y. In the case of the other combinations, logic 0 is transmitted.

Figure 70:
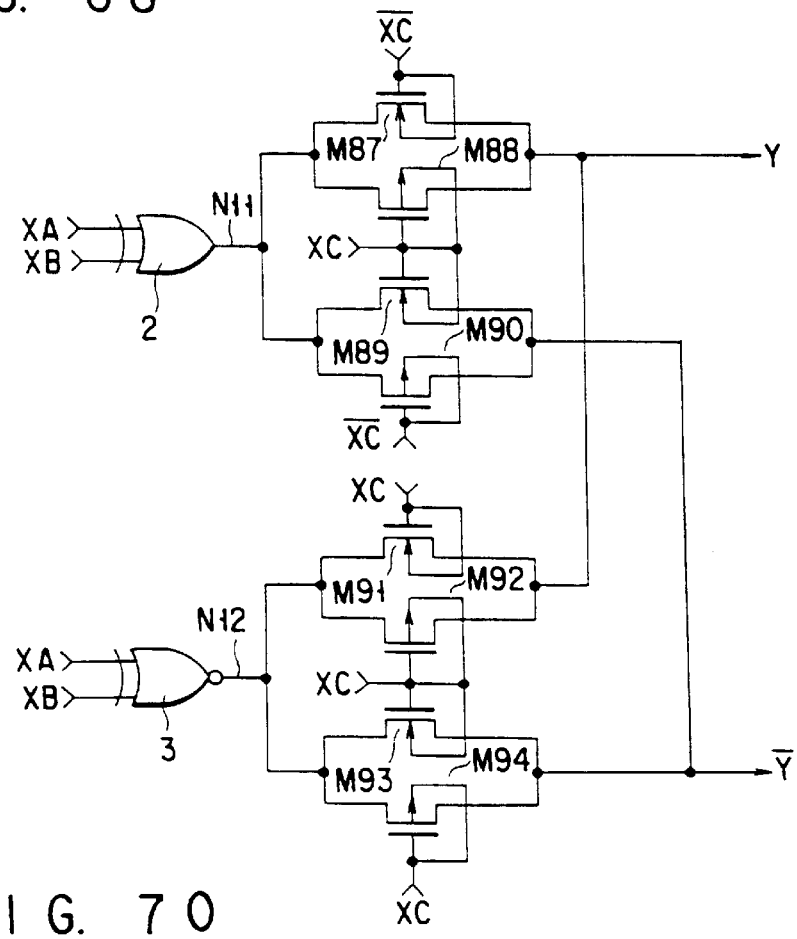
FIG. 70 is a circuit diagram showing another example of the dual-input EXOR/EXNOR.

FIG. 70 shows another example of the 3-input EXOR/EXNOR. The dual-input EXOR 2 shown in FIG. 68 receives the signals XA and XB and arranged such that its output appears at the node N11. The dual-input EXNOR 3 shown in FIG. 69 receives the signals XA and XB and arranged such that its output appears at the node N12.

The nMOS transistor M87 has a structure such that the drain is connected to the node N11, the gate and the substrate region are supplied with the signal /XC and the source is connected to the output Y. The pMOS transistor M88 has a structure such that the source is connected to the node N11, the gate and the substrate region are supplied with the signal XC and the drain is connected to the output Y. Moreover, the nMOS transistor M89 has a structure such that the drain is connected to the node N11, the gate and the substrate region are supplied with the signal XC and the source is connected to the output /Y. The pMOS transistor M90 has a structure such that the source is connected to the node N11, the gate and the substrate region are supplied with the signal /XC and the drain is connected to the /Y.

The nMOS transistor M91 has a structure such that the drain is connected to the node N12, the gate and the substrate region are supplied with the signal XC and the source is connected to the output Y. The pMOS transistor M92 has a structure such that the source is connected to the node N12, the gate and the substrate region are supplied with the signal /XC and the drain is connected to the output Y. Moreover, the nMOS transistor M93 has a structure such that the drain is connected to the node N12, the gate and the substrate region are supplied with the signal /XC and the source is connected to the output /Y. The pMOS transistor M94 has a structure such that the source is connected to the node N12, the gate and the substrate region are supplied with the signal XC and the drain is connected to the output /Y.

Also in this case, similarly to the foregoing structure, when all of the input signals XA, XB and XC are logic 0 or logic 1, logic 1 is transmitted to the output Y and logic 0 is transmitted to the output /Y. In the case of the other combinations, logic 0 is transmitted to the output Y and logic 1 is transmitted to the output /Y. The foregoing outputs are also the sum signals SUM and /SUM of a full adder.

FIG. 71 shows a circuit for generating carry signal C0 and its complementary signal /C0. The dual-input AND 4 shown in FIG. 64 receives the signals XA and XB and has an arrangement such that its output appears at the node N13. The dual-input NAND 5 shown in FIG. 65 receives the signals XA and XB and has an arrangement such that its output appears at the node N14. The dual-input OR 6 shown in FIG. 66 receives the signals XA and XB and has an arrangement such that its output appears at the node N15. The dual-input NOR 7 shown in FIG. 67 receives the signals XA and XB and has an arrangement such that its output appears at the node N16.

The nMOS transistor M95 has a structure such that the drain is connected to the node N13, the gate and the substrate region are supplied with the signal /XC and the source is connected to the output C0. The pMOS transistor M96 has a structure such that the source is connected to the node N13, the gate and the substrate region are supplied with the signal XC and the drain is connected to the output C0. The nMOS transistor M97 has a structure such that the drain is connected to the node N14, the gate and the substrate region are supplied with the signal XC and the source is connected to the output /C0. The pMOS transistor M98 has a structure such that the source is connected to the node N14, the gate and the substrate region are supplied with the signal /XC and the drain is connected to the output /C0.

The nMOS transistor M99 has a structure such that the drain is connected to the node N15, the gate and the substrate region are supplied with the signal XC and the source is connected to the output C0. The pMOS transistor M100 has a structure such that the source is connected to the node N15, the gate and the substrate region are supplied with the signal /XC and the drain is connected to the output C0. The nMOS transistor M101 has a structure such that the drain is connected to the node N16, the gate and the substrate region are supplied with the signal /XC and the source is connected to the output /C0. The pMOS transistor M102 has a structure such that the source is connected to the node N16, the gate and the substrate region are supplied with the signal XC and the drain is connected to the output /C0.

Also in this case, similarly to the foregoing structure, when at least two of the input signals XA, XB and XC are logic 1, logic 1 is transmitted to the output C0 and logic 0 is transmitted to the output /C0. In the case of the other combinations, logic 1 is transmitted to the output /C0.

As described above, according to this embodiment, the substrate region of the MOS transistor for forming the pass-transistor network 1 is controlled by the input signal supplied to the gate. Thus, the threshold voltage of the conductive transistor can be lowered and the threshold voltage of the non-conductive transistor can be raised. Moreover, the output from the pass-transistor network 1 is amplified by a dual-rail buffer circuit 2 which receives by only the nMOS transistors M13 and M14 and latches by the pMOS transistors M11 and M12. Therefore, the output capacitance of the pass-transistor network 1 is reduced.

Therefore, the pass-transistor network 1 can be realized, the voltage for which can be lowered with a sufficiently large operation margin without the necessity of lowering the threshold voltage of the MOS transistors. Moreover, since the output load from the pass-transistor network 1 can be reduced, satisfactory drive compatibility can be obtained. As a result, contribution to reduce the area of the device and reduce the power consumption can be made.

Although the dual-input and 3-input gates have been described as the pass-transistor network 1, it can easily be extended to n inputs (n is a natural number not less than 5). By combining the foregoing arrangements, a variety of pass-transistor logic circuits can be formed.

FIGS. 72A and 72B are circuit diagrams showing a pass-transistor logic circuit and a buffer circuit according to a twenty-third embodiment of the present invention. The difference from the foregoing twenty-second embodiment is that pMOS transistors M103 and M104 for forming a latch circuit are added.

In the foregoing case, the threshold voltage of the MOS transistor for forming the pass-transistor network 1 is raised. Therefore, even if the threshold value of the output of logic 1 is dropped, a high level can sufficiently be maintained and, therefore, deterioration in the drive compatibility can be prevented.

The circuits respectively shown in FIGS. 72A and 72B have similar effects. However, the circuit shown in FIG. 72A has the structure such that the gates of pass-transistors M103 and M104 are connected to the gates of the transistors M12 and M13. Therefore, the load capacitance of the data line can be reduced.

FIG. 73 shows modifications of the pass-transistor logic circuit and the buffer circuit according to the twenty-third embodiment. FIG. 73 shows a structure in which a limiter device is added to the logic circuit according to the twenty-second embodiment shown in FIG. 51. That is, the circuit shown in FIG. 73 comprises a pass-transistor network 1 for receiving 2n complementary signals IN1, /IN1, . . . , INn and /INn and transmitting two complementary signals Y and /Y; limiter devices for transmitting signals for preventing the complementary signals Y and /Y, to be transmitted from the pass-transistor logic circuit, from being smaller than Vcc−$V_F$; and limiter devices 31 and 32 for transmitting signals for preventing the complementary signals -Y and /Y, to be transmitted from the pass-transistor network, from being larger than $V_F$.

The buffer circuit is formed by a pMOS transistor M11 formed on a SOI substrate and having the source connected to the supply voltage Vcc, the gate connected to the output terminal OUT, the drain connected to the output terminal /OUT and the body connected to the output from the limiter device 21; a pMOS transistor M12 formed on a SOI substrate and having the source connected to Vcc, the gate connected to /OUT, the drain connected to OUT and the body connected to the output from the limiter device 22; a nMOS transistor M13 formed on a SOI substrate and having the source connected to the ground potential Vss, the gate connected to Y, the drain connected to /OUT and the body connected to the output from the limiter device 31; and a nMOS transistor M14 formed on a SOI substrate and having the source connected to Vss, the gate connected to /Y, the drain connected to OUT and the body connected to the output from the limiter device 32. That is, the circuit formed by the MOS transistors M11 to M14 is a 2-rail input buffer circuit for receiving the complementary output signals Y and /Y from the pass-transistor network 1 and transmitting the complementary signal OUT and /OUT.

Figure 74:
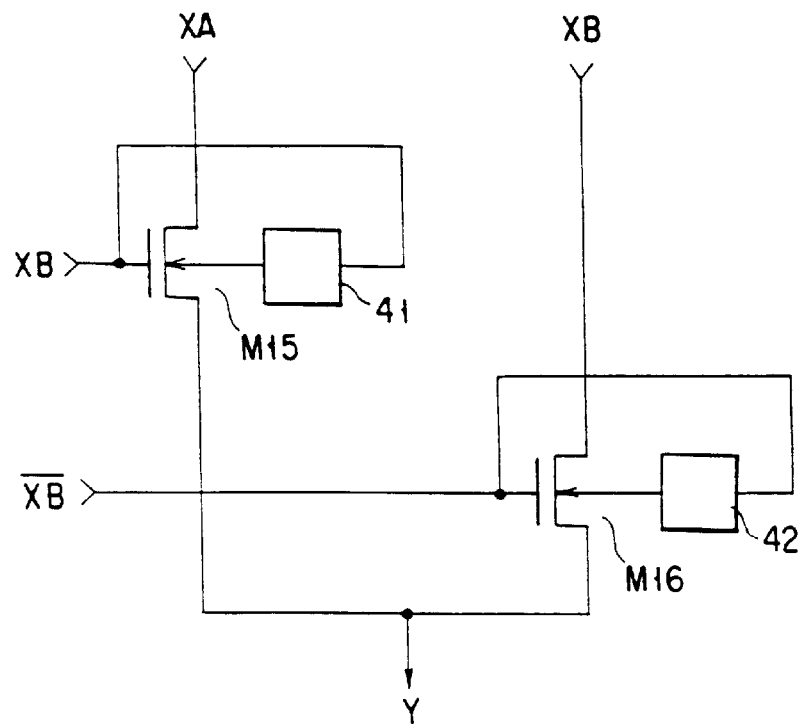
FIG. 74 is a circuit diagram showing another example of the dual-input.

FIG. 74 shows another modification of the dual-input AND gate shown in FIG. 52. That is, the nMOS transistor M15 has a structure such that the drain is supplied with the signal XA, the gate is supplied with the signal XB, the body is supplied with the signal XB through a limiter device 41 and the source is connected to the output Y. The nMOS transistor M16 has a structure such that the drain is supplied with the signal XB, the gate is supplied with the complementary signal /XB of the signal XB, the body is supplied with the signal /XB through the limiter device 42 and the source is connected to the output Y. When the input signal XB is logic 1, the nMOS transistor M15 is conductive and the nMOS transistor M16 is non-conductive. As a result, the output Y has the same logic as that of the signal XA so that it is logic 0 when XA is logic 0 and logic 1 when XA is logic 1. Since the signal having the same logic 1 as that of the signal XB is supplied to the body of the MOS transistor M15 at this time, the threshold voltage of the MOS transistor M15 is lowered. By making the threshold voltage at this time to be 0V, threshold drop at the time of transmitting logic 1 does not take place. When the input signal XB is logic 0, the nMOS transistor M15 is non-conductive and the nMOS transistor M16 is conductive. As a result, the output node N1 has the same logic as that of the signal XB. That is, in the foregoing AND circuit, when both of the input signals XA and XB are logic 1, logic 1 without threshold drop is transmitted to the output Y. In the case of the other combinations, logic 0 is transmitted.

Figure 75:
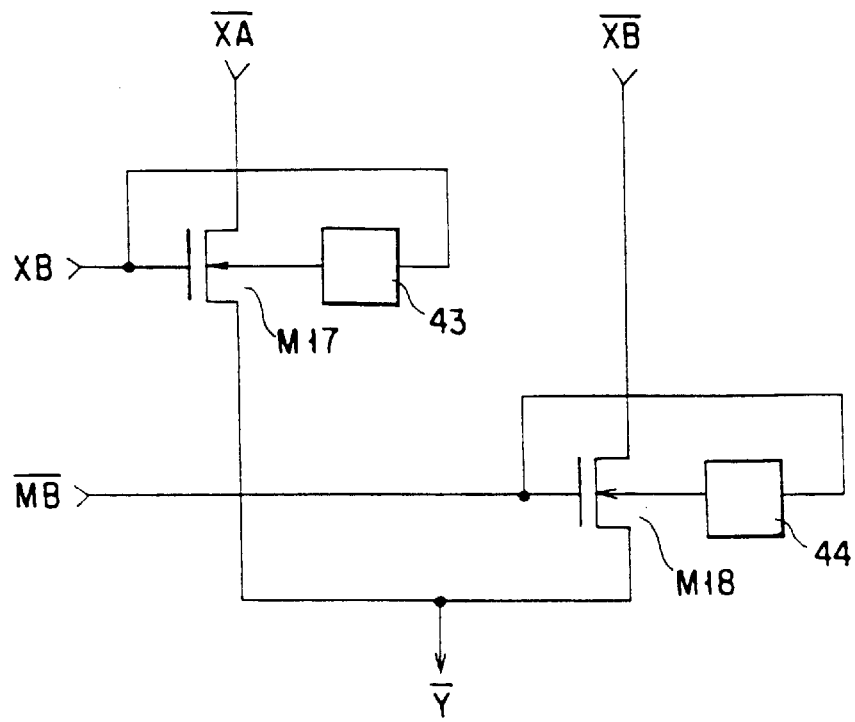
FIG. 75 is a circuit diagram showing another example of the dual-input NOR.

FIG. 75 shows another modification of the dual-input NAND gate shown in FIG. 53. That is, the nMOS transistor M17 has a structure such that the drain is supplied with the signal /XA, the gate is supplied with the signal XB, the body is supplied with the signal XB through the limiter device 43 and the source is connected to the output /Y. Also the nMOS transistor M18 has a structure such that the drain is supplied with the signal /XB, the gate is supplied with the signal /XB, the body is supplied with the signal /XB through the limiter device 44 and the source is connected to the output /Y. Also in this case, similarly to the foregoing structure, when both of the input signals XA and XB are logic 1, logic 0 is transmitted to the output Y. In the case of the other combinations, logic 1 without threshold drop is transmitted.

In the foregoing modification, the description has been performed about the dual-input AND/NAND gate formed by only the nMOS transistors as the pass-transistor network 1. A similar structure may be adapted to an OR/NOR gate or an EXOR/EXNOR gate. Moreover, extension to N inputs (n is a natural number not less than 3) can be performed.

Figure 76:
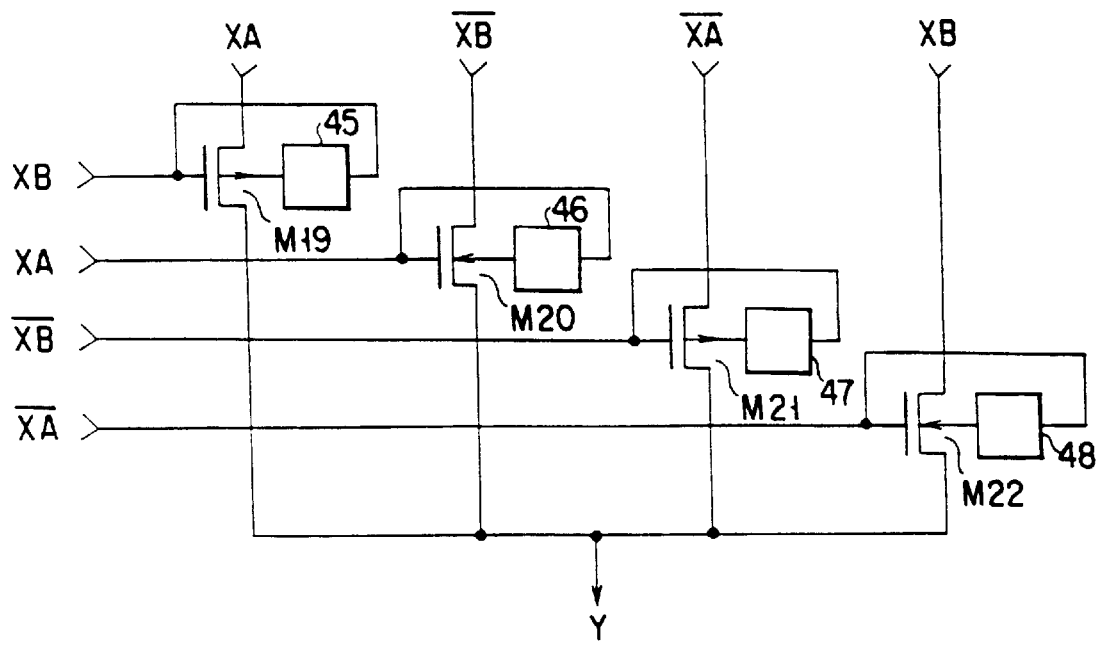
FIG. 76 is a circuit diagram showing another example of the dual-input EXOR.

FIG. 76 shows another modification of the dual-input EXOR. That is, the pMOS transistor M19 has a structure such that the source is supplied with the signal XA, the gate is supplied with the signal XB, the body is supplied with the signal XB through the limiter device 45 and the drain is connected to the output Y.

The nMOS transistor M20 has a structure such that the drain is supplied with the signal /XB, the gate is supplied with the signal XA, the body is supplied with the signal XA through the limiter device 46 and the source is connected to the output Y. The pMOS transistor M21 has a structure such that the source is supplied with the signal /XA, the gate is supplied with the signal /XB, the body is supplied with the signal /XB through the limiter device 47 and the drain is connected to the output Y. The nMOS transistor M22 has a structure such that the drain is supplied with the signal XB, the gate is supplied with the signal /XA, the body is supplied with the signal /XA through the limiter device 48 and the source is connected to the output Y. Also in this case, similarly to the foregoing structure, when both of the input signals XA and XB are logic 0 or logic 1, logic 0 is transmitted to the output Y. In the case of the other combinations, logic 1 is transmitted.

Figure 77:
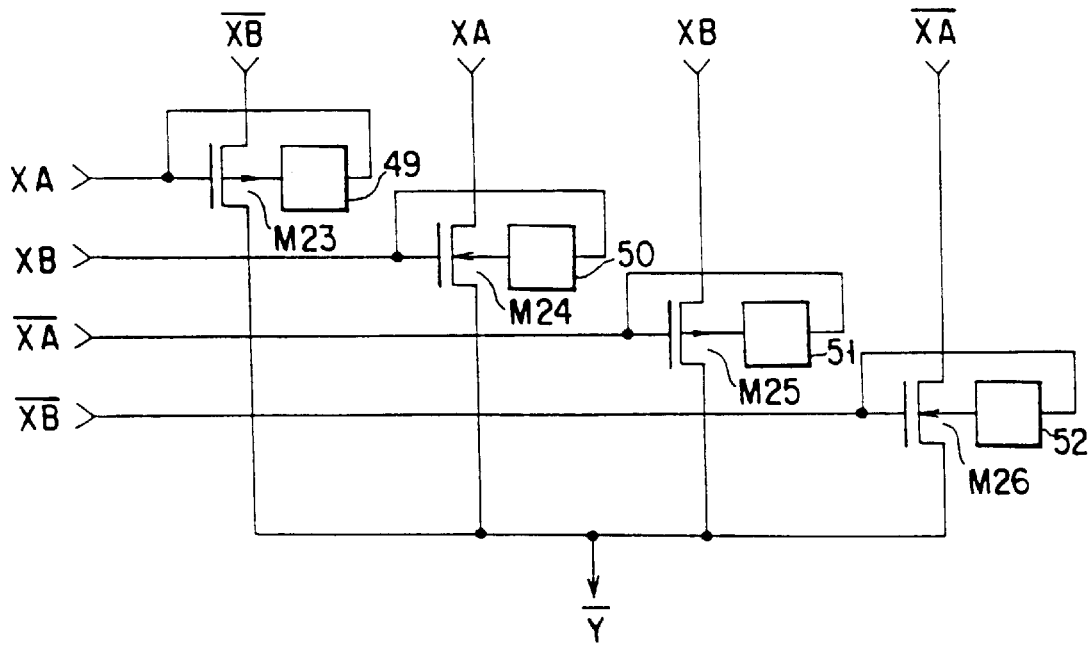
FIG. 77 is a circuit diagram showing another example of the dual-input EXNOR.

FIG. 77 shows another example of the dual-input EXNOR. That is, the pMOS transistor M23 has a structure such that the source is supplied with the signal /XB, the gate is supplied with the signal XA, the body is supplied with the signal XA through the limiter device 49 and the drain is connected to the output /Y. The nMOS transistor M24 has a structure such that the drain is supplied with the signal XA, the gate is supplied with the signal XB, the body is supplied with the signal XB through the limiter 50 and the source is connected to the output /Y. The pMOS transistor M25 has a structure such that the source is supplied with the signal XB, the gate is supplied with the signal /XA, the body is supplied with the signal /XA through the limiter device 51, the gate is supplied with the signal /XB and the body is supplied with the signal /XB through the limiter device 52 and the source is connected to the output /Y. Also in this case, similarly to the foregoing structure, when both of the input signals XA and XB are logic 0 or logic 1, logic 1 is transmitted to the output Y. In the case of the other combinations, logic 0 is transmitted.

Although the embodiments of the dual-input EXOR/EXNOR gate formed by the nMOS transistors and the pMOS transistors have been described as the pass-transistor network 1, the foregoing structure may be applied to an AND/NAND gate or OR/NOR gate. Moreover, extension to n inputs (n is a natural number not less than 3) can easily be performed. Moreover, a variety of logic circuits formed by combining the foregoing structures including a half adder formed by combining a dual-input EXOR gate and a carry generating circuit and a full adder formed by combining a 3-input EXOR gate and the carry generating circuit.

Figure 78A:
FIGS. 78A to 78D are diagrams showing limiter devices.
Figure 81A:
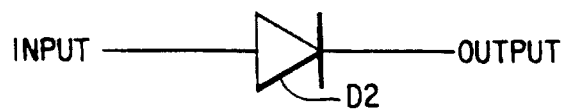
FIGS. 81A to 81D are diagrams showing the limiter devices.
Figure 78B:
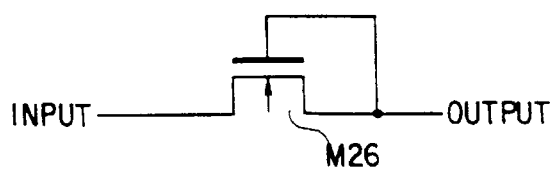
Figure 78C:
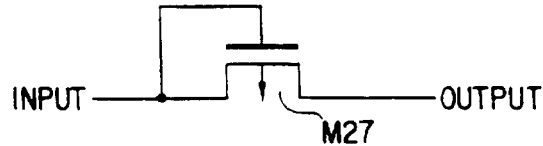
Figure 78D:
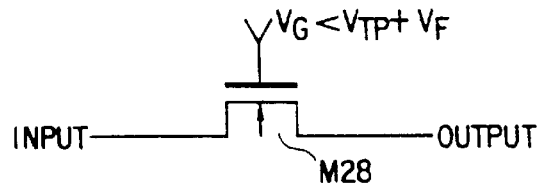

FIGS. 78A to 78D show examples of the limiter devices 21 and 22, and FIGS. 79A to 79F are cross sectional views of the foregoing examples. FIG. 78A shows a diode having a forward Vlim smaller than voltage $V_F$ in the forward direction of the pn junction between the body and the source of the MOS transistors M11 and M12. Specially, the diode is a pn junction diode (see FIG. 79A) with the impurity density lower than the impurity density in the body and the source of M11 and M12 or a shot-key barrier diode (see FIG. 79B) made of metal and a semiconductor. In the case of the limiter device 21, input of the diode is connected to the output signal Y from the pass-transistor network 1. An output of the diode is connected to the body of the MOS transistor M11. In the case of the limiter device 22, the input of the diode is connected to the output signal /Y from the pass-transistor network 1. An output from the diode is connected to the body of the MOS transistor M12. FIG. 78B shows an example in which the gate of the nMOS transistor M26 having a threshold voltage, which is lower than $V_F$, and the drain of the same are connected to each other. FIG. 79D is a cross sectional view showing the foregoing example. FIG. 78C shows an example in which the gate and drain of the pMOS transistor M27, having the absolute value of the threshold voltage which is smaller than $V_F$, are connected to each other. FIG. 78D shows an example in which the pMOS transistor M28 is employed in which its source is made to be the input, the drain of the same is made to be the output and the gate is applied with voltage which is lower than $V_{TP}+V_F$.

FIG. 79F is a cross sectional view of the foregoing example, where $V_{TP}$ is the threshold voltage of the MOS transistor M28. Note that the body shown in FIGS. 79D to 79F may be a floating type or connected to the gate.

Figure 80A:
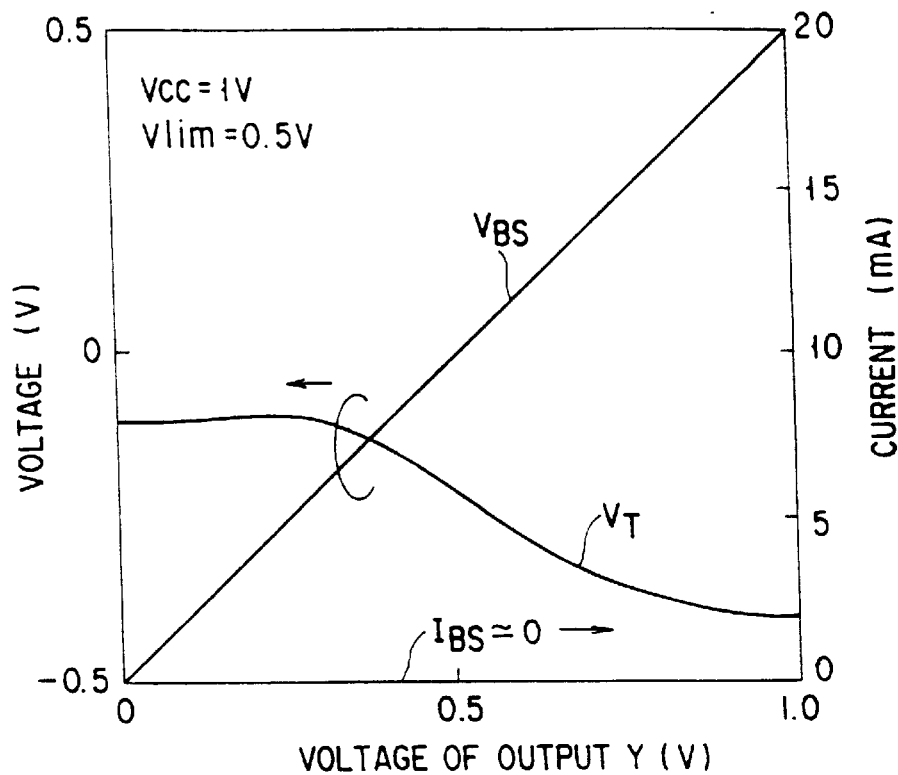
FIGS. 80A and 80B are graphs showing the voltage between the body and the source of the MOS transistor provided with the limiter device, the threshold voltage and the body-source current.
Figure 80B:
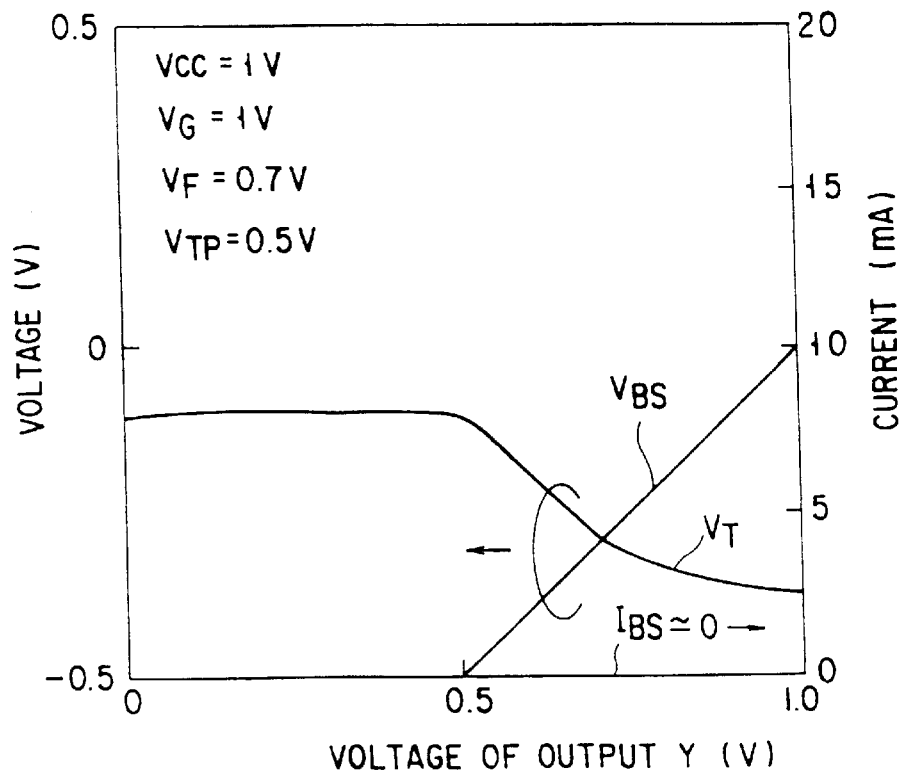

FIGS. 80A and 80B show results of plotting of the voltage $V_{BS}$ between the body and the source, the threshold voltage $V_T$ and current $I_{BS}$ between the body and the source with respect to the voltage of output Y when the limiter device 21 is connected to the body of the pMOS transistor M11.

FIG. 80A shows a case where a diode D1 is employed as the limiter device and the supply voltage Vcc is set to be 1V and the limiter voltage Vlim is set to be 0.5V. Since the output voltage is higher than the input voltage by Vlim, $V_B$ is always lower than the voltage of the output Y by 0.5V. Since the potential of the body is raised when the voltage of the output Y has been raised, V is lowered. However, since $V_B$ does not exceed $V_F$, forward current $I_{BS}$ does not substantially flows.

Also a similar result can be obtained from a case where the MOS transistor M26 or M27 is employed in place of the diode D1. As for the operations of the limiter device 22 and the pMOS transistor M12, similar results are obtained.

FIG. 80B shows a case where a MOS transistor M28 is employed as the limiter device, the supply voltage Vcc is set to be 1V, the gate voltage $V_G$ is set to be 1V and $V_F$ is set to be 0.7V and the threshold voltage $V_{TP}$ of the MOS transistor M28 is set to be 0.5V. In the case where the input voltage is 1V, the MOS transistor M28 is made to be conductive. Therefore, the output is made to be 1V. If the input voltage is lower than 1V, the output is lowered. If the input voltage is lower than 0.5V, M28 is made to be non-conductive. Therefore, the output is made to be 0.5V. Therefore, in a region in which the voltage of the output Y is 0V to 0.5V, $V_{BS}$ is −0.5V. If the voltage of the output Y is higher than 0.5V, $V_{BS}$ is raised and $V_T$ is lowered. Since $V_{BS}$ does not exceed $V_F$, the forward current $I_{BS}$ does not substantially flow. Moreover, similar operations are performed in the limiter device 22 and the pMOS transistor M12, the limiter device 45 and the pMOS transistor M19, the limiter device 47 and the pMOS transistor M12, the limiter device 49 and the pMOS transistor M23 and the limiter device 51 and the pMOS transistor M25.

Figure 81B:
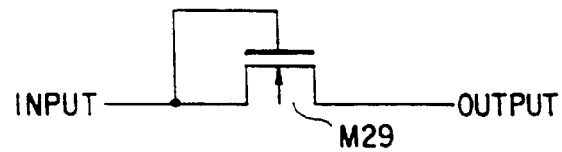
Figure 81C:
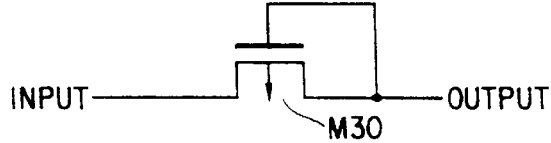
Figure 81D:
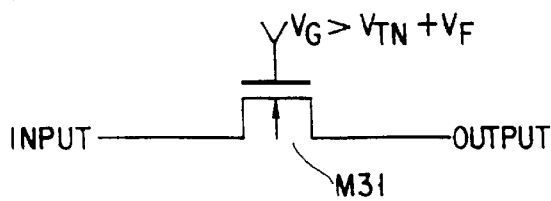
Figure 82A:
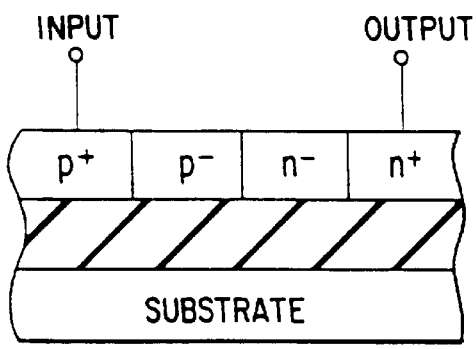
FIGS. 82A to 82F are cross sectional views of the limiter devices shown in FIGS. 81A to 81D.
Figure 82B:
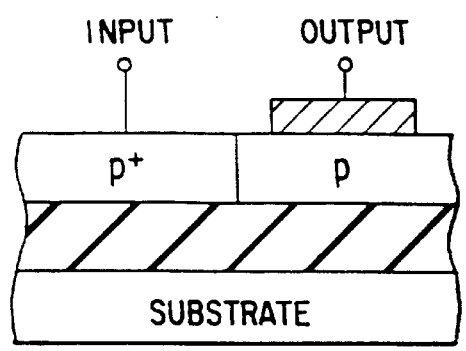
Figure 82C:
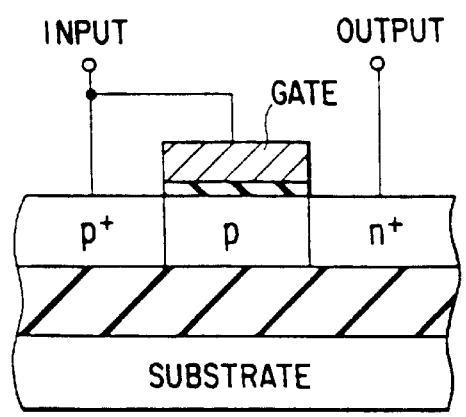
Figure 82D:
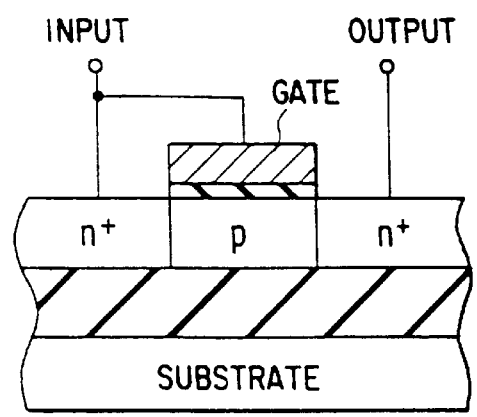
Figure 82E:
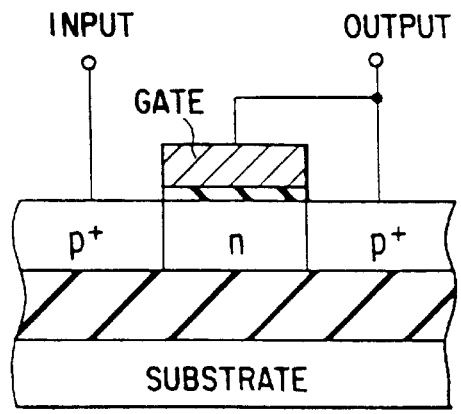
Figure 82F:
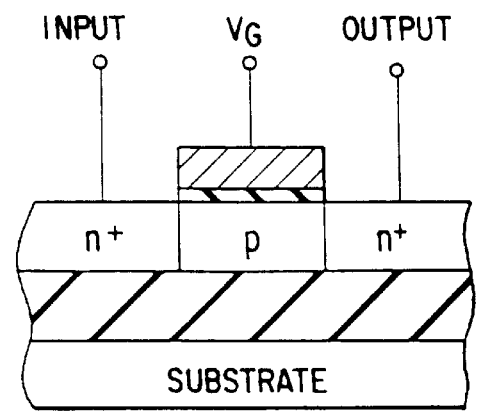

FIGS. 81A to 81D show examples of the limiter devices 31 and 32. FIGS. 82A to 82F are their cross sectional views. FIGS. 81A and 82A to 82C show a case where the diode D2 is employed. FIGS. 81B and 82D show an example in which the nMOS transistor M26 is employed. FIGS. 81C and 82E show an example in which the pMOS transistor M27 is employed. The difference from the structures shown in FIGS. 78A to 78D is that the input and the output are interchanged. FIG. 81D shows an example in which the nMOS transistor M31 is employed, the source of which is made to be the input, the drain of which is made to be the output, and the gate of which is applied with voltage higher than $V_{TN}+V_F$. FIG. 82F is a cross sectional view of the foregoing example. Note that $V_{TN}$ is the threshold voltage of the MOS transistor M31. Note that the body shown in FIGS. 82D to 82F may be a floating type body are may be connected to the gate.

Figure 83A:
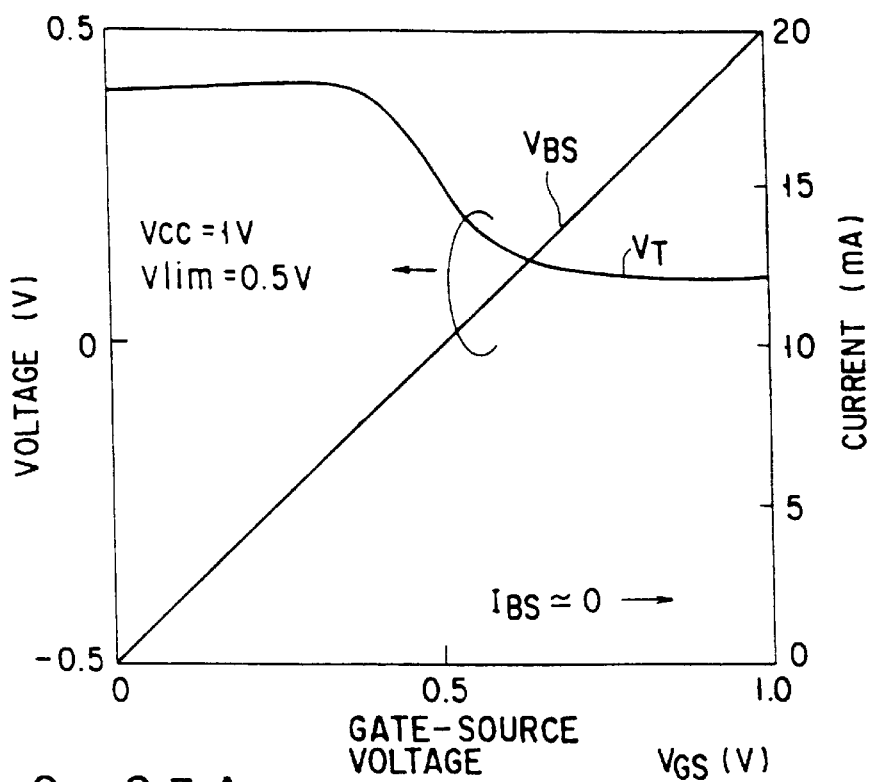
FIGS. 83A and 83B are graphs showing the voltage between the body and the source of the MOS transistor provided with the limiter device, the threshold voltage and the body-source current.
Figure 83B:
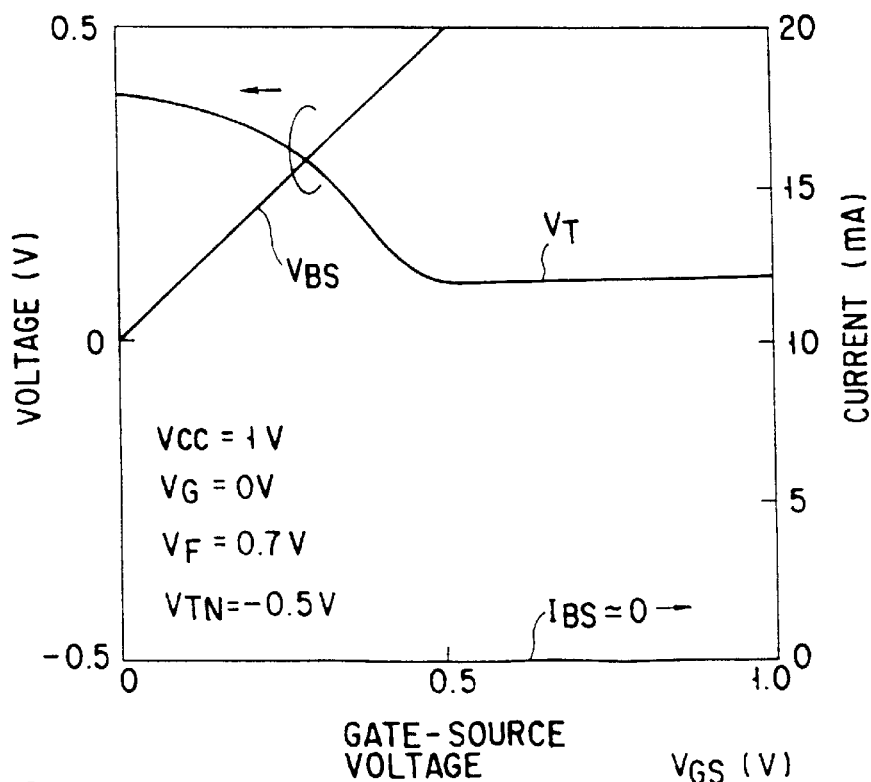

FIGS. 83A and 83B show results of plotting of the voltage $V_{BS}$ between the body and the source, the threshold voltage $V_T$ and current $I_{BS}$ between the body and the source with respect to the voltage $V_{GS}$ between the gate and the source when the limiter device 31 is connected between the gate and the body of the nMOS transistor M13. FIG. 83A shows a case where the diode D2 is employed as the limiter device, the supply voltage Vcc is set to be 1V and the limiter voltage Vlim is set to be 0.5V. Since the output voltage of the diode is lower than the input voltage by Vlim, $V_{BS}$ is always lower than $V_G$ S by 0.5V. Since the potential of the body is raised when $V_{GS}$ has been raised, $V_T$ is lowered. However, forward current $I_{BS}$ does not substantially flow because $V_{BS}$ does not exceed $V_F$. The illustrated structure is arranged such that the MOS transistor M31 is employed in place of the diode D2, the supply voltage Vcc is set to be 1V, the gate voltage $V_G$ is set to be 0V, $V_F$ is set to be 0.7V and the threshold voltage $V_{TN}$ of the MOS transistor M31 is set to be −0.5V. Since M31 is made to be non-conductive in the case where the input voltage is 0V, the output is made to be 0V. If the input voltage is higher than 0V, also the output is raised. Since M31 is made to be non-conductive if the input voltage is higher than 0.5V, the output is made to be 0.5V. Therefore, in a region of $V_{GS}$ from 0V to 0.5V, $V_{BS}$ is raised and $V_T$ is lowered. If $V_{GS}$ exceeds 0.5V, $V_{BS}$ is made to be 0.5V and $V_{BS}$ does not exceed $V_F$. Therefore, the forward current $I_{BS}$ does not substantially flow. Similar operations are performed by the limiter device 32 and the nMOS transistor M14, the limiter device 41 and the nMOS transistor M15, the limiter device 42 and the nMOS transistor M16, the limiter device 43 and the nMOS transistor M17, the limiter device 44 and the nMOS transistor M18, the limiter device 46 and the nMOS transistor M20, the limiter device 48 and the nMOS transistor M22, the limiter 50 and the nMOS transistor M24 and the limiter device 52 and the nMOS transistor M26. The input capacitance of the buffer circuit shown in FIG. 73 is the input capacitance of the gate capacitance and the limiter device of the nMOS transistor M13 or M14. Since the MOS transistor formed on the SOI substrate has substantially no coupling capacitance between the source and the drain, the input capacitance of the limiter device is substantially zero in the case where the structure shown in FIGS. 78B, 78D, 81C or 81D is employed as the limiter device. Therefore, the input capacitance of the foregoing buffer circuit is only the gate capacitance of the nMOS transistor M13 or M14. As described above, the output load capacitance of the pass-transistor network 1 is smaller than that of the conventional buffer circuit formed by the CMOS inverter.

Figure 84:
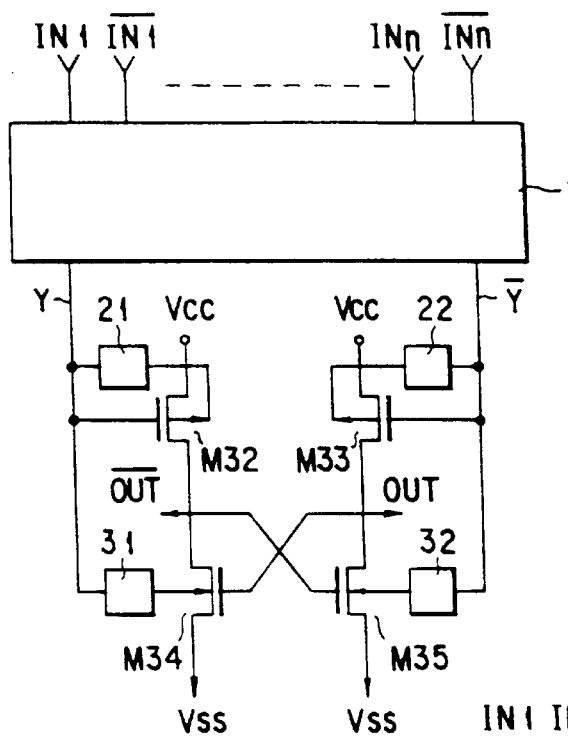

FIG. 84 shows another pass-transistor logic circuit. Elements given the same reference numerals are omitted from description. The pMOS transistor M32 formed on a SOI substrate has a structure such that the source is connected to the supply voltage Vcc, the gate is connected to Y, the drain is connected to the output terminal /OUT and the body is connected to the output of the limiter device 21. The pMOS transistor M33 formed on a SOI substrate has a structure such that the source is connected to Vcc, the gate is connected to /Y, the drain is connected to OUT and the body is connected to the output of the limiter device 22. The nMOS transistor M34 formed on a SOI substrate has a structure such that the source is connected to the ground potential Vss, the gate is connected to OUT and the body is connected to the output from the limiter device 31. The nMOS transistor M14 formed on a SOI substrate has a structure such that the source is connected to Vss, the gate is connected to /OUT, the drain is connected to OUT and the body is connected to the output of the limiter device 32. That is, the circuit formed by the MOS transistors M32 to M35 is a dual-rail input buffer circuit which receives the complementary signals Y and /Y of the pass-transistor network 1 and transmits the complementary signals OUT and /OUT.

The pass-transistor logic circuit shown in FIG. 73 has a structure such that the output from the pass-transistor network 1 is received by only the nMOS transistor and its high-level output is held by a circuit formed by the pMOS transistor. On the other hand, the pass-transistor logic circuit shown in FIG. 84 has a structure such that the output from the pass-transistor network 1 is received by only the pMOS transistor and its low-level output is held by a circuit formed by the nMOS transistor.

Figure 85:
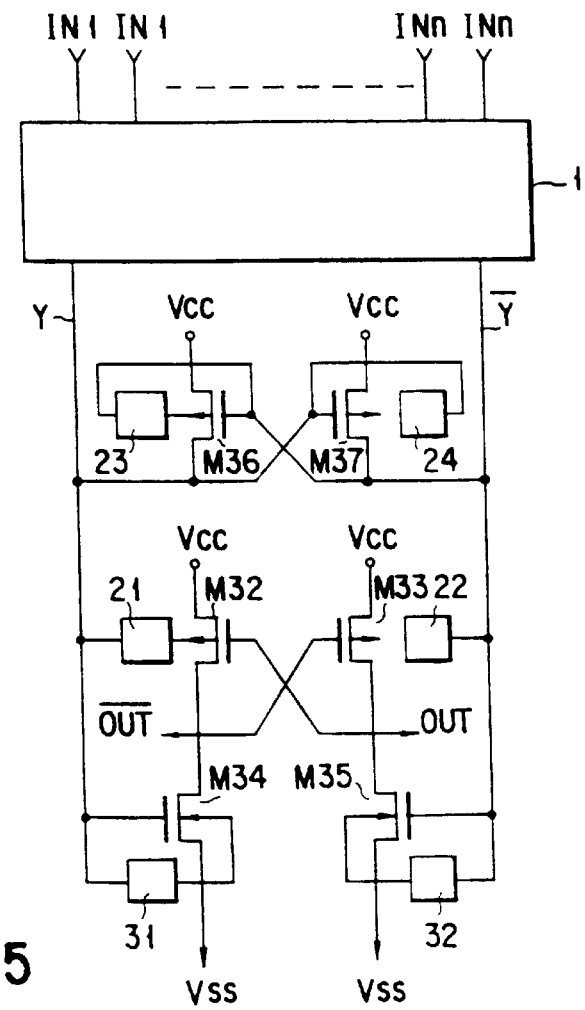

FIG. 85 shows another examples of the pass-transistor logic circuit. The different of the structure shown in FIG. 85 from that shown in FIG. 73 is that the limiter devices 23 and 24 are added to the pMOS transistors M36 and M37. That is, the pMOS transistor M36 has a structure such that the source is connected to the supply voltage Vcc, the gate is connected to /Y, the drain is connected to Y and the limiter device 23 is connected between the gate and the body. The pMOS transistor M37 has a structure such that the source is connected to Vcc, the gate is connected to Y, the drain is connected to /Y and the limiter device 24 is connected between the gate and the body. In the foregoing case, the threshold voltage of the MOS transistor forming the pass-transistor network 1 is raised. Therefore, even if the output of logic 1 encounters threshold drop, high levels can be maintained to prevent deterioration in the drive compatibility.

FIG. 86 show another examples of the pass-transistor logic circuit. The structure shown in FIG. 86 is different from that shown in FIG. 85 in that the gates of the pMOS transistors M36 and M37 and the inputs of the limiter devices 23 and 24 are connected to the output of the buffer circuit. That is, the pMOS transistor M36 has a structure such that the source is connected to the supply voltage Vcc, the gate is connected to /OUT, the drain is connected to Y and the limiter device 23 is connected between the gate and the body. The pMOS transistor M37 has a structure such that the source is connected to Vcc, the gate is connected to OUT and the drain is connected to /Y. Thus, even if the output encounters threshold drop, high levels can be maintained and deterioration in the drive compatibility can be prevented.

FIG. 87 shows another example of the pass-transistor logic circuit. The difference from the structure shown in FIG. 85 is that the bodies of the pMOS transistors M36 and M37 forming the latch circuit are connected to the outputs of the limiter devices 21 and 22. That is, the pMOS transistor M36 has a structure such that the source is connected to the supply voltage Vcc, the gate is connected to /Y, the drain is connected to Y and the body is connected to the output of the limiter device 21. The pMOS transistor M37 has a structure such that the source is connected to Vcc, the gate is connected to Y, the drain is connected to /Y and the body is connected to the output of the limiter device 22. Also in this case, even if the output of logic 1 encounters threshold drop, high levels can be maintained and deterioration in the drive compatibility can be prevented.

Although the foregoing embodiment has the structure such that the limiter device 21 is shared by the pMOS transistors M32 and M36 and the limiter device 22 is shared by the pMOS transistors M33 and M37, the structure shown in FIG. 86 permits the limiter device to be shared similarly. A voltage maintaining circuit may be added to the structure shown in FIG. 84.

Figures 88, 89:
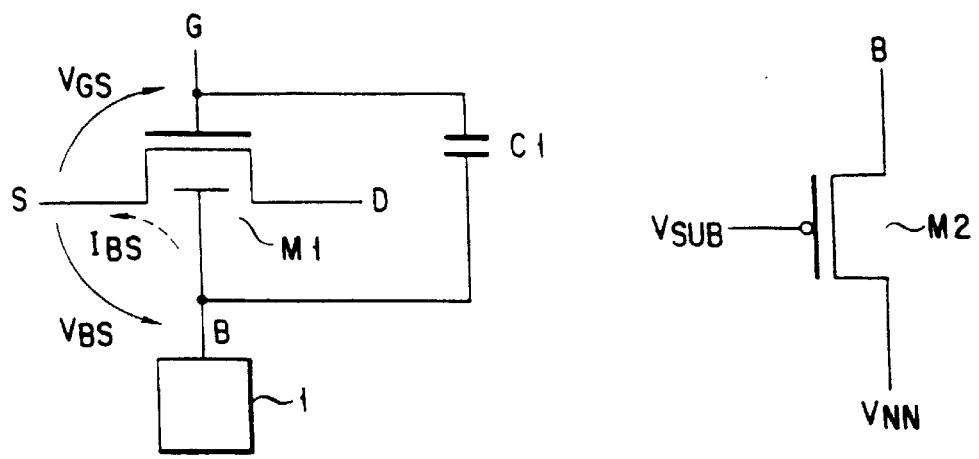
FIG. 88 is a diagram showing the nMOS transistor according to a twenty-fourth embodiment of the present invention.
FIG. 89 is a diagram showing an example of the limiter circuit for use in the nMOS transistor shown in FIG. 88.

FIG. 88 shows an nMOS transistor according to a twenty-fourth embodiment of the present invention. FIG. 88 shows a nMOS transistor M1 formed on a SOI substrate, a capacitor C1 connected between the gate and the body of M1 and a limiter circuit 1 for maintaining the potential of the body of M1 at a level lower than a predetermined voltage Vlim.

FIG. 89 shows an example in which a pMOS transistor is employed as the limiter device 1 shown in FIG. 88. A pMOS transistor M2 has a structure such that the body of M1 is employed as the source thereof, the SOI substrate of the same is employed as the gate thereof and the drain is applied with voltage $V_{NN}$. The gate of the pMOS transistor is applied with substrate potential $V_{SUB}$ ($\geq V_{NN}$). In the foregoing limiter circuit, the limit voltage Vlim is $V_{SUB}+V_{TL}$. Note that $V_{TL}$ is the absolute value of the threshold voltage of M2.

Figure 90A:
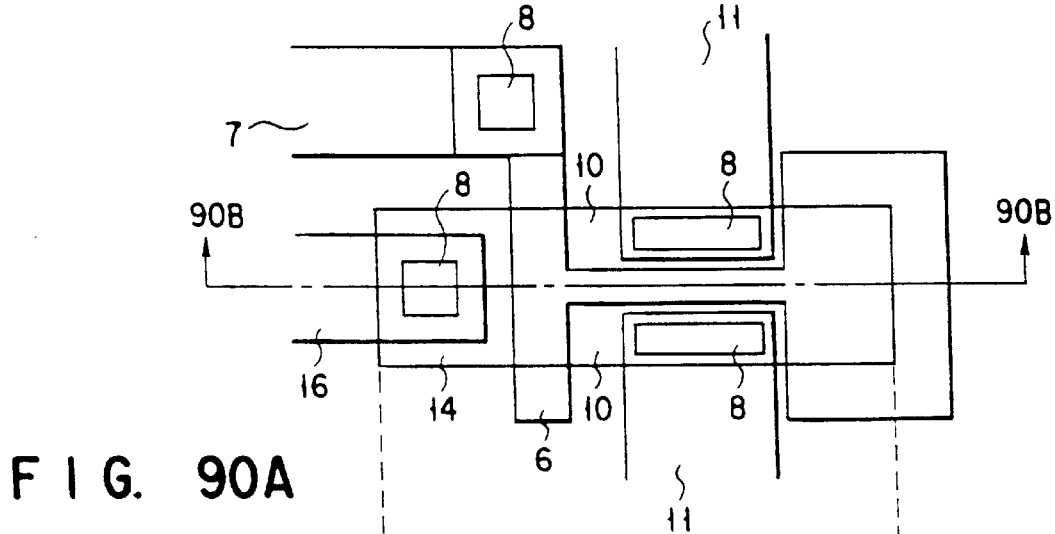
FIGS. 90A and 90B respectively are a plan view and a cross sectional view taken along line 90B—90B of the circuit shown in FIG. 88.
Figure 90B:
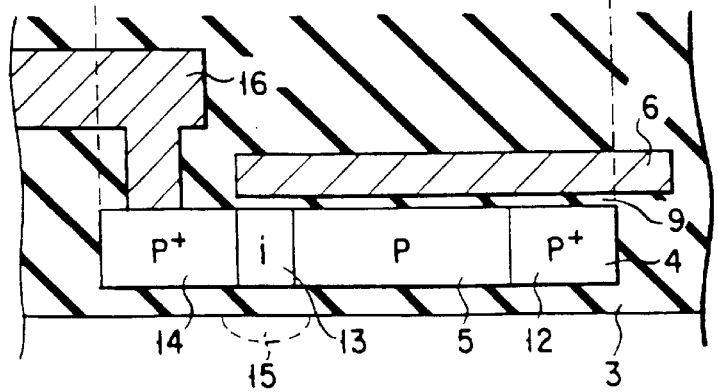

FIGS. 90A and 90B respectively are a plan view and a cross sectional view taken along line 90B—90B shown in FIG. 90A which shows the nMOS transistor M1 having a capacitor and a limiter circuit having structures as show in FIG. 88. Referring to FIGS. 90A and 90B, a p-type silicon substrate 2 has a element region 4 formed on an embedded insulating oxide film 3 thereof. In the element region 4, the nMOS transistor M1 is formed which has the body formed by a p-type region 5. A gate 6, a metal wiring 7 connected to the gate 6 through a contact 8 and a gate insulating oxide film 9 are formed in the upper portion of the element region 4. A source/drain region 10 is formed by an n-type diffusion layer. The metal wiring 11 is connected to the source/drain region through the contact 8.

In the element region 4, a p-type region and the gate 6 form a MOS capacitor C1. In order to make the threshold voltage of C1 to be higher than the threshold voltage of the MOS transistor M1, the impurity density in the p-type region 12 is set to be higher than the impurity density in the p-type region 5.

In the element region 4, a pMOS transistor M2 is formed in which an i-type region 13 is formed into the body, a p-type substrate 2 is formed into the gate, the p-type region 5 is formed into the source and the p-type region 14 is formed into the drain. The p-type region 15 is a region for controlling the threshold voltage of M2. Reference numeral 16 represents a metal wiring connected to the drain region 14 through the contact 8.

FIG. 91 shows results of plotting of the voltage $V_{BS}$ between the body and the source, the threshold voltage $V_{TN}$ and current $I_{BS}$ between the body and the source with respect voltage $V_{GS}$ between the gate and the source of the nMOS transistor M1. The potential of the source is set to be 0V, $V_{NN}$ is set to be 0V, $V_{SUB}$ is set to be 0V, body potential $V_{BS}$ when $V_{GS}$ is 0V is set to be 0V and the absolute value $V_{TL}$ of the threshold voltage of the pMOS transistor M2 is set to be 0.5V. An assumption is performed that the capacitance of the body can be ignored. A case will now be considered in which $V_{GS}$ is raised from 0V to 1V, and then the same is lowered from 1V to 0V.

When $V_{GS}$ is raised from 0V, the body of the nMOS transistor M1 is in a floating state because the pMOS transistor M2 has been cut off. Therefore, $V_{BS}$ is raised until M2 is made to be conductive. When $V_{BS}$ has been raised to 0.5V (=$V_{TL}$=Vlim), M2 is made to be conductive so that $V_{BS}$ is not raised. Therefore, even if $V_{GS}$ is raised to a level higher than $V_F$, current $I_{BS}$ does not flow into the pn junction between the body and the source. As the $V_{BS}$ is raised, $V_{TN}$ is lowered.

When $V_{GS}$ is lowered from 1V, $V_{BS}$ is lowered because the body of M1 in the floating state. Since $V_{BS}$ does not exceed $V_F$ at this time, $I_{BS}$ does not flow. As $V_{BS}$ is lowered, $V_{TN}$ is raised. Thus, the threshold voltage is raised when $V_{GS}$ is 0V. Thus, the leak current at the time of cutting off is further reduced.

Although the foregoing embodiments have been described about the nMOS transistor, a similar structure can be realized by using a pMOS transistor by changing the conduction type of impurities and the polarity of the voltage.

A transient operation of an inverter will now be described as an example of a circuit using a MOS transistor of a type having the foregoing structure.

FIG. 92 shows a CMOS inverter having a structure such that a nMOS transistor M3 is formed on the discharge side and a pMOS transistor M4 is formed on the charge side. The nMOS transistor M3 has a structure such that a capacitor C2 and a pMOS transistor M5 are formed in the same element region, the gate is connected to an input terminal (input voltage Vin), the source is grounded (ground potential Vss) and the drain is connected to the output terminal (output voltage $V_{OUT}$). The capacitor C2 is connected to the input terminal and the body (body voltage $V_{BN}$) of M3. The gate and the body of M5 is grounded and the source of the same is connected to the body of M3. M4 has a structure such that the capacitor C3 and a nMOS transistor M6 are formed on the same element region thereof, the gate is connected to the input terminal, the source is connected to the supply voltage Vcc and the drain is connected to the output terminal. C3 is connected to the input terminal and the body (body voltage $V_{BP}$) of M4. The gate and the drain of M6 are connected to the supply voltage and the source of the same is connected to the body of M4. FIGS. 93A to 93C show transient waveforms of output voltage $V_{OUT}$, the body voltage $V_{BN}$ and the threshold voltage $V_{TN}$ of M3, and the body voltage $V_{BP}$ and the threshold voltage $V_{TP}$ of M4. An assumption is performed that $V_{DD}$ is 1V, Vss is 0V and Vlim is 0.5V. An initial state is assumed such that $V_{IN}$ is 0V, $V_{BN}$ is Vlim and $V_{BP}$ is $V_{DD}$-Vlim.

Since $V_{BN}$ is 0.5V when t=0, the threshold voltage of M3 is smaller than value $V_{TN0}$ when $V_{BN}$ is 0V. Since $V_{IN}$ is 0V, M3 is non-conductive. Since $V_{BP}$ is 0.5V, the absolute value of the threshold voltage of M4 is smaller than absolute value $|V_{TP0}|$ when $V_{BP}$ is 1V so that M4 is made to be conductive. As a result, the output of the inverter is charged by M4 so that $V_{OUT}$ is made to be 1V. When $V_{IN}$ has been raised in a period of time from t=t1 to t=t2, the capacitance coupling of the capacitors C2 and C3 causes $V_{BN}$ and $V_{BP}$ to be intended to be raised. However, since M5 is conductive and M6 is non-conductive, $V_{BN}$ maintains Vlim and only $V_{BP}$ is raised to Vmax. Assuming that the capacitance of the body of M4 is CBP at this time, Vmax=C3/(C3+CBP)(V). Although $V_{TN}$ is not changed and maintains a low threshold value, the absolute value of $V_{TP}$ is enlarged. As a result, the output from the inverter is discharged by M3 so that $V_{OUT}$ is made to be 0V.

When $V_{IN}$ has been raised in a period of time from time t=t3 to t=t4, the capacitance coupling of the capacitors C2 and C3 lowers $V_{BN}$ and $V_{BP}$. At this time, both of M5 and M6 are non-conductive and, therefore, $V_{BN}$ is lowered to Vmin and $V_{BP}$ is lowered to Vlim. Assuming that the capacitance of the body of M3 is CBN, Vmin=C2/(C2+CBN)(V). Moreover, $V_{TN}$ is enlarged and the absolute value of $V_{TP}$ is reduced. As a result, the output from the inverter is charged by M4 so that $V_{OUT}$ is made to be 1V.

When $V_{IN}$ has been raised in a period of time from time t=t5 to t=t6, the capacitance coupling of the capacitors C2 and C3 raises $V_{BN}$ and $V_{BP}$. Since M5 and M6 are non-conductive at this time, $V_{BN}$ is raised to Vlim and $V_{BP}$ is raised to Vmax. Moreover, $V_{TN}$ is reduced and the absolute value of $V_{TP}$ is enlarged. As a result, the output from the inverter is discharged by M3 so that $V_{OUT}$ is made to be 0V.

An operation similar to the foregoing operation is repeated. As described above, the inverter according to this embodiment uses the characteristic of the conventional structure, in which the gate and the body are directly connected to each other to reduce the absolute value of the threshold voltage of a conductive MOS transistor and enlarge the absolute value of the threshold of a non-conductive MOS transistor. Moreover, if the supply voltage has been raised to a level higher than $V_F$, flowing of surplus currents can be prevented except the initial state. Therefore, a circuit can be provided which is able to operate normally even if the supply voltage is higher than $V_F$ and free from influences of change in the supply voltage and nose even if the supply voltage is lower than $V_F$.

Although the foregoing embodiment has the structure such that the gate and drain of M5 and the gate and drain of M6 are made to be the same potential, the present invention is not limited to this. The potential may be set to be another level in consideration of the relationship among the supply voltage, the gate voltage, the threshold voltages of M5 and M6 and Vlim. The present invention may be applied to a multi-input logic circuit as well as the inverter having one input. Moreover, the present invention may be applied to a signal-transmission type circuit, such as a transmission gate or a bus transistor logic circuit.

Moreover, a variety of logic circuits can be realized without departing from the spirit and the scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor substrate having a semiconductor region to which a first signal is supplied;
   a source and a drain formed in said semiconductor region;
   a gate insulating film formed on said semiconductor region between said source and said drain;
   a gate formed on said gate insulating film and connected to an output terminal; and
   a delay circuit receiving a second signal, which is a complementary signal of the first signal, and applying a delayed signal, which is later than the first signal, to said gate.

2. The semiconductor integrated circuit device according to claim 1, wherein a voltage potential of the first, second and delayed signals varying between a first power supply voltage and a second power supply voltage is supplied to said gate.

3. The semiconductor integrated circuit device according to claim 1, wherein said delay circuit includes a MOS transistor having a gate, to which the second signal is applied, and a substrate region connected to said gate of said MOS transistor.

4. A semiconductor integrated circuit device comprising:
   a semiconductor substrate having a semiconductor region to which a first signal is supplied;
   a source and a drain formed in said semiconductor region;
   a gate insulating film formed on said semiconductor region between said source and said drain:
   a gate formed on said gate insulating film; and
   a delay circuit connected to said gate for applying a delayed signal of the first signal to said gate, wherein
      said delay circuit comprises an even number of inverters including nMOS and pMOS transistors which are connected in series and
      said delay signal is a non-inverted signal of said first signal.

5. A semiconductor integrated circuit device comprising:
   a semiconductor substrate having a semiconductor region to which a first signal is supplied;
   a source and a drain formed in said semiconductor region;
   a gate insulating film formed on said semiconductor region between said source and said drain;
   a gate formed on said gate insulating film; and
   a delay circuit connected to said gate for applying a delayed signal of the first signal to said gate, wherein
      a voltage potential of said first and delayed signals varying between a first power supply voltage and a second power supply voltage is supplied to said gate.

* * * * *